United States Patent [19]

Nasu et al.

[11] Patent Number: 5,407,845
[45] Date of Patent: Apr. 18, 1995

[54] METHOD OF MANUFACTURING THIN FILM TRANSISTORS IN A LIQUID CRYSTAL DISPLAY APPARATUS

[75] Inventors: Yasuhiro Nasu; Teruhiko Ichimura; Tomotaka Matsumoto, all of Kawasaki, Japan

[73] Assignee: Fujitsu Limited, Kawasaki, Japan

[21] Appl. No.: 135,030

[22] Filed: Oct. 13, 1993

[30] Foreign Application Priority Data

Oct. 15, 1992 [JP] Japan .................. 4-276884
Feb. 26, 1993 [JP] Japan .................. 5-38795
Jul. 8, 1993 [JP] Japan .................. 5-169288

[51] Int. Cl.⁶ .......................... H01L 21/265
[52] U.S. Cl. .................. 437/40; 437/21; 437/913; 148/DIG. 150
[58] Field of Search ............ 437/40, 913, 21, 41, 437/84, 51; 148/DIG. 150, 106

[56] References Cited

U.S. PATENT DOCUMENTS 4,393,572 7/1983 Policastro et al. .
5,053,345 10/1991 Schnable et al. .............. 437/21
5,346,839 9/1994 Sundaresan .................. 437/21

FOREIGN PATENT DOCUMENTS 1-103832 4/1989 Japan .
1-293567 11/1989 Japan .
4-116846 4/1992 Japan ...................... 437/35
5-082549 4/1993 Japan ...................... 437/41

OTHER PUBLICATIONS

F. Funada et al., SID 1986 Digest pp. 293–295, "An Amorphous Si TFT Addressed 3.2 in Full-Color LCD".

*Primary Examiner*—Brian E. Hearn
*Assistant Examiner*—Michael Trinh
*Attorney, Agent, or Firm*—Armstrong, Westerman, Hattori, McLeland & Naughton

[57] ABSTRACT

A first sheet of photomask is used when a gate electrode and a gate bus line are formed, a second sheet of photomask is used when patterning is applied to a semiconductor film which becomes an active layer of a transistor on the gate electrode, a third sheet of photomask is used when a pixel electrode, a source electrode, a drain electrode, a drain bus line and a drain bus terminal portion are formed, and a fourth sheet of photomask is used when a film on the drain bus terminal portion, the gate bus terminal portion and pixel portion is removed, thereby to form thin film transistors arranged in a matrix form.

12 Claims, 55 Drawing Sheets

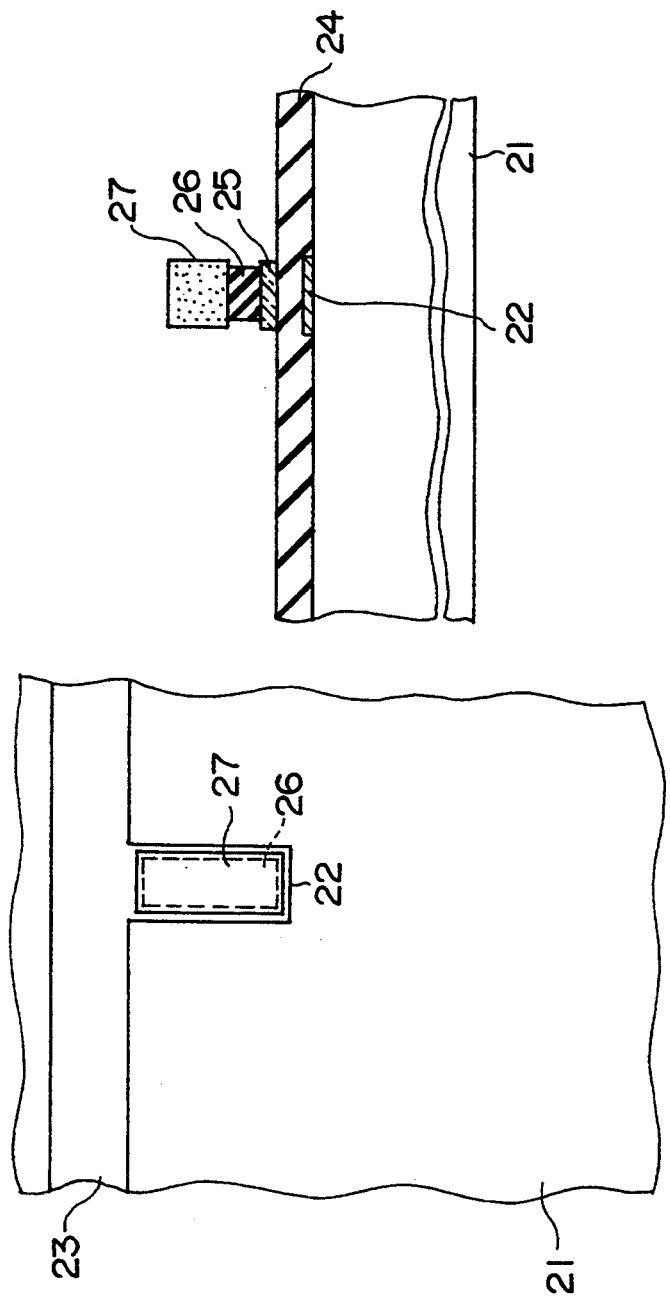

GAS PRESSURE (Torr)

PH3+Ar=200sccm
RF POWER=400W
Ts=200°C
ANNEAL TEMPERATURE:250°C

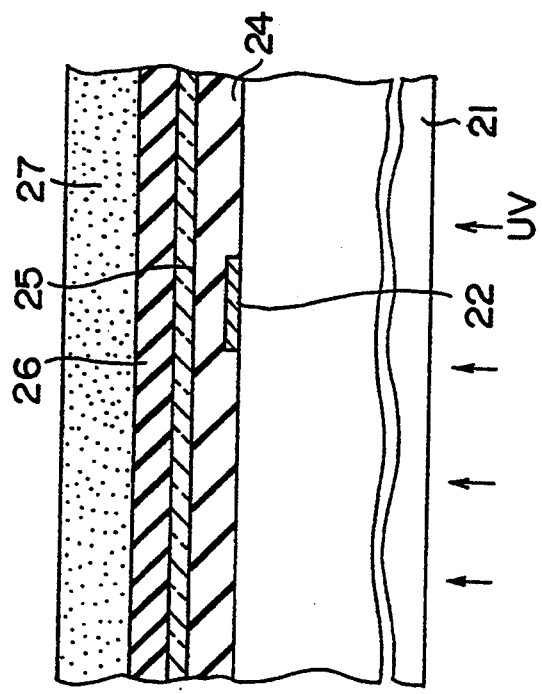
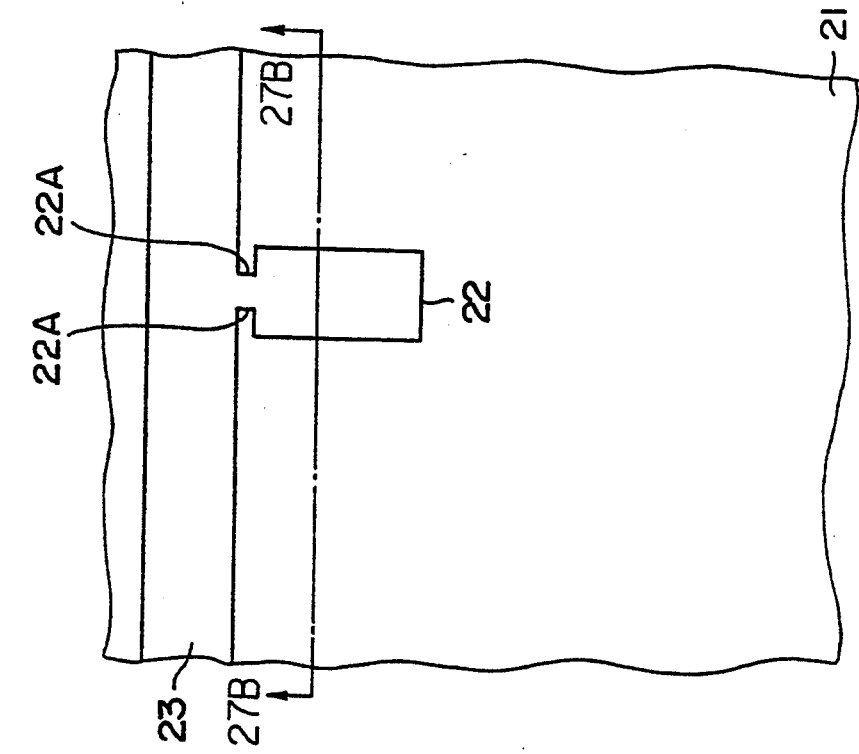
FIG. 27A
FIG. 27B

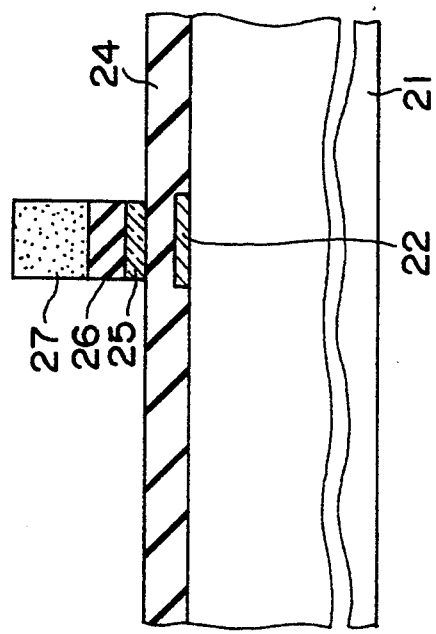
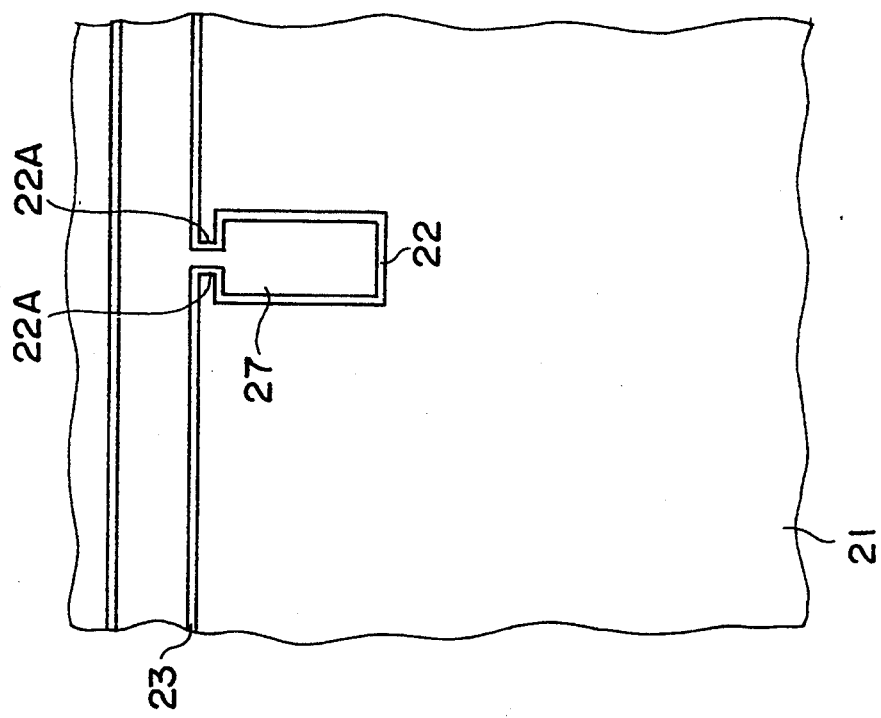
FIG. 28A
FIG. 28B

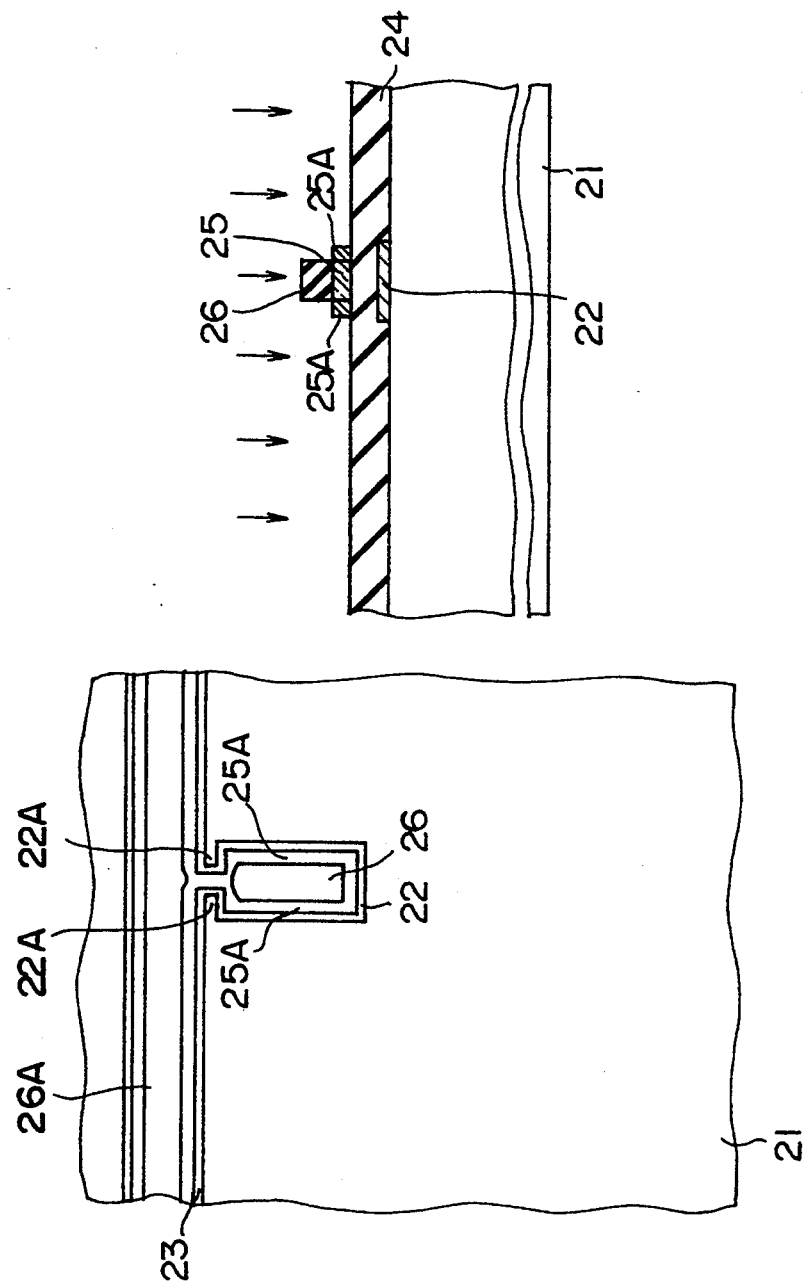

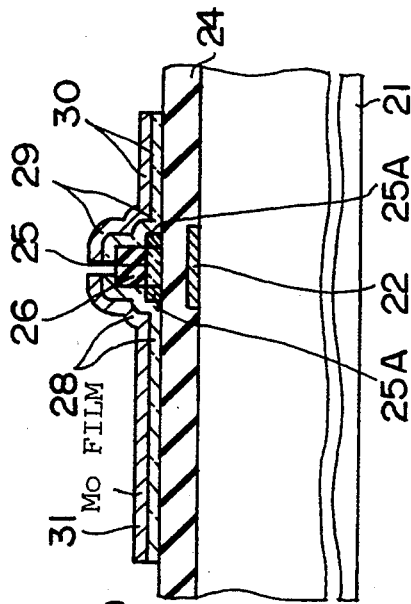
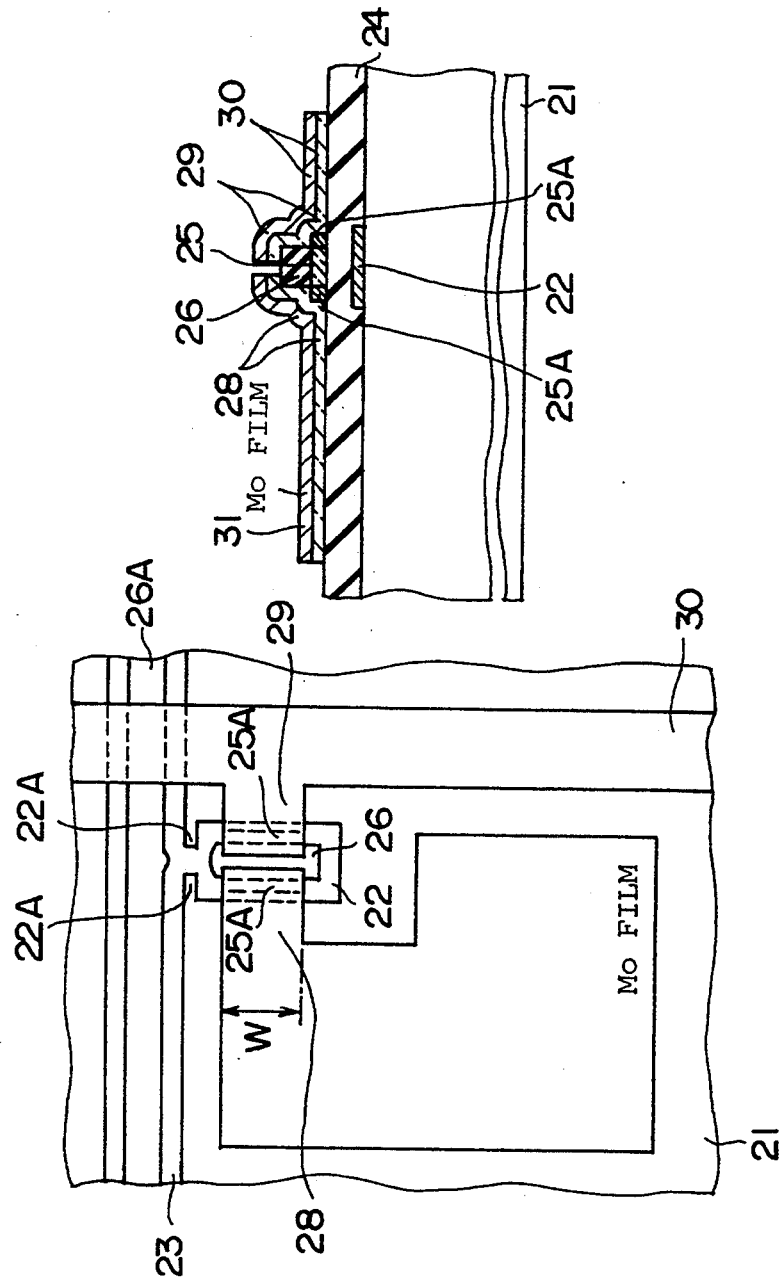
FIG. 31B
FIG. 31A

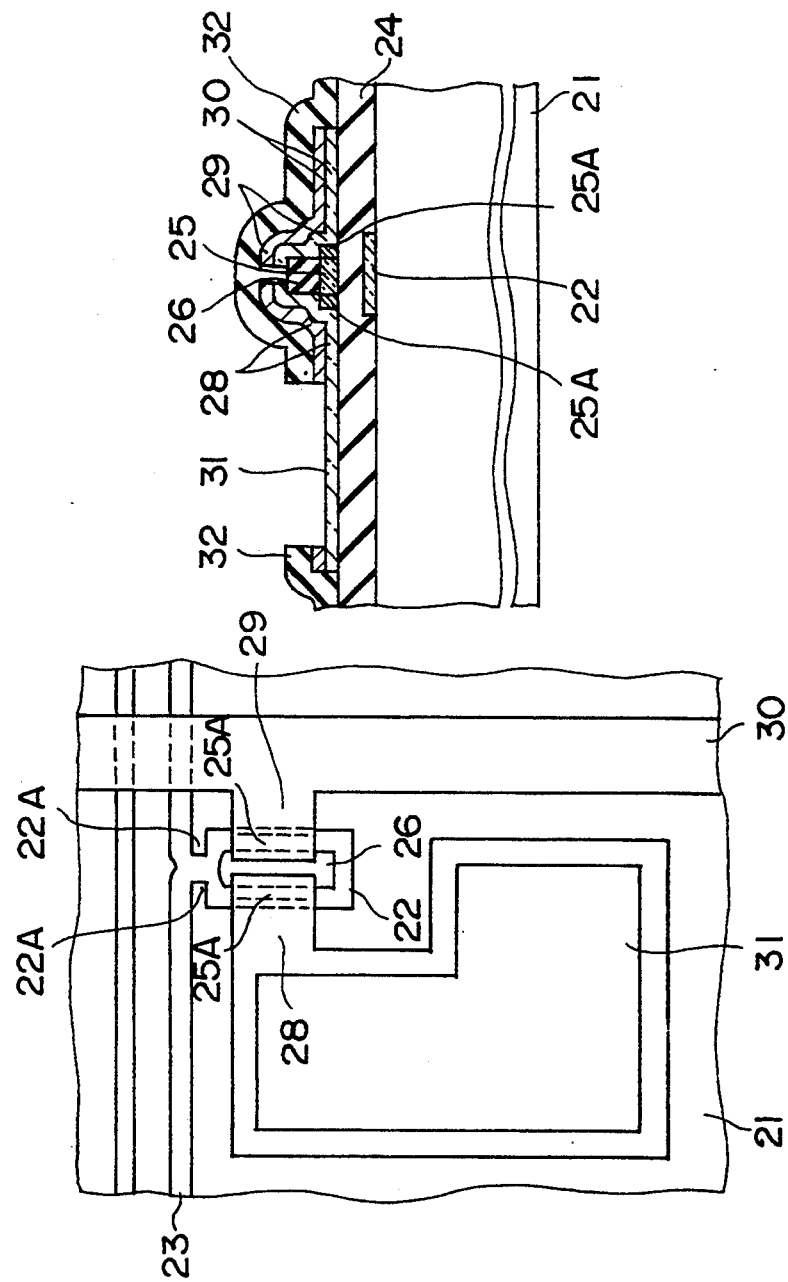

METHOD OF MANUFACTURING THIN FILM TRANSISTORS IN A LIQUID CRYSTAL DISPLAY APPARATUS

BACKGROUND OF THE INVENTION

1. Field of the Invention

The present invention relates to a method of manufacturing thin film transistors in a liquid crystal display apparatus, and more particularly to a method of manufacturing thin film transistors arranged in a matrix form for driving a liquid crystal display panel used for image display such as a lap-top personal computer and a wall mounting television.

2. Description of the Related Art

It is being recognized that a display quality of a liquid crystal display panel in which thin film transistors (TFTs) are arranged in a matrix form has been improved to an extent matching that of a cathode-ray tube (CRT). However, the fact is that the yield in a manufacturing process is low due to disconnection and short-circuit of interconnection or lack of uniformity in transistor characteristic of TFTS, etc., and this problem has to be eliminated.

In general, when a plurality of TFTs connected in a matrix form are formed on a substrate, a patterning process using 7 to 8 sheets of masks is required in a process which may be materialized as industrial production.

At present, the process for forming TFTs for liquid crystal drive using a-Si in a matrix form is roughly divided into an amorphous silicon etching stopper type using a channel protective film and an channel etching type using no channel protective film. As a citation related to a structure of an etching stopper type TFT, F. Funada et al., SID 1986 DIGEST pp. 293–295 for instance is available, and as a Patent Publication related to a channel etching type TFT, Japanese Unexamined Publication No. 293567/1989 for instance is available.

FIGS. 1A,1B to FIGS. 5A,5B are explanatory views of a principal part of an etching stopper type TFT in a matrix form at an important position of a process for explaining prior art. In these figures, FIG. 1A to FIG. 5A on the left sides show plan views of a principal part, and FIG. 1B to FIG. 5B on the right sides show sectional views taken along the line X—X, respectively. Here, in the plan views of a principal part, a part of formed layers is omitted in illustrations for the sake of simplicity.

The manufacturing process will be described hereinafter with reference to these figures, but the object here is TFTs arranged in a matrix form (hereinafter referred to as a TFT matrix) with reverse stagger type insulated gate TFTs using a-Si as a semiconductor active layer as switching elements.

First, the process until states shown in FIG. 1A and FIG. 1B are produced.

In the first place, a Ti film is formed on a substrate 1 composed of a transparent insulator such as glass. Then, a photoresist process and an reactive ion etching (RIE) in lithography technique are applied, and patterning is applied to the Ti film so as to form a gate electrode 2 and a gate bus line (a scanning bus line) 3 as shown in FIG. 1A.

Furthermore, as shown in FIG. 1B, a gate insulator film 4 composed of silicon nitride (SIN), an active layer 5 composed of a-Si and a channel protective film 6 composed of silicon nitride (SIN) are formed.

Next, patterning is applied to the channel protective film 6 by applying a photoresist process and a wet etching method as lithography techniques, thereby to leave the channel protective film 6 having a width narrower than that of the gate electrode 2 on the gate electrode 2 only as shown in FIG. 2A and FIG. 2B.

Thereafter, an electrode contact layer 7 composed of $n^+$-a-Si is formed on the whole surface. Then, patterning is applied to the electrode contact layer 7 and the active layer 5 by applying a photoresist process and an RIE. With this, the electrode contact layer 7 and the active layer 5 are formed into an island shape as shown in FIG. 3A and FIG. 3B.

Thereafter, a Ti film is formed on the whole surface. Then, a photoresist mask and a plasma etching method are applied as lithography techniques thereby to apply patterning to the Ti film, and a source electrode 8, a drain electrode 9 and a drain bus line (a data bus line) 10 are formed as shown in FIG. 4A and FIG. 4B. Next, patterning is applied to the electrode contact layer 7 by using the photoresist mask, and a gas containing $CF_4$ and $O_2$.

Next, a photoresist process and a plasma etching method is applied as lithography techniques, and the gate insulator film 4 covering a gate bus terminal portion 3A shown in FIG. 6 located at the end of the gate bus line 3 is etched selectively thereby to form an opening.

Thereafter, an indium tin oxide (ITO) film is formed on the whole surface. Furthermore, patterning is applied to the ITO film by applying a photoresist process and a wet etching method as lithography techniques, thereby to form a pixel electrode 11 shown in FIG. 5A and FIG. 5B and a gate bus terminal 12 shown in FIG. 6. And, the ITO film is remained on drain bus terminals(not shown).

Thereafter, it is required to form a final protective film not shown and to apply patterning thereto by lithography techniques to remove the final protective film on the bus terminals and the pixel electrode 11.

The masks of photoresist up to this point is 7 in number.

When it is demanded to reduce the resistance of the bus line in the process described above, patterning is applied only to the bus line separately as described later, and the patterning process is thereby increased further.

Here, it will be described how to make the bus line low in resistance.

In general, the resistance value required for the bus line is 20 KΩ or lower for the gate bus line and 35 KΩ or lower for the drain bus line in a VGA mode color panel (gate: 480 lines, drain: 640×3 lines) of approximately 26 cm (10.4 inch) for instance.

Such requirement is loose for a small-sized device such as for a pocket type television and a projection type television, and it is strict for a large-sized device such as for a work station and HDTV.

In the case of a down gate stagger type TFT structure aimed at by the present invention, requirement for low resistance is more strict in the gate bus line. However, such problems are caused that ① the gate bus line can not be made thicker because it forms a lower layer of the gate insulator film, ② when aluminum which is a material of a low resistance is used in the upper side of the gate bus line, hillock, whisker or the like is generated on the gate bus line by forming an insulator film by a high temperature process thereafter, ③ when the gate electrode material is made thicker, it becomes necessary to use a special technique such as taper etching and so on.

As a means for evading such problems, after a gate bus line is formed with aluminum as the lowest layer, a gate bus line and a gate electrode composed of refractory metal such as Ti and Cr is formed so as to completely cover the gate bus line composed of aluminum in some cases. This corresponds to patterning only bus line described previously.

In the case of the down gate stagger type TFT, the drain bus line is formed on the gate insulator film and the required resistance value of the drain bus line is not so strict as that of the gate bus line. Then, the drain bus line is made of a thicker single film. However a multilayer is formed sometimes due to the requirement in the process or in order to obtain a redundant structure for disconnection. In this case, special patterning is required naturally.

In the prior art described with reference to FIG. 1A, FIG. 1B to FIG. 5A, FIG. 5B and FIG. 6, a patterning process using 7 or 8 photomasks becomes necessary, which exerts a big influence upon production yield. Hence, it is preferred that the process is less in the number of photomasks even by one.

Thus, such plans have been elaborated that ① no channel protective film is used, ② formation of an a-Si layer into an island shape and patterning of a source electrode, a drain electrode and a drain bus line are performed at the same time, ③ patterning is omitted by means of mask depositioning for exposing a gate terminal portion and forming the final protective film.

In any of the items ① to ③ described above, some problems happen as described hereunder.

In the case of ①, the TFT has a channel etching type. According to this TFT, there are such advantages that plasma chemical vapor deposition processes are reduced due to a fact that non-doped a-Si which is a channel layer and n+-a-Si which is a contact portion are formed successively, and that the patterning processes are reduced by one process since it is not required to form the channel protective film in an island shape.

However, it becomes necessary to remove n+-a-Si only selectively among the multi-layer of a-Si and n+-a-Si. Since both cannot be etched selectively, a-Si has to be formed thick in advance, and when a-Si is thick, such a problem that a cleaning cycle of a film forming apparatus becomes short thus lowering an operation rate or an off-current of the TFT is increased by photoelectrical effect is caused.

Further, as to the item ②, after patterning the deposition film of a-Si, n+-a-Si and metal for the drain bus line it is required to cover the source electrodes by an ITO film which forms pixel electrodes so as to connect these electrodes electrically. However, unless the deposition film such as a-Si is patterned in a forward taper shape, the possibility of disconnection of the ITO film becomes very high by the edge of the deposition film. In particular, there is a problem that, when the film thickness is increased in order to make the drain bus line low in resistance, disconnection due to step difference is produced more easily.

Furthermore, as to the item ③, since the final protective film is formed for the purpose of damp proofing of the TFT, it is not necessarily required to form an opening in every pixel. It is at a terminal portion that removal is indispensable, but, since the pattern at that portion is comparatively coarse, a means of forming no film at the terminal portion only by inserting a metal mask on a substrate (mask deposition) can be adopted when the final protective film is formed.

However, as a matter of course, the film forming process becomes complicated, and the final protective film passes in between the terminal portion and the metal mask, thus producing a problem of poor contact of the terminal.

SUMMARY OF THE INVENTION

It is an object of the present invention to provide a method of manufacturing thin film transistors in a matrix form for improving the yield by reducing the number of photomasks used in a lithography process.

According to the present invention, there are included a process of patterning of a gate electrode and a gate bus line, a process of patterning of an active layer of a transistor on the gate electrode, a process of patterning of at least a pixel electrode, a source electrode, a drain electrode and a drain bus line, and a process of patterning for removing a film on the pixel electrode, a drain bus line terminal portion and a gate bus terminal portion. Therefore, 4 sheets in total will suffice as the number of photomasks used in these four patterning processes.

Further, according to another aspect of the present invention, the photoresist is exposed with the gate electrode and the gate bus line as a mask by applying light to the underside of the transparent insulator substrate. Thus, the photomask in patterning of an active layer is omitted, and the pattern precision is improved.

By adopting a manufacturing method described above, the number of sheets of photomasks used in a lithography in the process of manufacturing thin film transistors is reduced.

Accordingly, the production yield of thin film transistors arranged in a matrix form, in its turn, the production yield of the liquid crystal display panel is improved, which contributes greatly to cost reduction.

BRIEF DESCRIPTION OF THE DRAWINGS

FIG. 8A, FIG. 9A, FIG. 10A, FIG. 11A, FIG. 12A and FIG. 13A are plan views showing a process of forming a principal part of a TFT matrix according to a first embodiment of the present invention, and FIG. 8B, FIG. 9B, FIG. 10B, FIG. 11B, FIG. 12B and FIG. 13B are sectional views showing a process of forming the principal part thereof;

FIG. 27A, FIG. 28A, FIG. 29A, FIG. 30A, FIG. 31A, FIG. 32A and FIG. 33A are plan views showing a process of forming a principal part of a TFT matrix in a sixth embodiment, and FIG. 27B, FIG. 28B, FIG. 29B, FIG. 30B, FIG. 31B and FIG. 32B and FIG. 33B are sectional views showing a forming process of the same;

DETAILED DESCRIPTION OF THE EMBODIMENTS

Prior to description of the embodiments of the present invention, an equivalent circuit diagram of TFTs arranged in a matrix form in a liquid crystal display panel will be described with reference to FIG. 7.

TFTs arranged in a matrix form (hereinafter referred to as a TFT matrix) has gate bus lines GB formed in a plurality of lines in parallel on a substrate and drain bus lines DB formed in a plurality of lines in parallel to a direction perpendicular to these gate bus lines GB, and a thin film transistor t and a transparent pixel electrode PX are arranged in the vicinity of each intersecting area of the gate bus line GB and the drain bus line DB. A gate electrode of the thin film transistor t is connected to the gate bus line GB, a drain thereof is connected to the drain bus line DB, and furthermore, the source thereof is connected to the pixel electrode PX.

Besides, the gate bus line GB and the drain bus line DB are made to intersect each other through an insulating film so that they do not come in contact with each other.

Now, a part of a TFT matrix circuit will be described as an embodiment of the present invention.

First Embodiment

FIG. 8A, FIG. 8B to FIG. 13A, FIG. 13B and FIG. 15 are explanatory views of a principal part of a TFT matrix at an important point in the process for explaining a first embodiment of the present invention. Among these figures, FIG. 8A to FIG. 13A are plan views, and FIG. 8B to FIG. 13B are sectional views taken along a line X—X. In these plan views, partial layers are omitted for simplifying the description. Detailed description will be made with reference to these drawings.

Figure 8B:
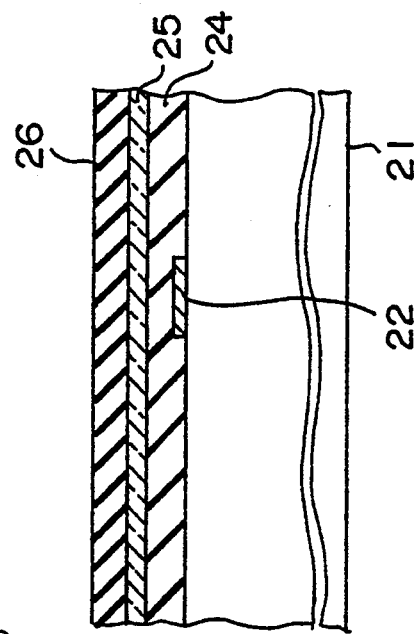
Figure 8A:
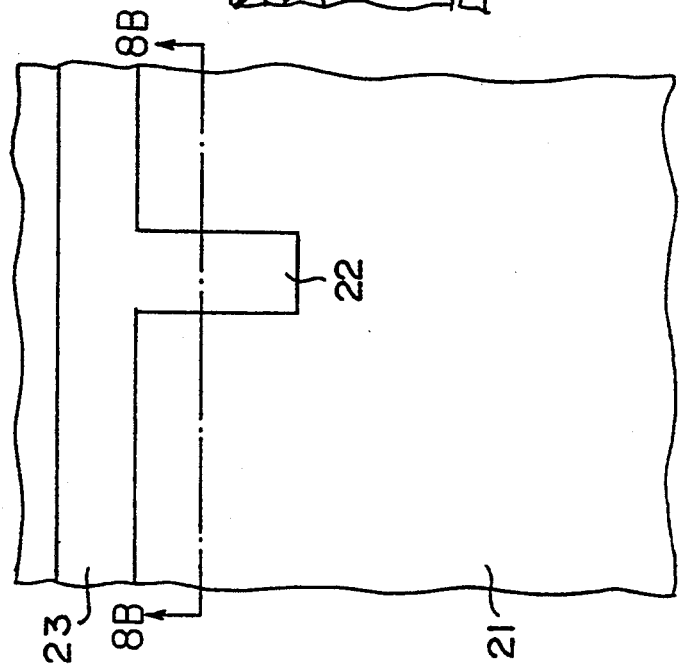

The process up to the point shown in FIG. 8A and FIG. 8B is described hereunder.

First, a Ti film having a thickness of 80 nm for instance is formed on a substrate 21 composed of a transparent insulator such as glass by applying a sputtering method.

By applying a photoresist process as lithography techniques and an RIE in which $BCl_3$ and $Cl_2$ are used as etching gas, patterning is applied to the Ti film formed in a preprocess so as to form a gate electrode 22 and a gate bus line 23.

Next, by applying a plasma chemical vapor deposition (P-CVD) method using $SiH_4$, $NH_3$ and $N_2$ as base gases, a gate insulator film 24 composed of SiN in a thickness of 400 nm for instance, and using a gas including $SiH_4$ and $H_2$ an active layer 25 composed of a-Si having a thickness of 15 nm to 50 nm for instance, and using a gas including $SiH_4$, $NH_3$ and $N_2$ a channel protective film 26 composed of SiN having a thickness of 120 nm for instance are formed one after another.

Figures 9A, 9B:
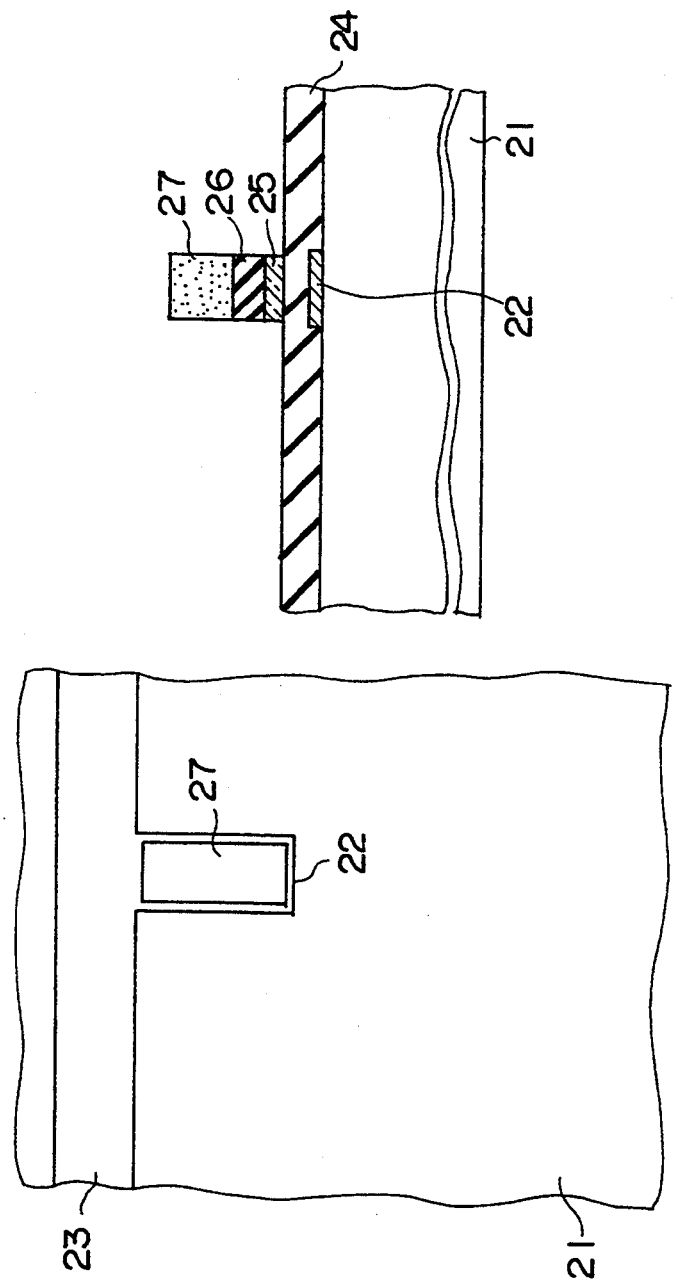

Next, the process up to the point shown in FIG. 9A and FIG. 9B will be described.

First, by applying a photoresist process in lithography techniques, a photoresist film 27 having a pattern for leaving the channel protective film 26 having a narrower width than the gate electrode 22 on the gate electrode 22 only.

Then, by applying an RIE using mixed gas of BCl$_3$ and Cl$_2$ or mixed gas of CF$_4$ and O$_2$ as etching gas, the channel protective film 26 and the active layer 25 are etched in an anisotropic manner so as to apply patterning into a shape narrower than the gate electrode 22. Besides, it is desirable to control the patterning in this case so that side etching advances from the edge of a photoresist film 27 inwardly as least as possible. Thus, etching is performed in a perpendicular direction so as to transfer the pattern of the photoresist film 27 accurately.

Next, the process up to the point shown in FIG. 10A and FIG. 10B will be described.

First, by applying a wet etching method using hydrofluoric acid etchant as the etchant, only the channel protective film 26 is etched in an isotropic manner in a state that the photoresist film 27 is left.

Since the photoresist film 27 is in existence, side etching is applied to the channel protective film 26 in the isotropic etching, and the quantity of side etching is 1 µm to 2 µm for instance.

In the isotropic etching, a gate insulator film 24 composed of SiN in which the etchant is the same as the channel protective film 26 is exposed. However, it causes no problem because the etching rate for the hydrofluoric acid etchant can be varied greatly by selecting the conditions when the SiN film is formed by the P-CVD method appropriately.

To be concrete, it is possible to increase the etching rate of the channel protective film 26 greatly by adopting such means that the temperature of the substrate 21 is maintained low, the flow ratio of H$_2$ gas among dilution gases (such as H$_2$ and N$_2$) of source gas is lowered, or the flow ratio of SiH$_4$ among source gases is lowered.

Besides, the main process, i.e., side etching of the channel protective film 26 is performed after patterning the channel protective film 26 and the active layer 25 in a mesa form, but it may also be performed in such a manner that, without applying patterning to the active layer 25, isotropic etching is applied to the channel protective film 26 only from the beginning, the patterning and the side etching are performed successively, and anisotropic etching of the active layer 25 with the photoresist film 27 as the mask is applied thereafter. In any event, it is vital that the etching rate of the channel protective film 26 is made higher as compared with that of the gate insulator film 24 in advance by adopting the means described above in order to ensure the side etching of the channel protective film 26.

Next, the process up to the point shown in FIG. 11A and FIG. 11B will be described.

First, after soaking the photoresist film 27 in a photoresist peeling liquid so as to remove it, the channel protective film 26 and the active layer are exposed in a discharge space of gas containing phosphine (PH$_3$), thereby to dope phosphorus at the edge portion of the active layer 25 exposed in the periphery of the channel protective film 26 so as to form an electrode contact area 25A composed of n$^+$-a-Si.

The method of doping phosphorus is a very simple means since it is possible to execute the method by utilizing a P-CVD apparatus which is widely used in manufacturing a TFT matrix. As other means than the above, any technique capable of introducing impurities into an exposed portion of the active layer 25 selectively and also to activating that portion may be adopted.

Presumably, three methods of gaseous doping of phosphorus are illustrated as follows.

① A method of placing a substrate in a normal parallel-plane type P-CVD apparatus and exposing the substrate in a discharge space of gas containing PH$_3$ (for example, diluted gas of PH$_3$ and H$_2$, Ar, H$_2$ or the like) (which is a method adopted in the present embodiment). This method will be described in detail as a second embodiment.

② A normal phosphorus ion implantation method in which phosphorus ions only are separated and extracted by mass spectrometry.

③ A method of extracting ions without separation by mass spectrometry from a plasma source such as mixed gas of PH$_3$ and H$_2$, and of implanting ions by electric field acceleration into a substrate placed at a location apart from the plasma space (ion shower). In this case, miscellaneous ions are implanted other than phosphorus ions. (See Japanese Patent Provisional Publication No. 1-103832 for an example.)

There is a method of forming an n$^+$ silicon layer on the active layer 25 revealed from the channel protective film 26 so as to form a contact area other than the above. According to this method, however, it is required to remove the n$^+$ silicon layer in an area which becomes a pixel portion by applying patterning, thus increasing the masking processes. Therefore, this method is not appropriate.

Besides, when introduction of impurities into an electrode contact area 25A is performed by an ion shower, a natural oxide film on the electrode contact area 25A surface composed of n$^+$-a-Si may be removed by performing slight etching with a thin hydrofluoric acid etchant or performing H$_2$ plasma processing before shifting to a next process.

Figure 12A:
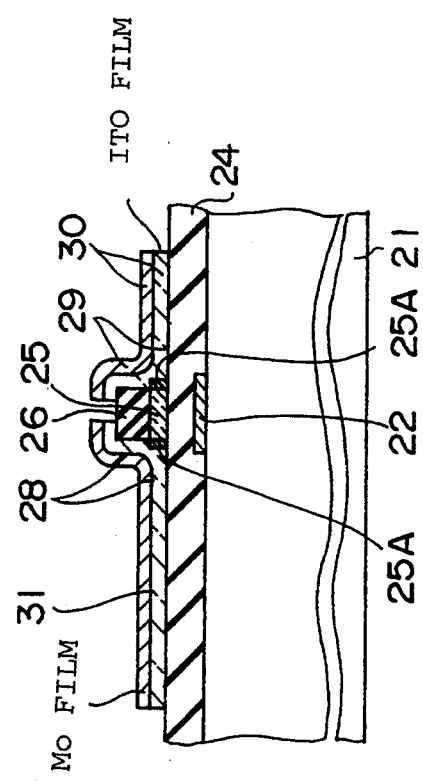
Figure 12B:
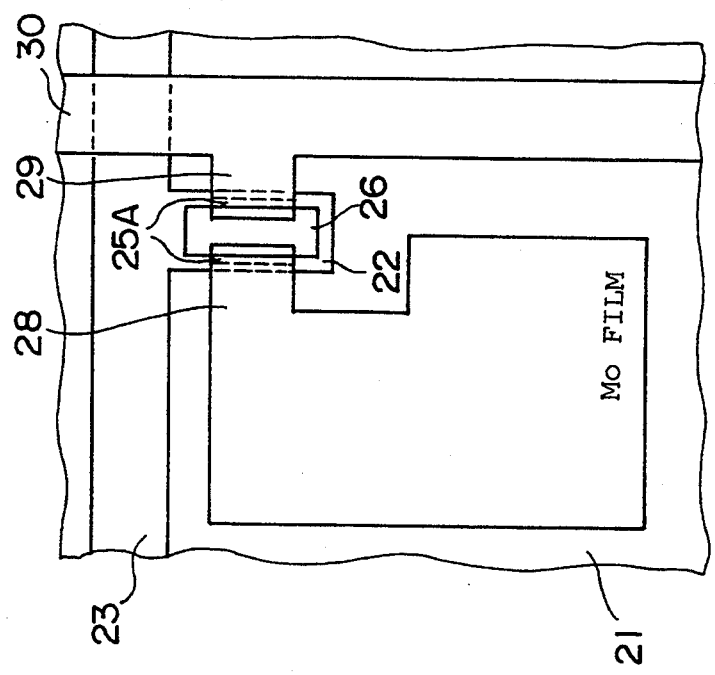
Figure 13B:
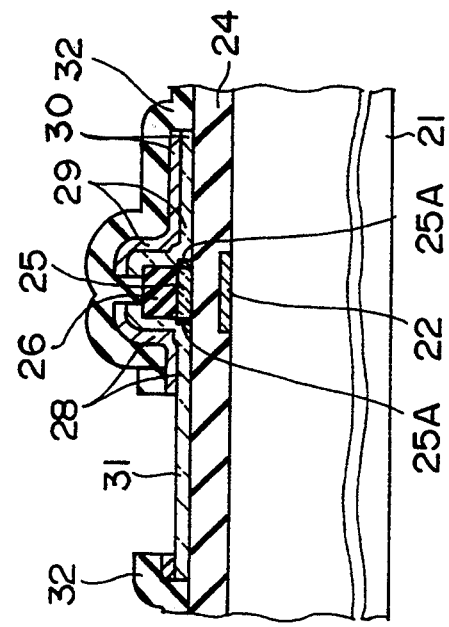
Figure 13A:
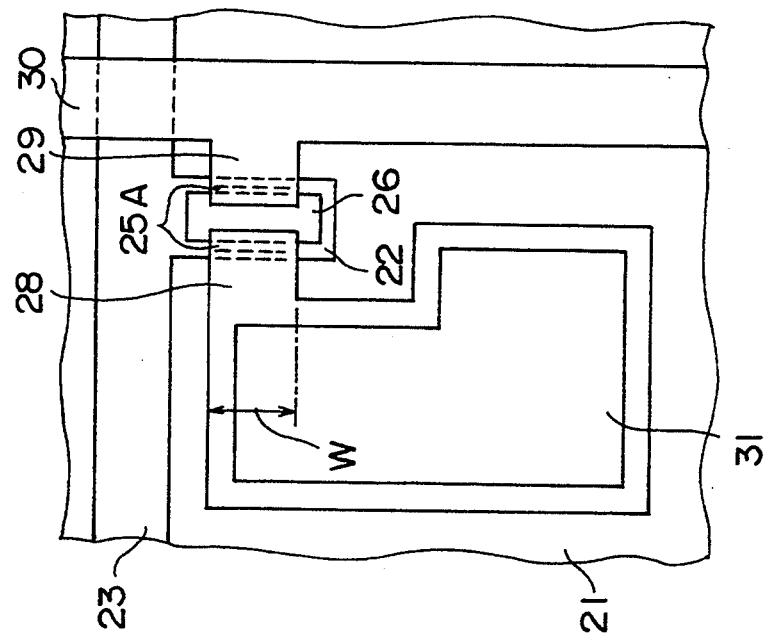

Next, a process up to a point shown in FIG. 12A and FIG. 12B will be described.

First, an ITO film having a thickness of 80 nm for instance and a Mo film having a thickness of 200 nm are formed successively by applying a sputtering method. Besides, the Mo film may be substituted for other metallic film such as a Cr film.

Thereafter, patterning is applied to the Mo film by applying a plasma etching method using gas selected from mixed gas of BCl$_3$ and Cl$_2$, SF$_6$ gas or mixed gas of CF$_4$ and O$_2$ as the etching gas after forming a photoresist film (not shown) of a pattern covering respective forming areas of the pixel electrode, the source electrode, the drain electrode and the drain bus line by applying a photoresist process of lithography techniques.

Besides, in case it is apprehensive of being damaged by static electricity, patterning may be applied to the Mo film by applying a wet etching method using a phosphoric acid etchant.

Next, patterning is applied to the ITO film by using the photoresist film as it is as a mask and applying a wet etching method using a mixed liquid of HCl and HNO$_3$ or a mixed liquid of HCl and FeCl$_2$.

Then, the unused portion of the electrode contact area 25A protruding from the mask is removed by etching by applying an RIE using mixed gas of BCl$_3$ and Cl$_2$ as the etching gas with the photoresist film and the channel protective film 26 as a mask. With this, conduction through the electrode contact area 25A between the source region and the drain region is discontinued.

Thereafter, the photoresist film as the mask is removed.

Through the processes described above, a pixel 31 composed of a source electrode 28 formed of a two-layer film composed of an ITO film and a Mo film, a drain electrode 29 formed of the two-layer film, a drain bus line 30 formed of the two-layer film.

Next, the process up to a state shown in FIG. 13A, FIG. 13B, FIG. 14 and FIG. 15 will be described.

First, a final protective film 32 composed of SiN having a thickness of 300 nm for instance is formed on the whole surface by applying a P-CVD method. Then, patterning is applied to the final protective film 32 by applying a photoresist process in lithography techniques and further applying a wet etching method using a hydrofluoric acid etchant or a RIE using a gas such as $BCl_3+Cl_2$, $CF_4+O_2$.

Figure 14:
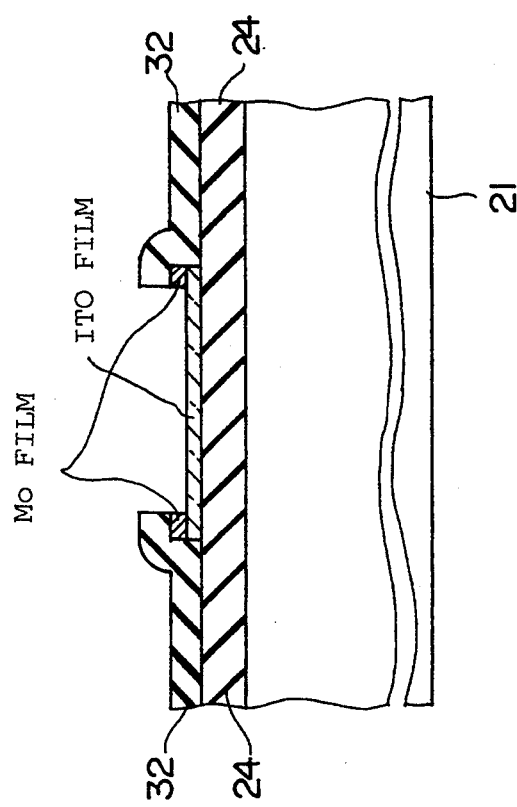
FIG. 14 is a sectional view showing a drain bus terminal portion of a TFT matrix in the first embodiment of the present invention.

With this, the final protective film 32 appears to show a predetermined shape, the Mo film is exposed on the pixel electrode 31, and the Mo film forming a part of the drain bus line 30 is revealed in the drain bus terminal portion shown in FIG. 14, respectively.

Besides, a gate insulator film 24 has to be etched at the gate bus terminal portion other than the final protective film 32, but the gate insulator film 24 is formed so that the etching rate becomes lower against a hydrofluoric acid etchant as described in the abovementioned process. Therefore, the gate insulator film 24 cannot be etched simultaneously with the final protective film 32.

Therefore, the Mo film on the pixel electrode 31, the Mo film at the drain bus terminal portion and the gate electrode 22 are removed by applying a plasma etching method using a chemical dry etching (CDE) apparatus using mixed gas containing $CF_4$ and $O_2$ as etching gas. With this, a Ti film forming gate bus line 23 is revealed at the gate bus terminal portion shown in FIG. 15.

Presumably, in the CDE method using mixed gas containing $CF_4$ and $O_2$, it is possible to make the etching rate of Mo and SiN higher, and to lower the etching rate against the gate electrode 22 composed of Ti which is the foundation thereof. Further, Mo has a resistance against the hydrofluoric acid etchant containing no $HNO_3$.

From the description of the process, it will be understood that the process from patterning of the final protective film 32 to the completion thereof has been performed with the photoresist film formed by the photoresist process in the above-mentioned processes as a mask.

Since the whole process is completed by using four sheets of photomasks in the first embodiment described with reference to respective drawings, the number of photomasks is reduced even by 3 or 4 sheets as compared with the prior art.

Further, when those conditions ① a case of the design which makes it possible to drive a TFT matrix with a drain bus line formed of an ITO film only, ② a case of application to, for example, a reflection type panel capable of displaying with opaque display pixels, ③ a case in which mask film formation is jointly performed so that an insulating film is not formed on an electrode at a terminal portion and so on are combined with one another, the required photoresist masks is reduced further by one sheet, thus making it possible to complete a TFT mask with three sheets. For example, when the condition ③ is combined with the condition ① or ②, only three sheets of photoresist masks, i.e., for patterning of a gate, forming a channel protective film into an island shape, and patterning of a source electrode, a drain electrode, a pixel electrode and a drain bus line are required to complete the operation.

Figure 15:
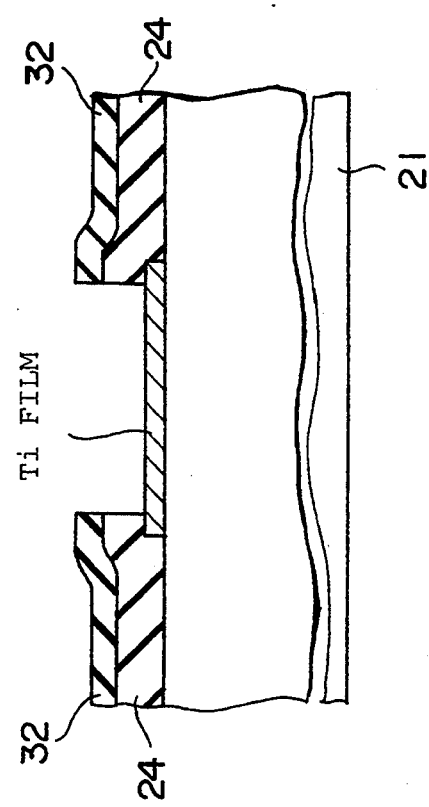
FIG. 15 is a sectional view showing a gate bus terminal portion thereof.

In contrast with the above, when an ITO film is also used at the gate bus terminal portion shown in FIG. 15 and a material used is the same as that of the drain bus line, a process for removing a gate insulator film at the gate bus terminal portion becomes required before forming electrode material films of the source electrode and the gate insulator. Therefore, the number of sheets of the masks are increased by that portion, thus requiring 5 sheets in total. Nevertheless, the number of sheets is less as compared with a case by the prior art.

However, by means of forming ITO under the Ti film that compose the gate bus line in distinction from ITO that compose drain bus terminal portion, the ITO film is used at the bus terminal portion, therefore, 4 sheets in total suffice as number of photomasks. The details will be described in eighth embodiment.

Second Embodiment

Figure 11A:
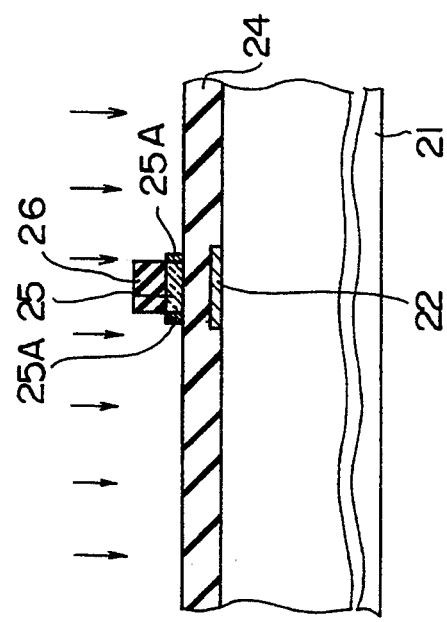
Figure 11B:
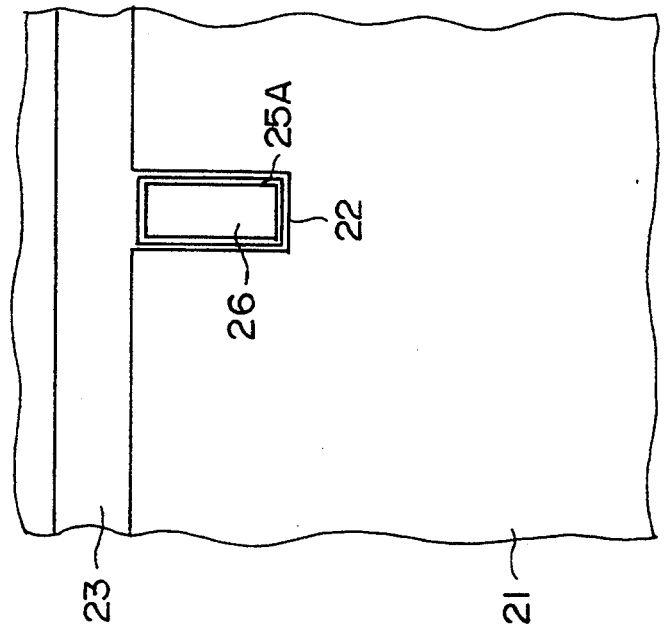

In the first embodiment, three methods of doping phosphorus have been proposed as a method of forming a contact region 25A as shown in FIG. 11A and FIG. 11B.

When a large-sized glass substrate is used, however, it is difficult to introduce phosphorus ions uniformly by an ion implantation method or an ion acceleration method by an electric field.

Further, according to the ion implantation method, annealing for activation is required, but, since the annealing temperature is set by taking the melting point of the glass substrate into consideration, temperature control thereof is restricted. Further, with annealing at a temperature of 300° C. or higher, hydrogen contained in the a-Si film is left out, thereby to deteriorate the transistor characteristics. Hence, it is required to control the temperature lower than that temperature.

As against the above, according to a plasma doping method using a parallel-plane type P-CVD apparatus, it is possible to dope impurities uniformly even into a large area, and moreover, anneal processing for activating impurities becomes unnecessary.

Figure 16:
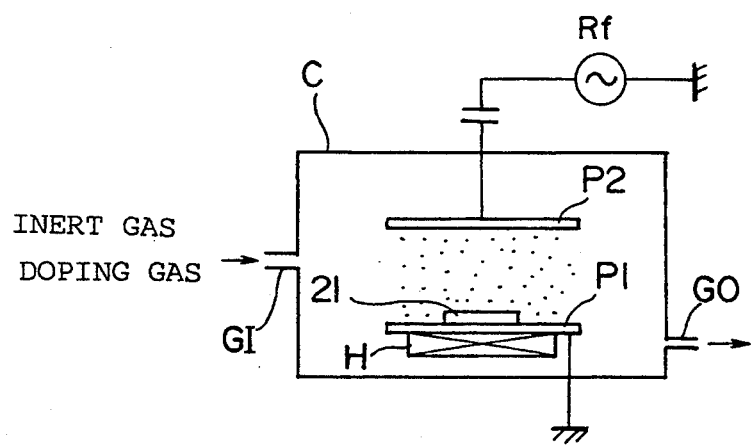
FIG. 16 is a schematic block diagram of a doping apparatus using in a second embodiment of the present invention.

As to the apparatus, a general parallel-plane type plasma CVD apparatus such as shown in FIG. 16 is used. This apparatus has a pair of electrodes P1 and P2 arranged in a reaction chamber C and a heater H on the side of one electrode P1. When impurities are doped, a glass substrate 21 is attached onto the electrode P1 on the side of the heater H, and the glass substrate 21 is heated by the heater H so as to set the substrate temperature to 300° C. or below, and preferably to 200° C. to 250° C.

Further, after reducing the pressure inside the chamber C by letting gas out through an exhaust port GO, mixed gas of argon gas (Ar) and phosphine ($PH_3$) is introduced into the chamber C through a gas inlet port GI. The flow rate of $PH_3$ is set to 5% or lower against Ar. In this case, although similar effects are obtainable by introducing phosphine ($PH_3$) with inert gas other than argon such as neon (Ne) and helium (He) as the base, when hydrogen is used as a base, the active layer 25 composed of a-Si is etched and no phosphorus is injected, which therefore is inappropriate.

Further, the gas pressure is controlled within the range of 0.1 to 2.0 Torr, and the frequency of a high frequency electric power Rf applied to the electrodes P1 and P2 is set to 13.56 Mhz and the supplied electric power is set to 1KW or below, thus generating plasma between the electrodes P1 and P2.

Figure 17:
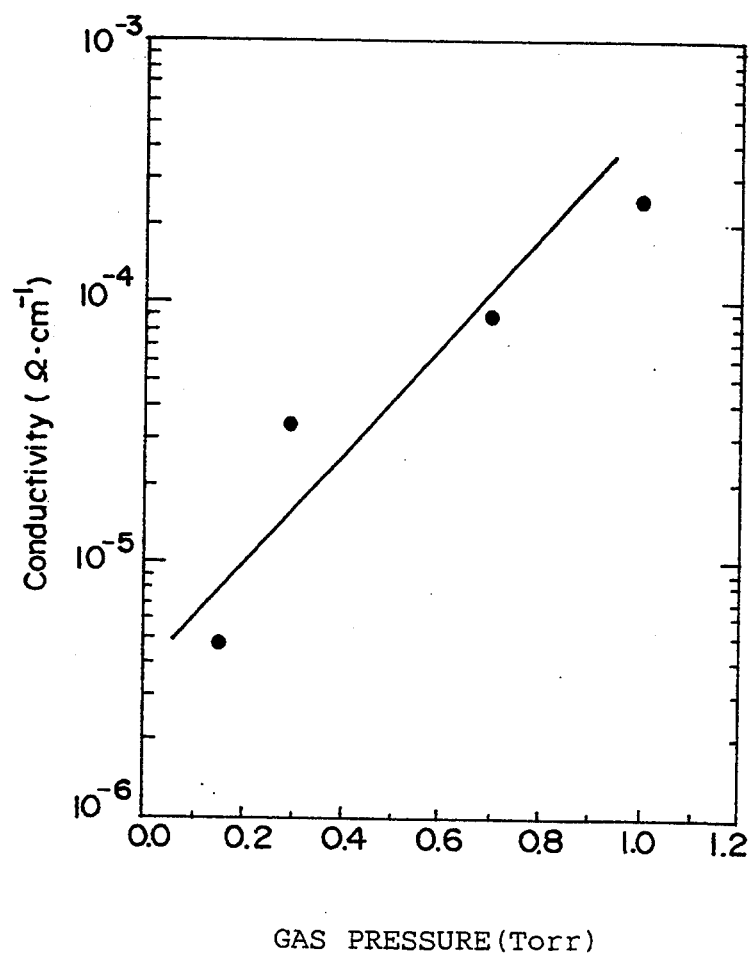
FIG. 17 is a characteristic diagram showing gas pressure dependency by $PH_3$: Ar plasma processing in the second embodiment of the present invention.

With this, the conductivity of the n+-a-Si film forming the contact region 25A depends on the gas pressure, the supplied electric power and so on, and the relationship between the gas pressure and the conductivity appears as shown in FIG. 17 when the flow rate of $PH_3$ against Ar is 0.5% for instance. Thus, it is understood that the higher the pressure reaches, the higher the conductivity becomes.

Figures 1A, 1B:
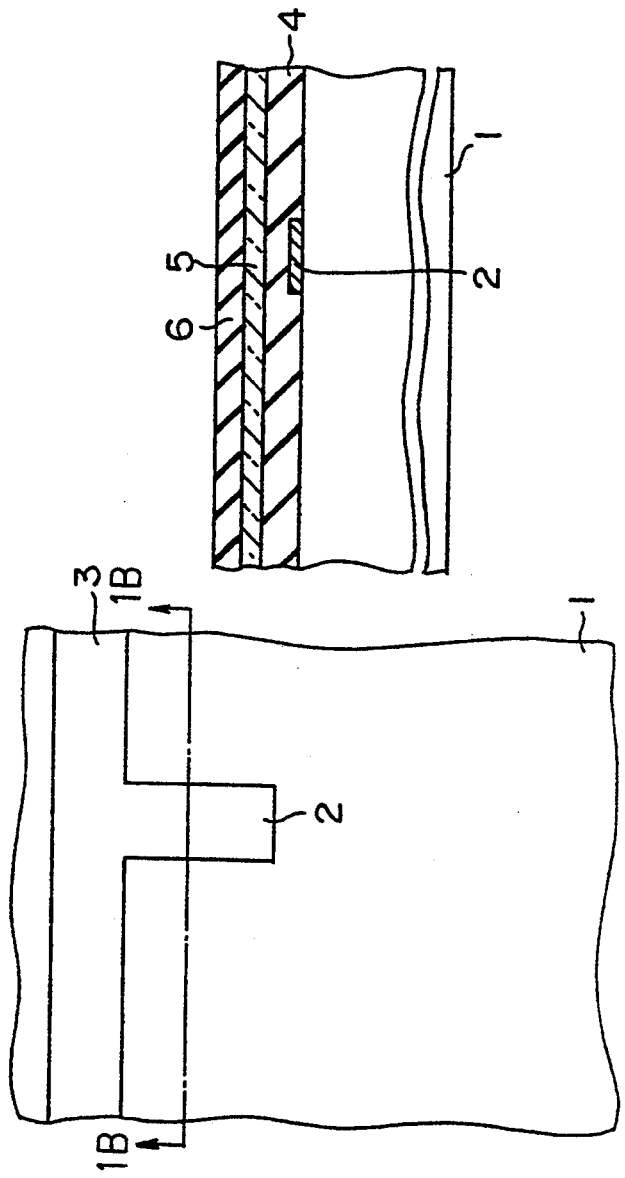
FIG. 1A, FIG. 2A, FIG. 3A, FIG. 4A and FIG. 5A are plan views showing a process of forming a principal part of a TFT matrix according to prior art.
FIG. 1B, FIG. 2B, FIG. 3B, FIG. 4B and FIG. 5B are sectional views showing a process of forming the principal part thereof.
Figure 2B:
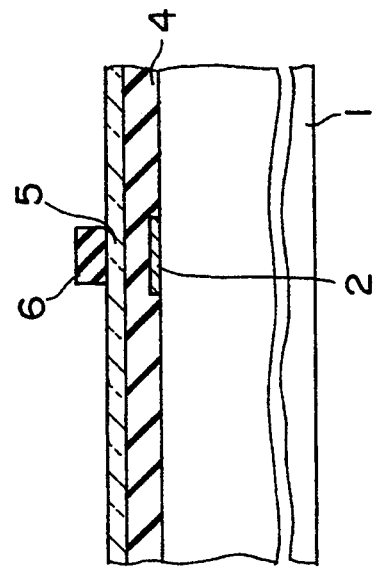
Figure 2A:
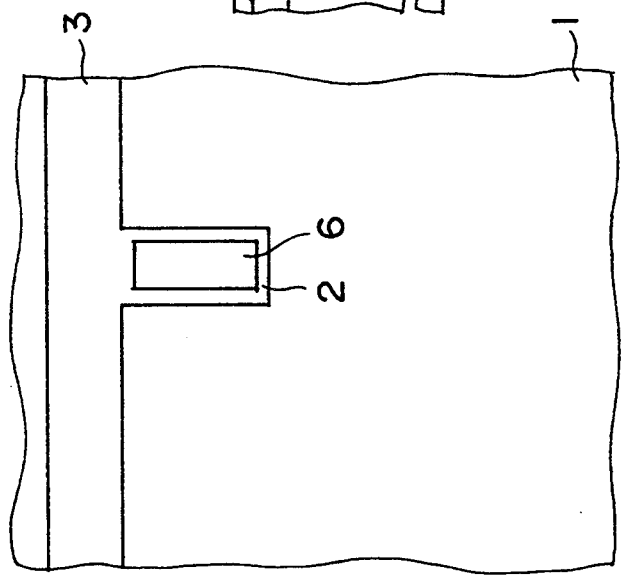
Figure 3A:
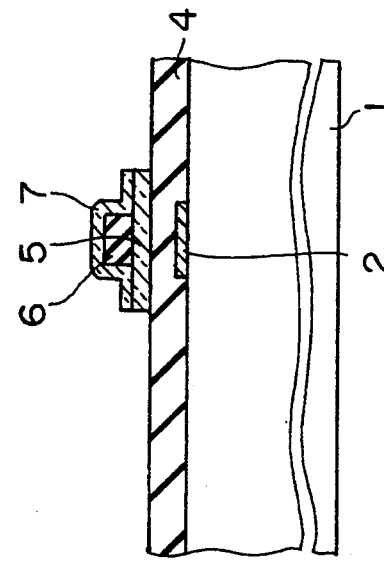
Figure 3B:
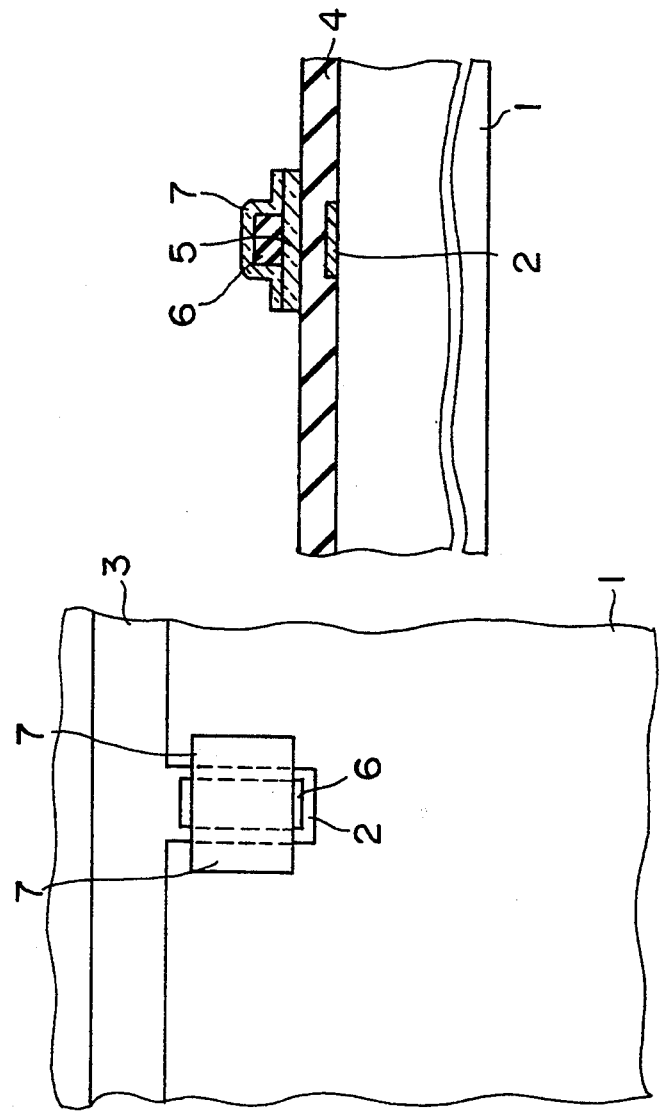
Figure 4A:
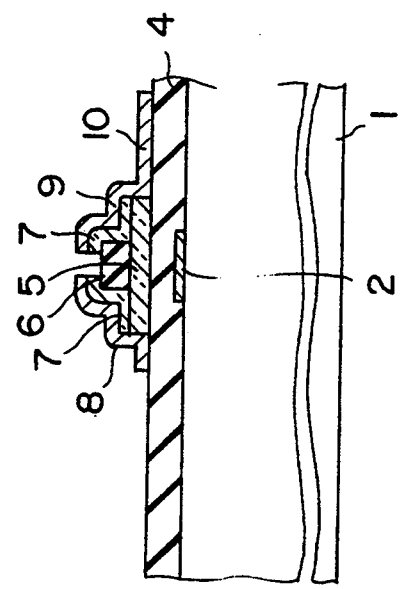
Figure 4B:
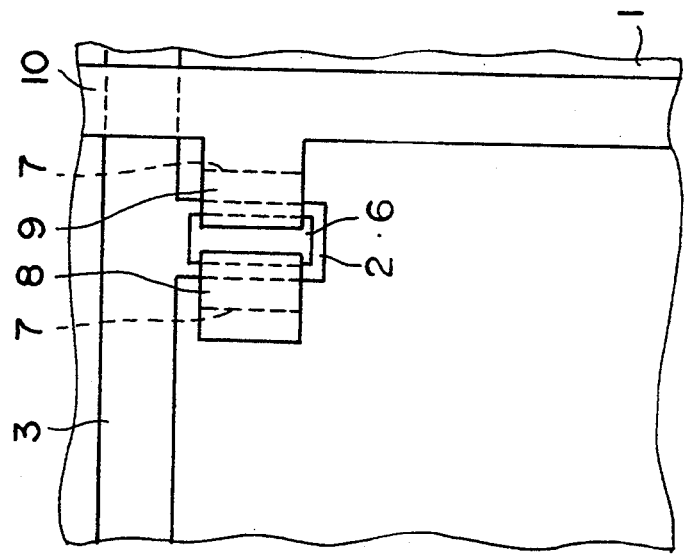
Figures 5A, 5B:
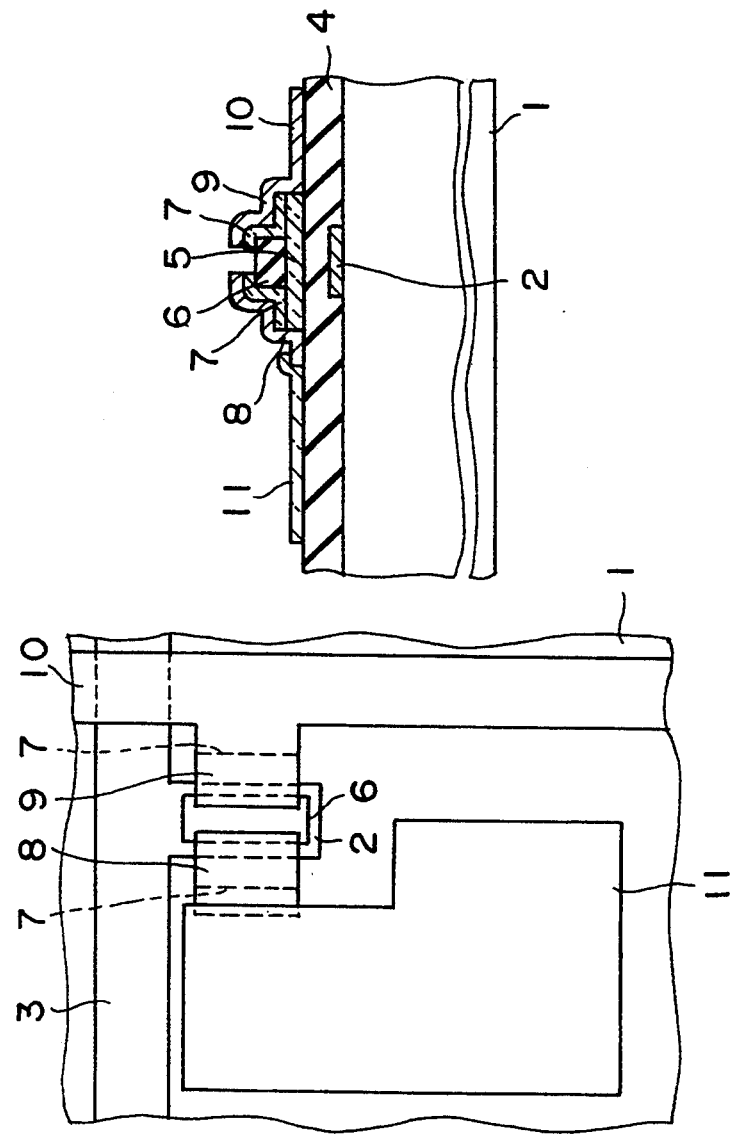
Figure 6:
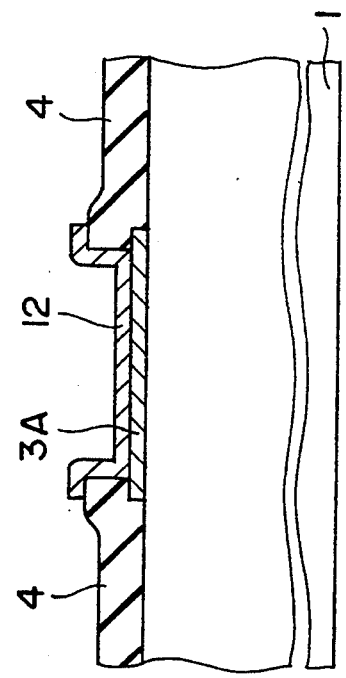
FIG. 6 is a sectional view showing a terminal portion thereof.
Figure 7:
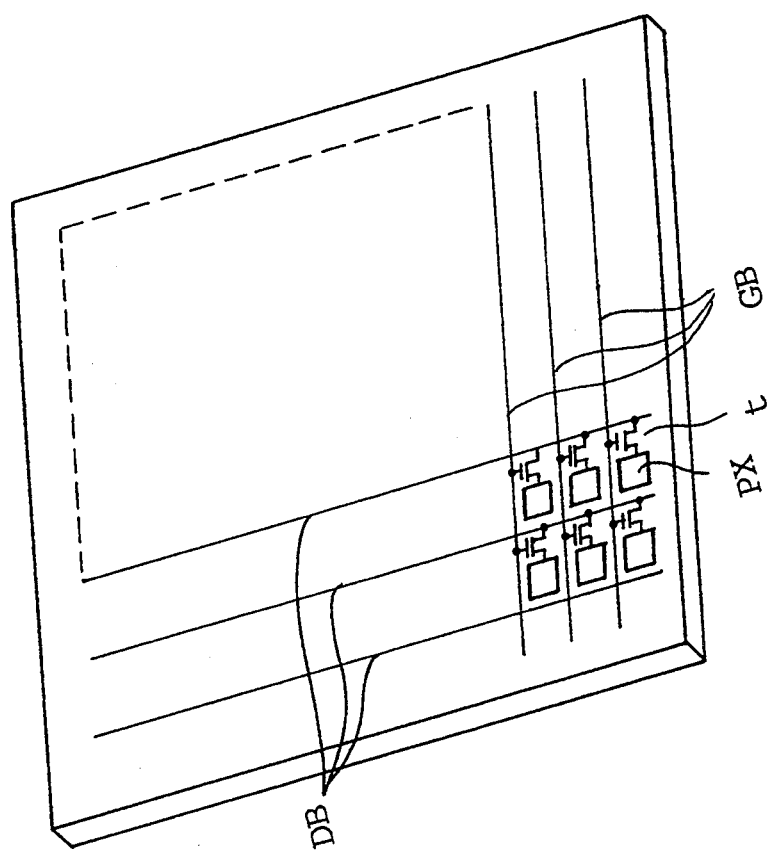
FIG. 7 is an equivalent circuit diagram of thin film transistors of a liquid crystal display panel according to the present invention.
Figure 18:
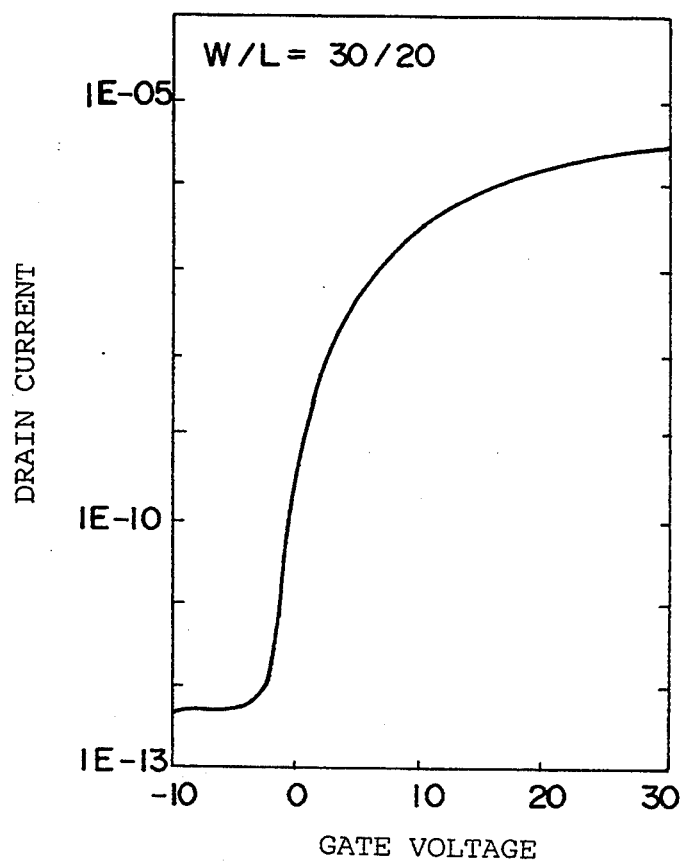
FIG. 18 is a gate voltage-drain current characteristic diagram of the TFT in the second embodiment of the present invention.

Then, when a contact region 25A as shown in FIG. 11A and FIG. 11B was formed with the gas pressure at 0.1 Torr, the drain current Id—the gate voltage Vg characteristic of the TFT shown in FIG. 7 was obtained as shown in FIG. 18. In this case, the ratio of the channel width W to the channel length L is W/L=30/20.

It is the first time for a TFT that high conductivity is shown by implanting phosphorus into an a-Si film, and excellent transistor characteristic is obtainable.

Now, the energy of phosphorus ions generated by plasma is small, and a sufficient quantity is not implanted into single crystal silicon. Therefore, impurity doping using a P-CVD apparatus is peculiar to an amorphous structure such as a-Si containing hydrogen as shown in the present invention.

Next, the optimum value of the dose quantity and the optimum value of phosphorus concentration when phosphine is added to argon gas which becomes the base at a flow rate of 0.5% and plasma doping is applied thereto will be described.

For example, the relationship between the dose quantity by plasma doing into electrode contact region 25A on both sides of the active layer 25 composed of a-Si having a thickness of 150Å and the on-current of the TFT is measured, thereby to obtain the optimum value of the dose.

Figure 19:
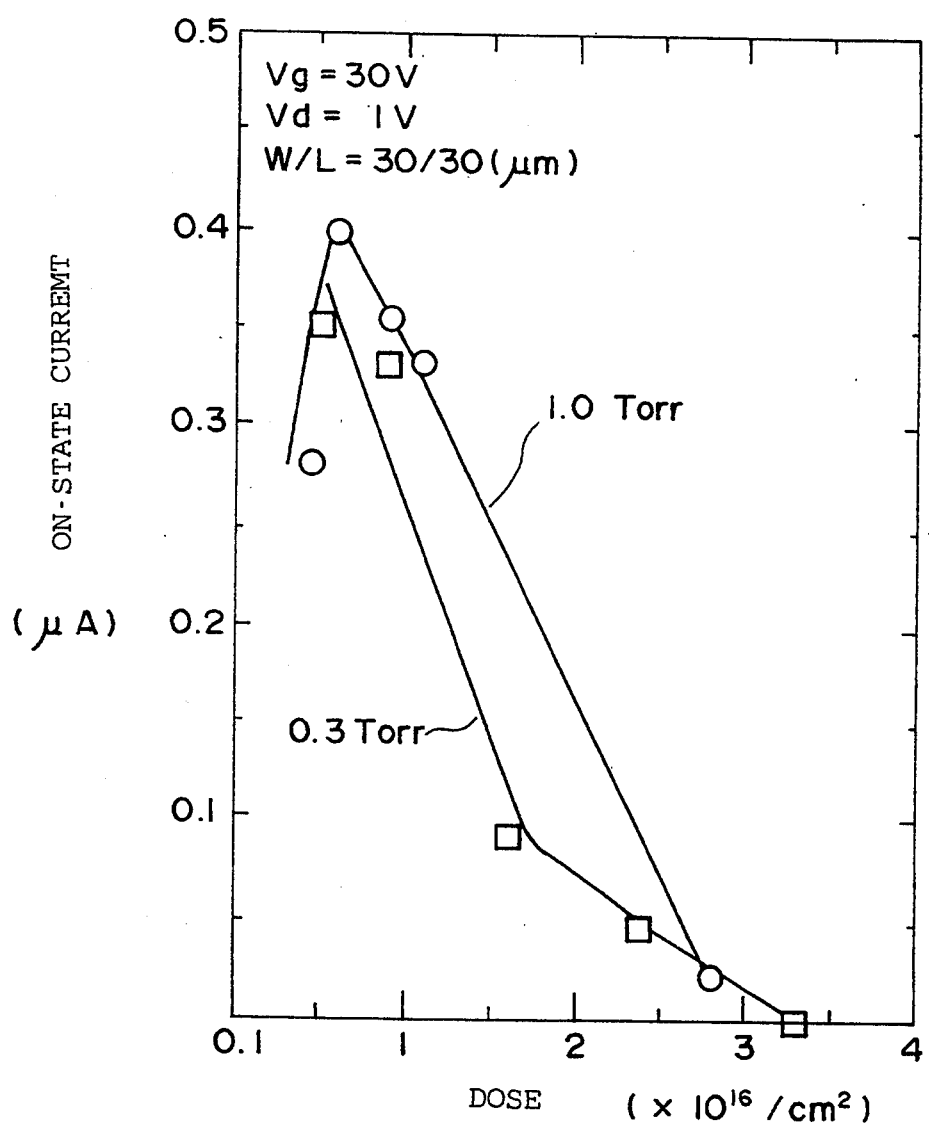
FIG. 19 is a characteristic diagram showing the relationship between a dose quantity and an on-current of a TFT using a plasma doping method in the second embodiment of the present invention.

The relationship is shown in FIG. 19, and the on-current of the TFT reached as high as approximately 0.3 to 0.4 $\mu$A within the range of the dose quantity at $0.5 \times 10^{16}$ to $1.5 \times 10^{16}/cm^2$ when the gas pressure at time of doping is 1.0 Torr, but the on-current was lowered in the range other than the above. When the gas pressure was 0.3 Torr, similarly high on-current was obtained in the range where the dose quantity was $0.5 \times 10^{16}$ to $1.0 \times 10^{16}/cm^2$.

These are values when the ratio of the channel width W to the channel length L is set to 30 $\mu$m/30 $\mu$m, the gate voltage is set to 30V and the drain voltage is set to 1V. Besides, the dose quantity is a surface density quantity of impurities introduced into the active layer 25.

Figure 20:
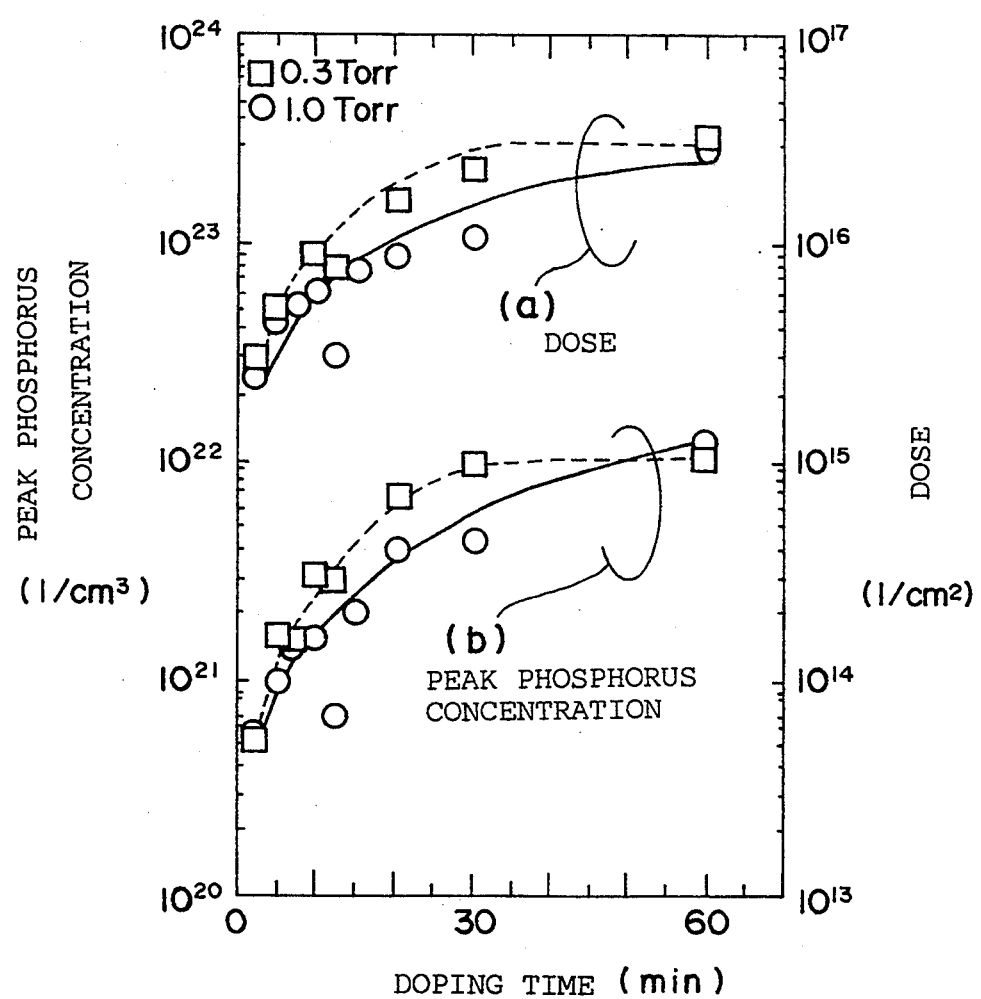
FIG. 20 is a characteristic diagram showing the relationship between a doping period of time and dose quantity and the relationship between the doping period of time and peak phosphorus concentration by a plasma doping method in the second embodiment of the present invention.

Since it is possible to control the dose quantity by plasma doping by doping hours, the relationship such as shown in FIG. 20(a) was obtained when the relationship between the dose quantity and the doping hours was obtained through experiments.

The dose quantity depends on the gas pressure and the supplied electric power in plasma doping. For example, when the dose quantity due to the difference in the gas pressure when the supplied electric power was set to 0.17 W/cm² was investigated, 30 minutes or less was required in order to obtain the dose quantity at $0.5 \times 10^{16}$ to $1.5 \times 10^{16}/cm^2$ with which the on-current gets higher when the gas pressure was 1.0 Torr. In contrast with this, when the gas pressure was set to 0.3 Torr, the dose quantity in the same range was obtainable in a period of time shorter than 15 minutes. Besides, it was found that shortening of dose hours can be aimed at when the supplied electric power is increased.

On the other hand, when the supplied electric power was set to 0.17 W/cm² and the relationship between peak values of phosphorus concentration and doping period of time was obtained by experiments, such results as shown in FIG. 20(b) were obtained. Taking the above into consideration with the relationship shown in FIG. 20(a), the peak value of phosphorus concentration with which the on-current reaches high becomes $1 \times 10^{21}$ to $7 \times 10^{21}/cm^3$ at the gas pressure of 1 Torr. A comparatively high on-current is also obtainable even at $5 \times 10^{20}/cm^3$.

In the foregoing, phosphine was introduced with argon gas as a base, but almost similar results are obtainable when inert gas other than the above such as helium and neon is adopted as a base.

Besides, a trivalent hydride such as $B_2H_6$ or a trivalent fluoride such as $BF_3$ may also be used as base gas at time of plasma doping. With this, the electrode contact region 25A is turned into a p-type.

Besides, phosphine and inert gas are introduced into the chamber in the explanation described above, but any mixed gas of gas containing either a hydride of a III group element or a V group element or a V group element and inert gas may be adopted. When a trivalent hydride or a trivalent fluoride is used, the electrode contact region 25A is turned into a p-type.

Third Embodiment

In general, doping of impurities and formation of a metal for source and drain electrodes are performed by a separate apparatus. For example, as described in the second embodiment, the surface of the active layer 25 is exposed to the air and contaminated with impurities sometimes when the substrate is moved from the P-CVD apparatus to the sputtering apparatus.

Figure 21:
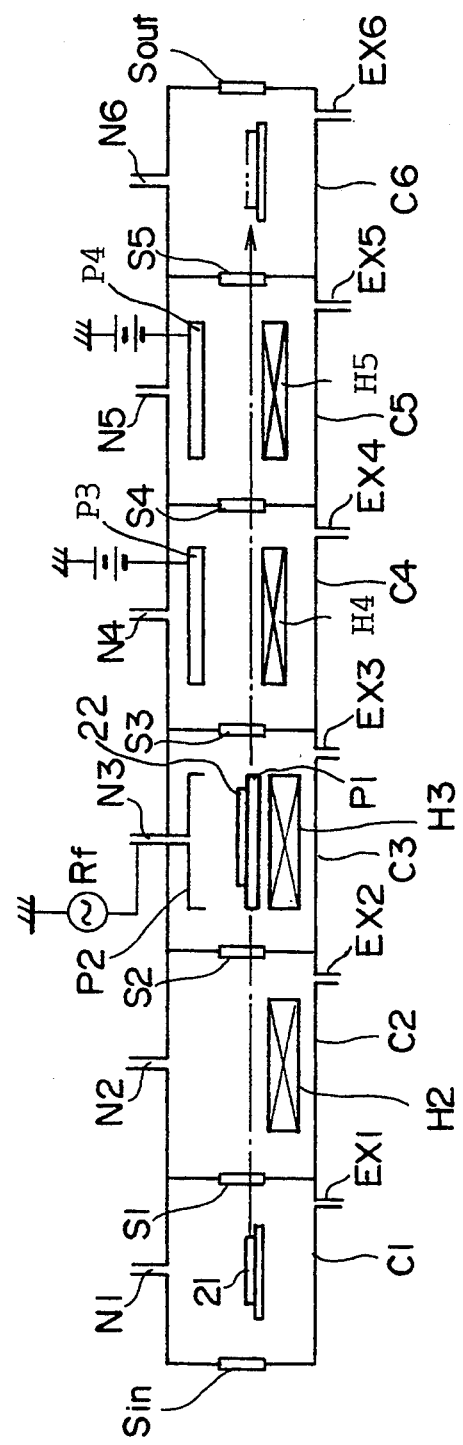
FIG. 21 shows a doping and film forming apparatus used in a third embodiment of the present invention.

In order to solve such a problem, it is sufficient if an apparatus for forming a film successively without breaking vacuum after the contact region 25A is formed on the periphery of the active layer 25 until the source and drain electrodes are formed, e.g., an apparatus having a structure shown in FIG. 21 is used.

This apparatus is provided with a loading chamber C1 for placing a substrate and a unloading chamber C6 for taking out the substrate outside. Between these chambers, a temperature rise chamber C2, a reaction chamber C3 of a plasma CVD apparatus, a reaction chamber C4 of a first sputtering apparatus and a reaction chamber C5 of a second sputtering apparatus are provided adjacent to one another in conveying order of the substrate, and substrate conveying ports for conveying the substrate without breaking vacuum states are formed at their connecting portions. Further, gate valves S1 to S6 capable of gastightly sealing are fitted to those substrate conveying ports, respectively.

Furthermore, exhaust ports EX1 to EX6 for exhausting inside gas and gas inlet ports N1 to N6 for introducing gas inside are fitted in respective chambers C1 to C6.

The plasma CVD apparatus is of a parallel plane type, and has a pair of electrodes P1 and P2 connected to a high frequency power supply Rf, and has a heaters H.

Further, sputtering cathods P3 and P4 connected to a d.c. power supply, respectively, are arranged in respective reaction chambers C4 and C5 of a first and a second sputtering apparatus, and targets of a film forming material are fitted to cathodes thereof.

Besides, a symbol Sin in the figure indicates a gate valve fitted to an entrance of the loading chamber C1, Sout indicates a gate valve fitted to an exit of the unloading chamber C6, and H2 indicates a heater fitted in the temperature rise chamber C2.

Next, a process from doping until forming a source and drain electrode using this apparatus as shown in FIG. 10A, FIG. 10B, FIG. 11A and FIG. 11B will be described.

First, as shown in FIG. 10A and FIG. 10B, the glass substrate 21 is placed in the loading chamber C1, after applying side etching to the channel protective film 26 on the glass substrate 21 and exposing the peripheral portion of the active layer 25.

Then, after closing the gate valve Sin at the entrance of the loading chamber C1 and reducing the pressure inside thereof, the gate valve S1 on the exit side is opened and the glass substrate 21 is moved to the temperature rise chamber C2, and the glass substrate 21 is preheated to approximately 200° C. in the chamber after closing the gate valve S1.

Thereafter, the gate valve S2 on the exit side of the temperature rise chamber C2 is opened and the glass substrate 21 is placed on the electrode and wafer-carrier P1 in the reaction chamber C3 of the P-CVD apparatus. Then, the glass substrate 21 is heated to 300° C. or below, and preferably to 200° C. to 250° C. by means of a heater H3 thereunder. Further, an exhaust mechanism not shown is controlled so that the inside pressure reaches an optimum pressure between 0.1 to 1.0 Torr. Furthermore, the supply electric power by means of the high frequency power supply Rf of 13.56 Mhz is set to 1 KW or below.

Here, phosphine is introduced into the P-CVD apparatus at a flow rate of 0.5% with argon as a base, and phosphorus ions are introduced into the surface or the film of the a-Si active layer 25 by plasma generated between a pair of electrodes P1 and P2. With this, the contact region 25A is formed.

Then, the glass substrate 21 is conveyed into the reaction chambers C4 and C5 of the first and the second sputtering apparatus in consecutive order, and an ITO film is formed by the first sputtering apparatus, and thereafter, a molybdenum film is formed by the second sputtering apparatus. Argon gas is introduced through gas inlet ports N4 and N5 at time of such sputtering, and $O_2$ gas at a rate of 1% with Argon is introduced through the gas inlet port $N_4$ at a time of forming ITO.

After film formation by the sputtering apparatus is completed, the glass substrate 21 is taken outside after conveying the glass substrate 21 into the unloading chamber C6 in a decompressed state.

Thereafter, the process is shifted to a process of patterning the molybdenum film and the ITO film as shown in FIG. 11A and FIG. 11B, but the details are omitted here since they have been described in the first embodiment. Besides, a chrome film may be used in place of molybdenum.

Figure 22:
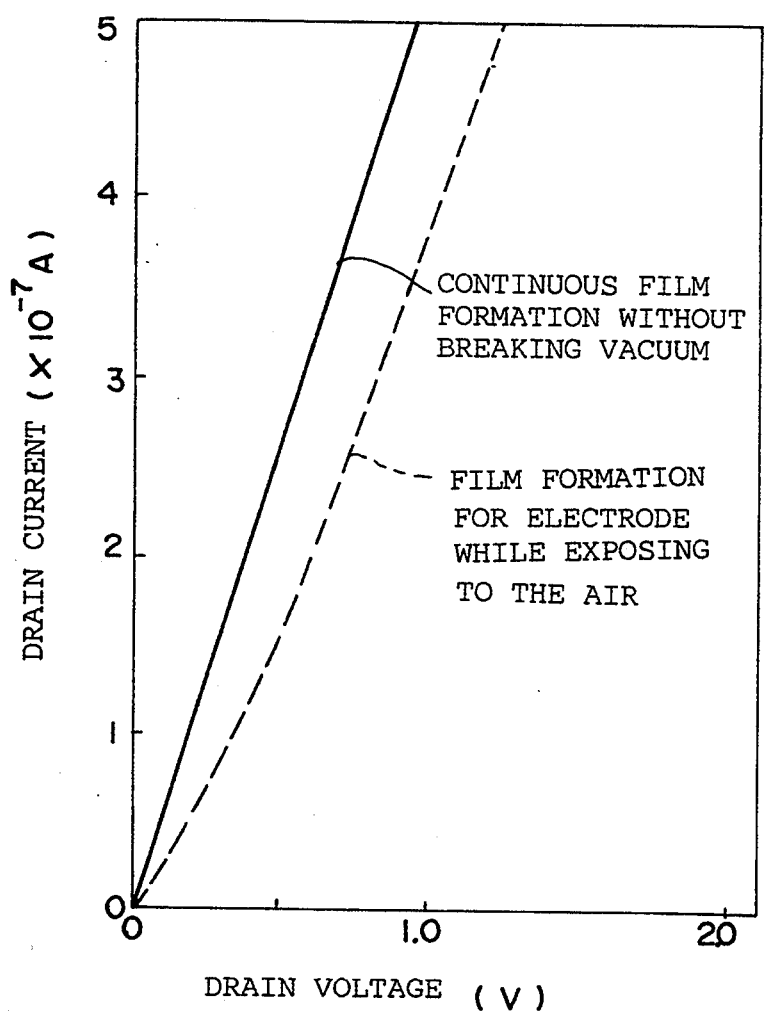
FIG. 22 is a drain voltage-drain current characteristic diagram of a TFT in the third embodiment of the present invention.

When the drain current-drain voltage characteristic of a TFT formed through a process of depositing a conductive film for forming the source and drain electrodes without breaking the vacuum state after plasma doping using a P-CVD apparatus was investigated, the characteristic as shown with a solid line in FIG. 22 has been obtained.

As against the above, when the drain current the drain voltage characteristic when source and drain electrodes are formed without performing hydrofluoric acid processing after exposing the surface of the contact region 25A to the area was investigated, the characteristic as shown with a broken line in FIG. 22 has been obtained.

As a result, it has been realized that the contact resistance is reduced more in the case that a conductive film for forming source and drain electrodes without breaking vacuum after plasma doping.

Figure 23:
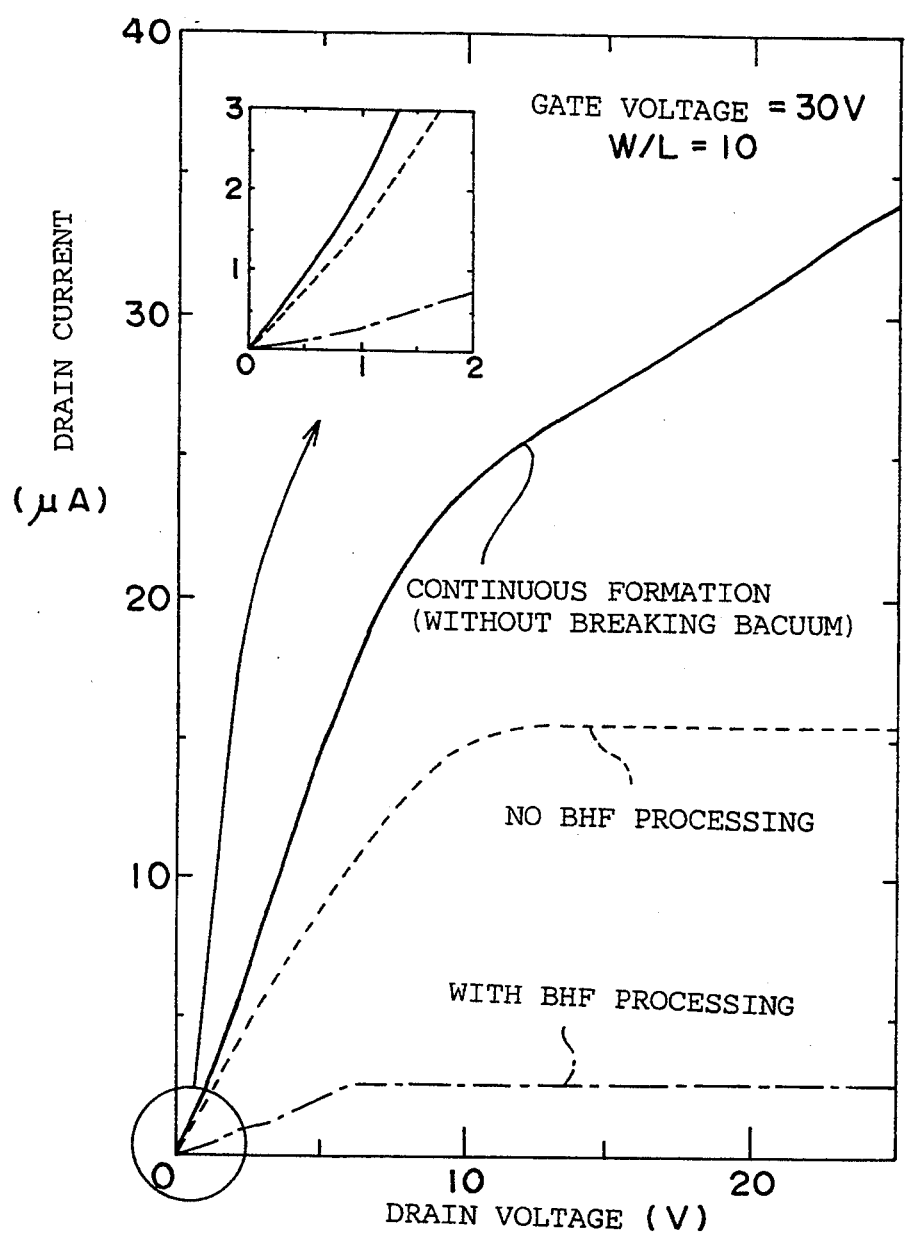
FIG. 23 is a drain voltage-drain current characteristic diagram of a TFT by the difference in processing after doping in the third embodiment of the present invention.

Further, when a case in which, after the a-Si active layer 25 doped with impurities by a plasma doping method is exposed to the air, electrodes 28 and 29 are formed after cleaning the surface with a buffer hydrofluoric acid (BHF) solution and a case in which electrodes 28 and 29 are formed without cleaning the BHF solution are compared with each other, the relationship between the drain current and the drain voltage appears as shown in FIG. 23.

As a result, it is understood that the characteristic of the TFT is improved more when hydrofluoric acid processing is not applied to the electrode contact region 25A of the active layer 25. The causes are deemed to be due to the fact that ① phosphorus flows out by cleaning, and ② hydrogen is gone from silicon by implantation of phosphorus and uncoupled hands are produced there, and contaminants in the air are captured by the uncoupled hands.

Besides, by striking the surface of the active layer 25 by inert gas such as helium, argon, neon or krypton before doping impurities, hydrogen contained in a-Si is removed so as to make it more amorphous, and it becomes easier to introduce impurities when doping is made thereafter.

Now, it is desirable to perform a process of removing a natural oxide film on the surface of the contact region 25A by slight etching with thin hydrofluoric acid solution, hydrogen plasma processing and so on as a preprocess of forming the contact region 25A such as shown in FIG. 11A and FIG. 11B. When wet etching is made, however, an oxide film is also generated when the glass substrate 21 is charged in the apparatus.

Therefore, the natural oxide film grown on the surface of the active layer 25 may be removed by generating hydrogen plasma before performing doping by a plasma CVD apparatus.

A sputtering method is used as a method of forming a conductive film in the present invention, but it is important not to break the vacuum, and, when a chemical vapor deposition method or a vacuum evaporation is used as another method of forming a conductive film, it is required to move the glass substrate 21 without breaking the vacuum prior to forming the film.

Further, it may also be arranged so that a d.c. power supply is used as the power supply of the parallel plate type P-CVD apparatus, and the substrate is placed either on the negative side or the positive side of the electrode thereof or an a.c. power supply connected to the electrodes of the P-CVD apparatus has a low frequency of 1 MHz or lower. Since ion energy is large with an a.c. power supply at 1 MHz or lower, there is an advantage that ions can be implanted deeply in a shorter period of time.

Fourth Embodiment

Figure 24A:
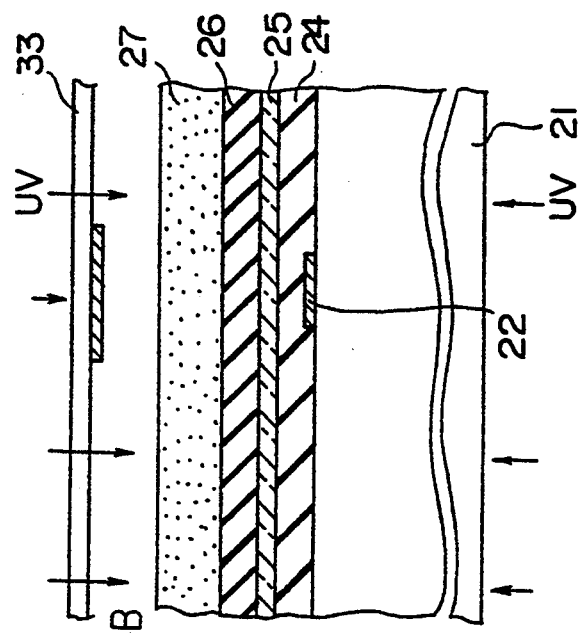
FIG. 24A and FIG. 25 are plan views showing a part of a process of forming a principal part of a TFT in a fourth embodiment of the present invention.
Figure 24B:
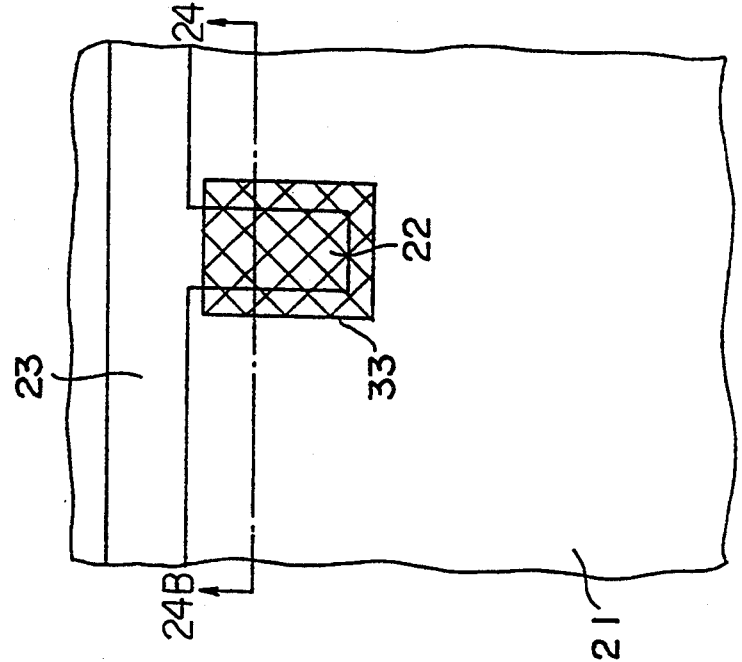
FIG. 24B is a sectional view taken along a line X—X in FIG. 24A.
Figure 25:
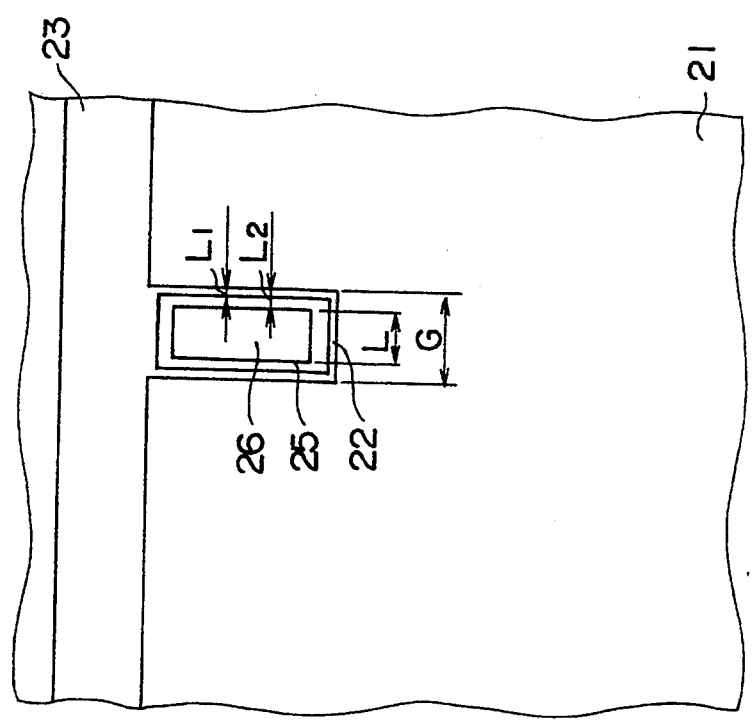

FIG. 24A, FIG. 24B and FIG. 25 are plan views of a TFT matrix at important parts of a process for explaining a fourth embodiment of the present invention, and the reference numbers same as those that are used in FIG. 8A and FIG. 8B to FIG. 13A and FIG. 13B and FIG. 14, FIG. 15 in the first embodiment are to show the same parts or to have the same meaning.

The present embodiment is obtained by modifying the first embodiment partially. In the first embodiment, the photoresist film 27 having a pattern for leaving the channel protective film 26 having a narrower width than that of the gate electrode 22 on the gate electrode 22 only is formed in the process related to FIG. 8A and FIG. 8B. In the present embodiment, techniques for exposing from the back of the substrate 21, i.e., self-alignment techniques by rear exposure are utilized when the photoresist film pattern is formed.

Now, it is assumed at this stage that the gate electrode 22 and the gate bus line 23 composed of a Ti film have been formed on the substrate 21, and the gate insulator film 24, the active layer 25 composed of a-Si and the channel protective film 26 composed of SiN have been formed on the whole surface, respectively.

Next, a process shown in FIG. 24A and FIG. 24B will be described.

First, after applying the positive type photoresist film 27 onto the whole surface of the channel protective film 26, ultraviolet rays (UV) are radiated from the back of the substrate 21 with the gate electrode 22 and the gate bus line 23 as a mask.

According to such exposure, going round of ultraviolet rays is generated along the contours of the gate electrode 22 and the gate bus line 23, and a pattern of the photoresist film 27 having a contour shifted inwardly by approximately 0.5 $\mu$m to 1.0 $\mu$m for instance with respect to the above-mentioned contours is obtained.

Besides, although the pattern of the photoresist film 27 is not shown in FIG. 24A and FIG. 25B, the configuration may be comprehended from the explanation described previously.

In the next place, a photomask 33 is placed above the photoresist film 27 and exposure with ultraviolet rays is performed.

The exposure is performed for the purpose of forming the photoresist film into an island shape so as to restrict so that it exists on the gate electrode 22 only. Since the exposure is only for restricting the edge of the boundary with the gate bus line in the longitudinal direction (gate width direction) of the gate electrode 22, high precision is not required.

When the photoresist film 27 is developed, a photoresist pattern which has a short distance between the pattern end of the gate electrode 22 and the pattern end of the photoresist film as compared with the case of the first embodiment as seen in FIG. 8A, FIG. 8B to FIG. 13A, FIG. 13B, FIG. 14 and FIG. 15 is obtainable. Explaining with reference to FIG. 25 since the photoresist pattern is not shown in FIG. 24A and FIG. 24B, a photoresist pattern in which the distance $L_1$ between the pattern end of the gate electrode 22 and the pattern end of the photoresist film (i.e., the pattern end of the photoresist film having the same pattern as the active layer 25) is small.

Next, the process up to a point shown in FIG. 25 will be described.

Anisotropic etching is applied to the channel protective film 26 and the active layer 25 by applying an RIE with the pattern of the photoresist film 27 formed in the process as a mask and with mixed gas of $BCl_3$ and $Cl_2$ or mixed gas of $CF_4$ and $O_2$ as etching gas so as to apply patterning into a configuration having a width narrower than that of the gate electrode 22.

Side etching is applied only to the channel protective film 26 in a state that the photoresist film 27 is left by applying a wet etching method using a hydrofluoric acid etching liquid as an etchant.

The photoresist film 27 is removed by dipping in a photoresist peeling liquid.

Now, in a TFT, it is important for reducing the gate capacitance to make the size as small as possible within the range that the required on-current (which is determined by the channel width W/the channel length L so far as dimensional design is concerned) can be secured.

Here, the channel length L is equal to the width of the channel protective film 26, and is determined by the slit dimension (resolution limit of exposure: ~3 $\mu$m) between a source electrode 28 and a drain electrode 29 and the overlap dimension (setting precision of exposure: ~3 $\mu$m$\times$2) with the channel protective film 26. Thus, the sum of the channel length L, twice the light going round portion $L_1$ and twice the side etching portion $L_2$ becomes the gate length G. It is related to reduction in the gate capacitance to make the gate length G shorter.

According to the fourth embodiment, since the light going round portion $L_1$ originated in back exposure is 0.5 $\mu$m to 1.0 $\mu$m and becomes smaller than ~3 $\mu$m in the case of mask alignment, it is possible to design the gate electrode 22 to be small in size by that portion, and to reduce problems in point of design or in point of display originated in the gate capacitance.

In general, when a liquid crystal is driven by a TFT matrix, shift of pixel potential originated in the capacitance between the source and the gate the instant the pulse voltage immediately after write of a signal into the pixel electrode, i.e., immediately after signal voltage is applied to signal electrode (drain) by applying such voltage that turns the TFT ON to the gate electrode is discontinued. Therefore, the capacitance between source and electrode has to be made small, which approximately half of the value of the gate capacitance.

The gate capacitance is the capacitance of a capacitor when a dielectric is used for the gate insulator film in the gate electrode region, the source-drain electrode region or the island region composed of a-Si when the TFT is turned on. Accordingly, in order to improve the display quantity by reducing the capacitance between source and gate, i.e., by reducing the shift of the pixel potential, it is effective to reduce the gate area overlapped with the source-drain electrode region and the island region composed of a-Si.

The restrictions in manufacturing that check reduction in dimensions in the channel length direction in a TFT may be mentioned to be: ①the slit between source and drain electrodes (resolution of exposure), ②overlap of source and drain electrodes and the channel protective film (setting precision of exposure), ③ protruding portion of the gate electrode from the channel protective film (setting precision of exposure and so forth. Since it is possible to make the term ③ minimum by a self-align method in the present invention, it becomes possible to design the gate electrode small.

Fifth Embodiment

Figure 26:
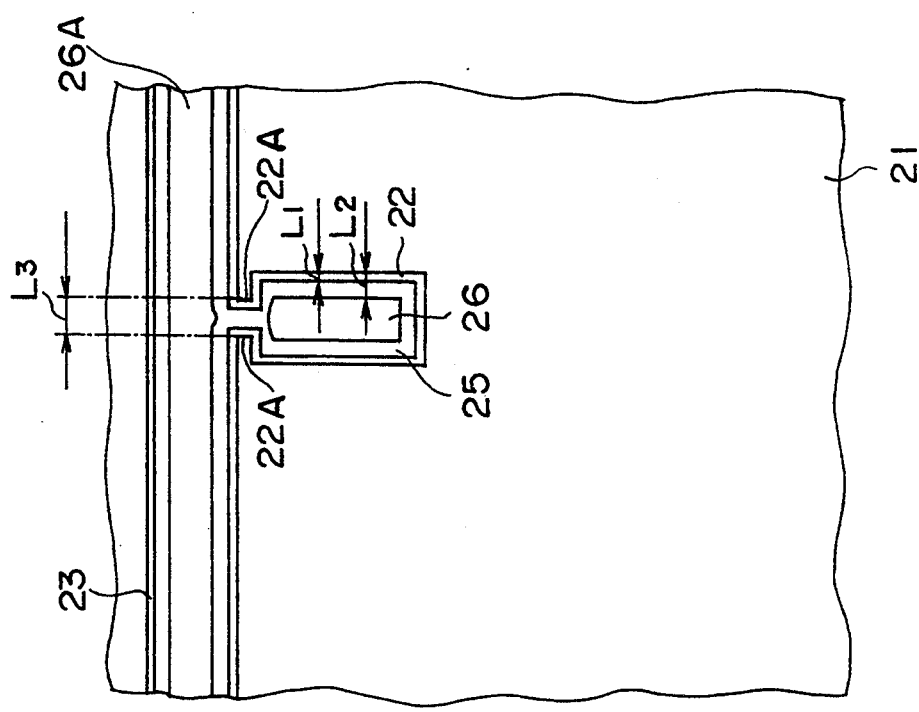
FIG. 26 is a plan view showing a process of forming one of principal parts of a TFT matrix in a fifth embodiment of the present invention.

FIG. 26 is a plan view of a principal part of a TFT matrix at a principal part of the process for explaining a fifth embodiment of the present invention, and the reference numerals same as those used in FIG. 8A, FIG. 8B to FIG. 13A, FIG. 13B and FIG. 14, FIG. 15 represent the same parts or have the same meaning.

The present embodiment is obtained by adding partial modification to the fourth embodiment described with reference to the drawings. A pattern with the boundary portion between the gate electrode 22 and the gate bus line 23 throttled narrow is formed, with which various advantages are produced in the case of back disposure.

Now, at this stage, it is assumed that the gate electrode 22 and the gate bus line composed of a Ti film have been formed on the substrate 21, and the gate insulator film 24 composed of SiN, the active layer 25 composed of a-Si and the channel protective film 26 composed of SiN have been formed on the whole surface, respectively.

Incidentally, in the pattern of the gate electrode 22 in the fifth embodiment, a throttle portion 22A is formed at the boundary portion with the gate bus line 23 as shown in FIG. 26, and an excellent advantage in point of a manufacturing process is obtainable by selecting the width $L_3$ of the throttle portion 22A so as to be $L_3 < 2(L_1 + L_2)$ assuming that the light going round portion originated in back exposure is $L_1$ and the side etching portion of the channel protective film 26 is $L_2$ similarly to the fourth embodiment.

By applying a photoresist process in lithography techniques, a positive type photoresist film (not shown) is formed on the whole surface of the channel protective film 26, and then ultraviolet rays are irradiated from the back of the substrate 21 so as to expose the photoresist film with the gate electrode 22 having the throttle portion 22A and the gate bus line 23 as the mask, and development is performed thereafter.

By doing so, the light going round portion $L_1$ is generated along the contour of the gate electrode 22 and the gate bus line 23, and a pattern of the photoresist film having a contour inside of the contour by approximately 0.5 μm to 1.0 μm is obtained similarly to the fourth embodiment.

Next, the photoresist film applied with patterning is used as the mask, and an RIE using mixed gas of $BCl_3$ and $Cl_2$ or mixed gas of $CF_4$ and $O_2$ as etching gas is used, thereby to apply anisotropic etching to the channel protective film 26 and the active layer 25. With this, patterning is applied in a configuration having a narrower width than that of the gate electrode 22 and the gate bus line 23.

Thereafter, side etching is applied only to the channel protective film 26 in a state that the photoresist film is left by applying a wet etching method using hydrofluoric acid etching liquid as an etchant.

In such side etching, the channel protective film 26 on the gate electrode 22 and the channel protective film 26 on the gate bus line 23 are separated from each other when the condition of $L_3 < 2(L_1 + L_2)$ is maintained, and exposure from the surface using the photomask 33 as shown in the process in the fourth embodiment is not needed.

Here, in FIG. 26, the channel protective film 26 separated in each gate electrode is shown, and a SiN film on the gate bus line 23 which has been formed as one body of the channel protective film 26 is indicated by a reference numeral 26A.

Besides, in the side etching in this case, it is a matter of course that anisotropic etching is applied in a state that no patterning is applied to the active layer 25, and patterning and side etching of the channel protective film 26 only may be preceded.

Next, the photoresist film formed in the abovementioned process is removed by dipping it in a photoresist peeling liquid.

According to the fifth embodiment, even if the a-Si layer of the same material as the active layer 25 is left at the boundary portion between the gate electrode 22 and the gate bus line 23, it is removed in later processes when the channel protective film 26 does not exist thereon. Thus, the active layer 25 is also formed in an island shape automatically in each TFT, and mutual interference between adjacent TFTs is not produced.

Sixth Embodiment

In the fifth embodiment in which description has been made with reference to FIG. 26, it is possible to reduce the number of photomasks as compared with the first and the fourth embodiments. Therefore, embodiments applied with these techniques will be described in detail hereinafter.

FIG. 27A, FIG. 27B to FIG. 33A, FIG. 33B are explanatory views of a principal part of a TFT matrix at a principal position of a process for explaining a sixth embodiment of the present invention. FIG. 27A to FIG. 33A are plan views of a principal part, and FIG. 27B to FIG. 33B are sectional views taken along a line X—X. In FIG. 27A to FIG. 33A, a part of layers is omitted for making the description comprehensible. Description will be made hereinafter with reference to these drawings.

First, the process until a state shown in FIG. 27A and FIG. 27B is reached will be described.

At the beginning, a Ti film having a thickness of 80 nm for instance is formed on the substrate 21 composed of a transparent insulator such as glass by applying a sputtering method.

By applying an RIE using mixed gas of $BCl_3$ and $Cl_2$ as etching gas after a photoresist process in lithography techniques, patterning is applied to the Ti film formed in the above-mentioned process, thereby to form the gate electrode 22 and the gate bus line 23 having a throttle portion 22A at the boundary portion as shown in FIG. 27A.

By applying a P-CVD method using a gas including $SiH_4$, $NH_3$ and $N_2$ the gate insulator film 24 composed of SiN having a thickness of 400 nm for instance, and using a gas including $SiH_4$ and $H_2$ the active layer 25 composed of a-Si having a thickness of 15 nm to 50 nm for instance and the channel protective film 26 composed of SiN having a thickness of 120 nm for instance are formed one after another.

Next, by applying a photoresist process in lithography techniques, after forming a positive type photoresist film 27 on the whole surface of the channel protective film 26, ultraviolet rays are radiated from the back of the substrate 21 with the gate electrode 22 and the gate bus line 23 having a throttle portion 22A as a mask so as to expose the photoresist film 27, and then development is performed.

By doing so, a light going round portion $L_1$ is generated along the contour of the gate electrode 22 and the gate bus line 23 and a pattern of the photoresist film 27 having a contour inside by approximately 0.5 μm to 1.0 μm with respect to the above-mentioned contour is obtainable similarly to the fifth embodiment.

Thereafter, as shown in FIG. 28A and FIG. 28B, by applying an RIE with the photoresist film 27 applied with patterning as a mask and using mixed gas containing $BCl_3$ and $Cl_2$ as etching gas, anisotropic etching is applied to the channel protective film 26 and the active layer 25 so as to apply patterning thereto to form a configuration having a narrower width than the gate electrode 22 and the gate bus line 23.

Figures 29A, 29B:
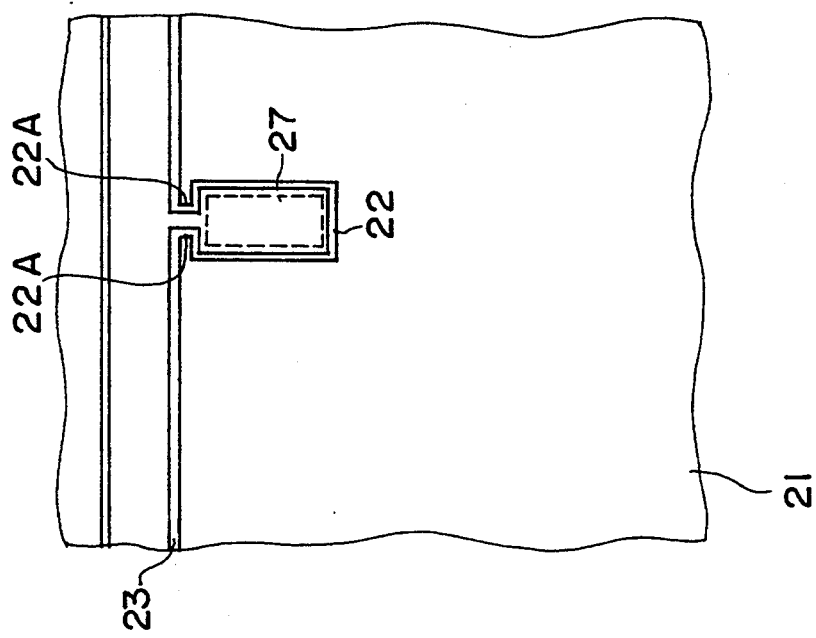
Figures 32A, 32B:
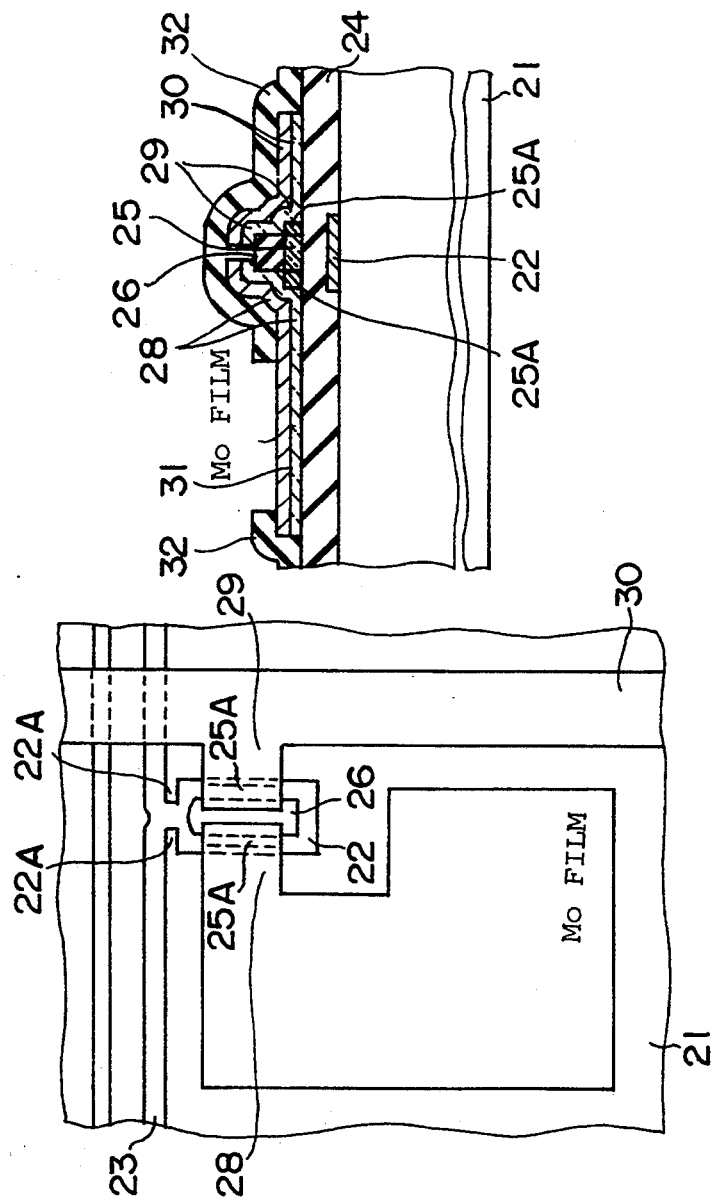

Next, by applying a wet etching method using a hydrofluoric acid etching liquid as an etchant, anisotropic etching is applied to the channel protective film 26 only in a state that the photoresist film 27 is left as shown in FIG. 29A and FIG. 29B.

In this anisotropic etching, side etching is applied to the channel protective film 26 due to the existence of the photoresist film 27, and the side etching portion $L_2$ is up to 2 μm for instance.

In this side etching, the channel protective film 26 is separated in each gate electrode by also maintaining the condition of $L_3 < 2(L_1 + L_2)$, and exposure from the above using a photomask as seen in the process in the fourth embodiment is not performed.

In the figure, the channel protective film 26 separated in each gate electrode is shown, and the SiN film which has been in one body with the channel protective film 26 on the gate bus line 23 before side etching is applied is indicated with a reference numeral 26A.

Besides, in the present process, it may also be arranged so that anisotropic etching is applied to the channel protective film 26 only from the beginning without applying patterning to the active layer 25, patterning and side etching thereof is applied continuously, and thereafter, anisotropic etching is applied to the active layer 25 with the photoresist film 27 as a mask.

Next, after removing the photoresist film 27 by dipping in a photoresist peeling liquid, phosphorus is doped in a portion of an active layer 25 revealed in the periphery of the channel protective film 26 by exposing that portion to plasma of $PH_3$ and Ar as shown in FIG. 30A and FIG. 30B, thereby to form an electrode contact region 25A composed of n+-a-Si.

The doping of phosphorus is executed by utilizing a P-CVD apparatus similarly to the first embodiment, but any technique that is able to introduce impurities into the exposed portion of the active layer 25 selectively and activate it may be adopted as another means. Besides, the natural oxide film on the surface of the electrode contact region 25A is removed by buffer hydrofluoric acid and hydrogen plasma processing in case of an ion shower.

Next, the process until reaching a state shown in FIG. 31A and FIG. 31B will be described.

First, an ITO film having a thickness of 80 nm for instance and a Mo film having a thickness of 200 nm for instance are formed one after another by applying a sputtering method. Besides, the Mo film can be replaced with other metallic film such as a Cr film.

Further, from the process of forming the contact region 25A to the process of forming the Mo film may be performed consecutively without breaking the vacuum state as in the third embodiment.

Thereafter, by applying a photoresist process in lithography techniques, a photoresist film (not shown) of a pattern covering the regions of pixel electrode, source electrode, drain electrode and drain bus line are formed, and patterning is applied to the Mo film thereafter by applying a wet etching method using a phosphoric acid etching liquid as an etchant.

Furthermore, by applying a wet etching method using a mixed liquid ($HCl + HNO_3$) or a mixed liquid ($HCl + Fe-Cl_2$) as the etchant with the photoresist film formed in the above-mentioned process as a mask, patterning is applied to the ITO film formed in the above-mentioned process.

Then, the unnecessary portion of the electrode contact region 25A protruding from the mask is removed by applying an RIE using $BCl_3$ and $Cl_2$ as the etchant gas with the photoresist film formed in the above-mentioned process as the mask. With this, the active layer 25 revealed at the boundary region between above the gate electrode 22 and the gate bus line 23 is also removed completely, and the active layer 25 on the gate electrode 22 is formed into an island shape. Further, the short-circuit between the source region and the drain region is prevented, and moreover, the short-circuit between drain bus line 30 is avoided.

Through a series of processes described above, a source electrode 28 structured of a two-layer film composed of the ITO film and the Mo film, a drain electrode 29 also structured of the two-layer film, drain bus lines 30 also structured of the two-layer film and a pixel electrode 31 are formed.

Next, the process until reaching the state shown in FIG. 32A, FIG. 32B, FIG. 33A and FIG. 33B is reached will be described.

First, after the photoresist film formed in the above-mentioned process is removed, a final protective film 32 composed of SiN having a thickness of 300 nm for instance is formed on the whole surface by applying a P-CVD method.

Thereafter, by applying a photoresist process in lithography techniques and further applying a wet etching method using a hydrofluoric acid etching liquid as an etchant, patterning is applied to the final protective film 32.

With this, the final protective film 32 is formed into a predetermined configuration, and the Mo film on forming a part of the drain bus line 30 at the drain bus terminal portion (FIG. 14) are exposed, respectively, and at the gate bus terminal portion (FIG. 15), the channel protective film 26A on the gate bus line 23 is removed at the same time, and the active layer 25 is exposed.

Thereafter, the active layer 25 located at the gate bus terminal portion is removed by an RIE using $BCl_3$ and $Cl_2$ as etching gas.

Next, by using a CDE apparatus and applying a plasma etching method using gas containing $CF_4$ and $O_2$ as etching gas, the Mo film on the pixel electrode 31, the Mo film at the drain bus terminal portion and the gate insulator film 24 composed of SiN located thereunder are removed.

In the present embodiment, a self-alignment system by back exposure is utilized, and the whole surfaces are completed using three sheets of photomasks, the number of masks is reduced even by four or five sheets as compared with prior art.

Further, as described previously, when the drain bus line is formed of a transparent electrode film and patterning of the final protective film is omitted, the photolithography processes are in three times at the minimum. Whereas, only two sheets of photomasks are required in the present invention.

Seventh Embodiment

FIG. 34A to FIG. 34G show sectional views of a principal part of a TFT matrix in a process for explaining a seventh embodiment of the present invention, and FIG. 35A to FIG. 35F show plan views thereof. Besides, the sectional views in FIG. 34A to FIG. 34G are sectional views taken along a line Z—Z shown in FIG. 35A.

Figure 36A:
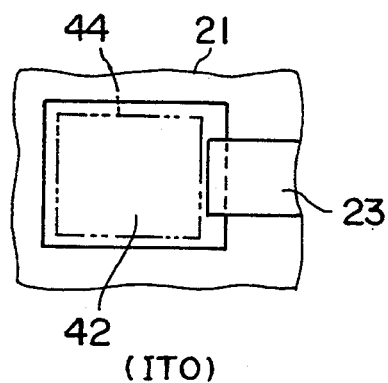
FIG. 36A and FIG. 36B are a plan view and a sectional view of a gate bus terminal portion of the TFT matrix in the seventh embodiment of the present invention.
Figure 36B:
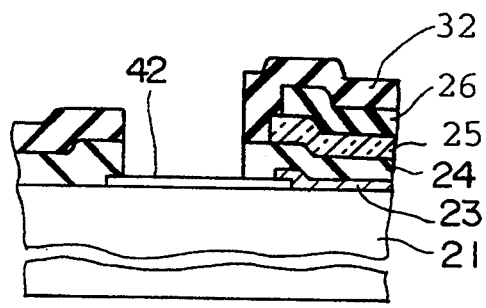
Figure 37A:
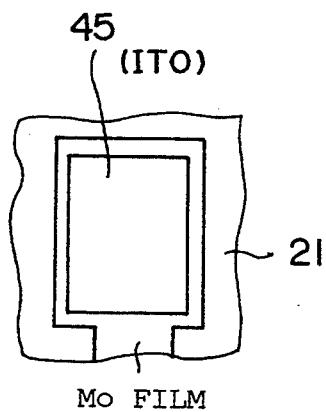
FIG. 37A and FIG. 37B are a plan view and a sectional view of a drain bus terminal portion thereof.
Figure 37B:
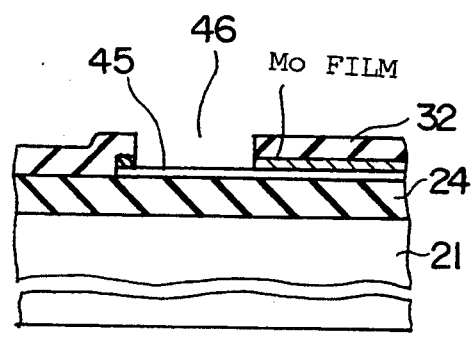

FIG. 36A and FIG. 36B are a plan view and a sectional view showing a gate bus terminal portion, and FIG. 37A and FIG. 37B are a plan view and a sectional view showing a drain bus terminal portion.

The reference numerals same as those used in FIG. 8A, FIG. 8B to FIG. 13A, FIG. 13B, FIG. 14 and FIG. 15 showing the first embodiment, show the same parts or have the same meaning. In the present embodiment, the first embodiment described with reference to these drawings is modified partially, and the contents added with a process of forming a capacitor are included.

Figure 34A:
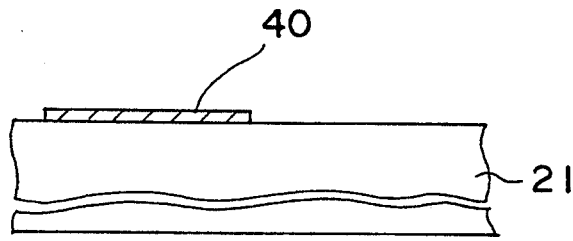
FIG. 34A to FIG. 34G are sectional views showing a principal part of a TFT matrix in a seventh embodiment of the present invention.
Figure 35B:
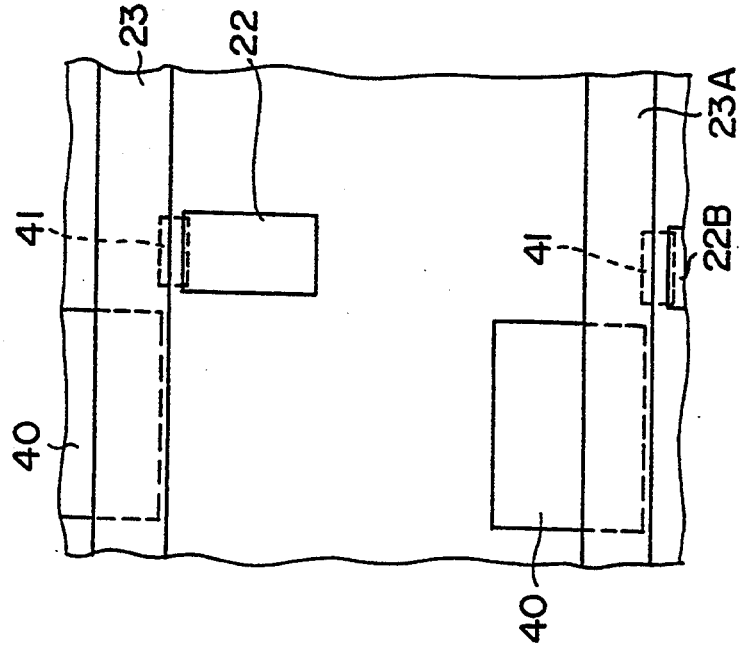
FIG. 35A to FIG. 35F are plan views showing a principal part of a TFT matrix in the seventh embodiment of the present invention.
Figure 35A:
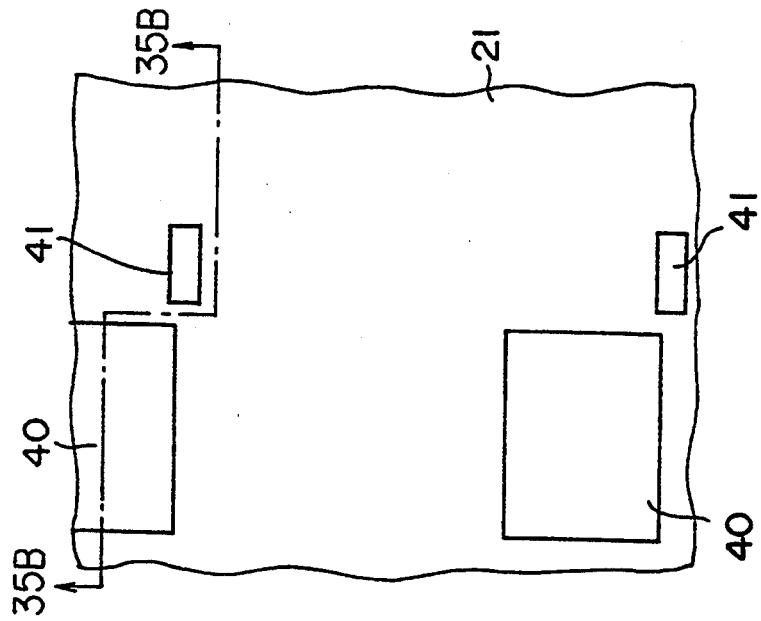

First, after an ITO film is formed in a thickness of 80 nm on the glass substrate 21 by a sputtering method, patterning is applied to the ITO film by lithography techniques so as to form a lower electrode for a capacitor in a region extending from a part of the pixel region over to a part of the gate bus line forming region, and a connecting electrode 41 is formed in a region for connecting the gate electrode and the gate bus line to each other as shown in FIG. 35A. The section thereof appears as shown in FIG. 34A.

Next, after the Ti film is formed, patterning is applied thereto by lithography techniques, thereby to form the gate electrode 22 and the gate bus line 23 as shown in FIG. 35B. Being different from the embodiments described already, the gate electrode 22 and the gate bus line 23 in this case are separated above the connecting electrode 41, but are conducted to each other by means of the connecting electrode 41. Further, the gate bus line 23 is in a state in contact with a part of the lower electrode 40 for the capacitor.

Figure 34B:
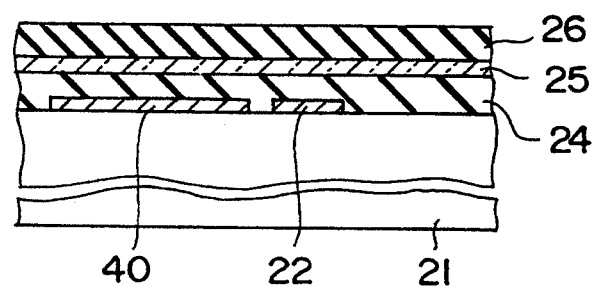

Furthermore, a gate insulator film 24 composed of a SiN film, an active layer 25 composed of a-Si and a channel protective film 26 composed of SiN are composed one after another as shown in FIG. 34B by a P-CVD method. The film thickness thereof are set in a similar manner as the first embodiment.

Figure 35D:
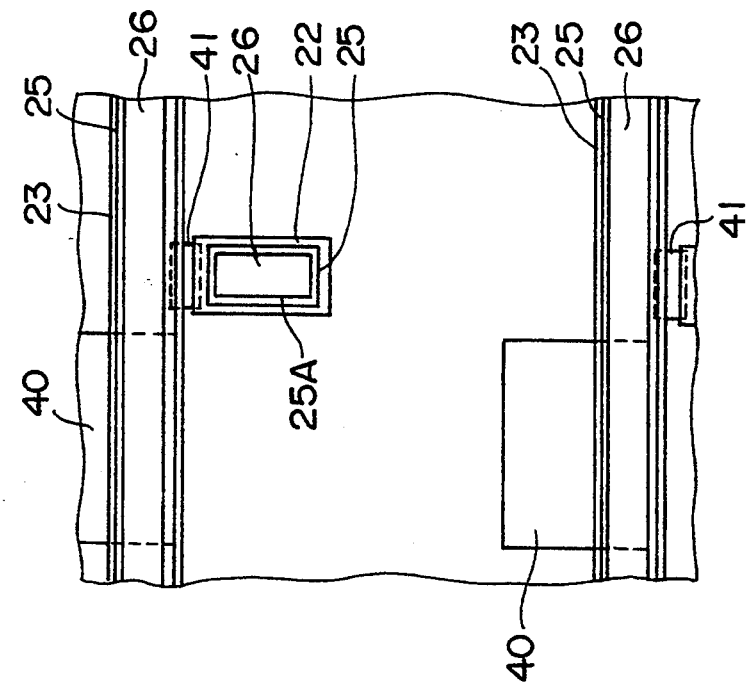
Figure 35C:
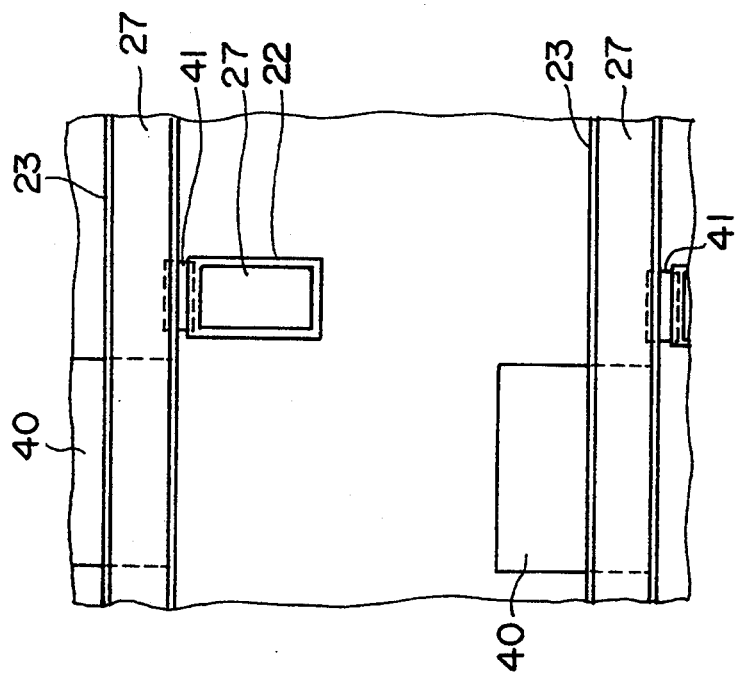

Next, when ultraviolet rays are radiated from the back of the glass substrate 21 in a similar manner as the fourth embodiment so as to expose a photoresist film 27 after the positive type photoresist film 27 is applied onto the channel protective film 26, and then it is developed, a plane as shown in FIG. 35C is obtained. At time of exposure, mutually separated gate electrode 22 and gate bus line 23 act as the mask.

In this case, since the connecting electrode 41 composed of an ITO film is in existence in the separated region of the gate electrode 22 and the gate bus line 23, a state is presented in which the photoresist film 27 remaining in the region is removed completely by exposure and development. Moreover, the contour of the photoresist film 27 remaining by development shows a pattern moving back inwardly by approximately 0.5 to 1.0 μm for instance with respect to the contour of the gate electrode 22 and the gate bus line 23.

Figure 34C:
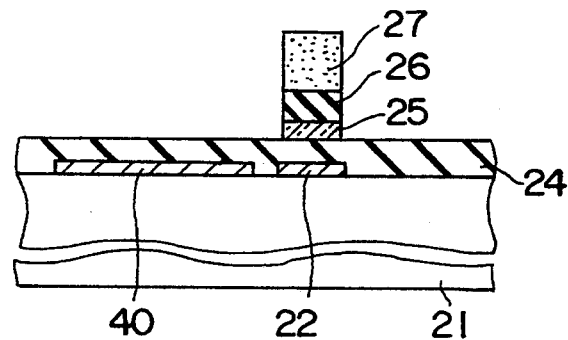

Next, when the channel protective film 26 and the active layer 25 are applied with anisotropic etching almost perpendicularly by an RIE using mixed gas of BCl3 and Cl2 or mixed gas of CF4 and O2, these films 25 and 26 are formed in the same pattern as the photoresist film 27 as shown in FIG. 34C, thus resulting in a configuration having a narrower width than the pattern of the gate electrode 22 and the gate bus line 23.

With this, the active layer 25 remaining on the gate electrode 22 and the gate bus line 23, respectively, are separated completely without through the exposure process using a photomask 33 as shown in FIG. 24A and FIG. 24B.

The number of masks used so far is the same as that in the first embodiment since a photomask is used when patterning is applied to the lower electrode for the capacitor.

Figure 34D:
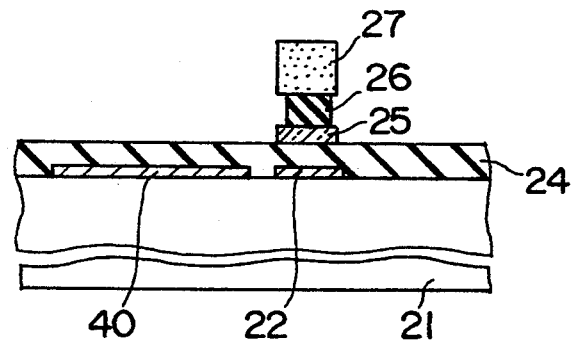

Thereafter, side etching is applied only to the channel protective film 26 by a wet etching method using a hydrofluoric acid etching liquid in a state that the above-mentioned photoresist film 27 is left, thereby to expose the upper surface of the periphery of the active layer 25 thereunder as shown in FIG. 34D. The quantity of side etching is approximately 1 to 2 μm.

A plan view of a state that the photoresist film 27 is removed by a solvent is shown in FIG. 35D.

Although the gate insulator film 24 composed of SiN in which the etchant is the same as the channel protective film 26 is revealed at time of the side etching, no problem occurs because the etching rate with respect to the hydrofluoric acid etching liquid can be varied largely by selecting approximately the conditions when the SiN film is formed by a P-CVD method. The exemplification has been already mentioned in the first embodiment.

Besides, the side etching of the channel protective film 26 is performed after patterning the channel protective film 26 and the active layer 25 in a mesa, but it may also be performed so that isotropic etching is applied to the channel protective film 26 from the beginning without applying patterning of the active layer 25, thus performing patterning and side etching consecutively, and anisotropic etching is applied to the active layer 25 in a perpendicular direction thereafter by an RIE with the photoresist film 27 as a mask.

Figure 34E:
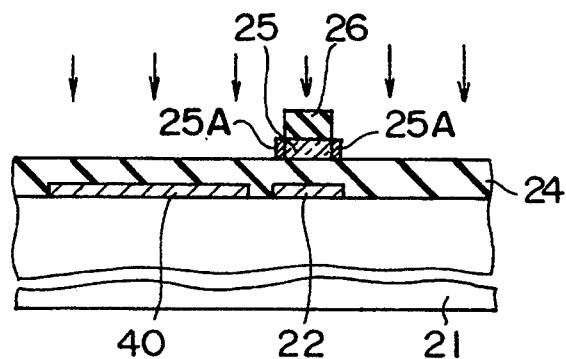
Figure 35E:
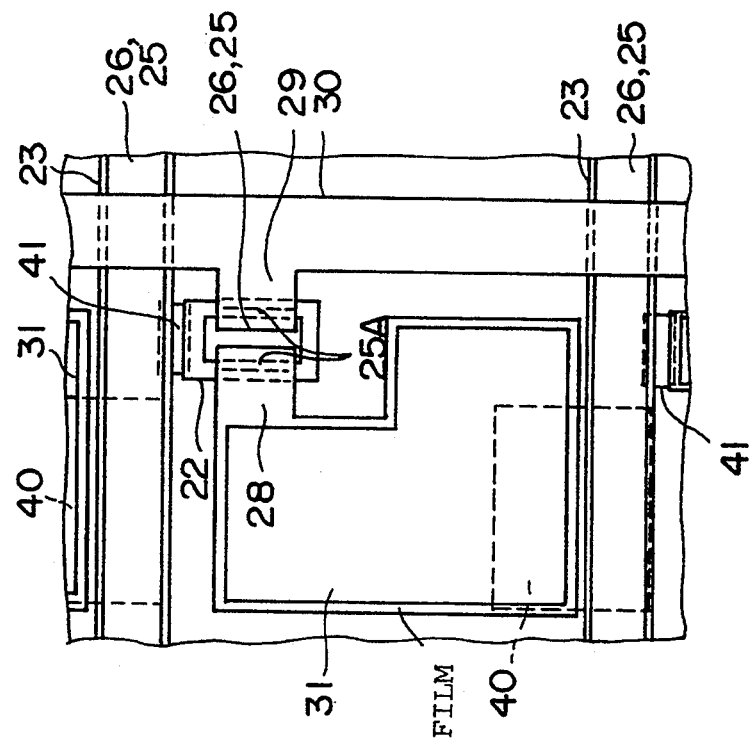
Figure 35F:
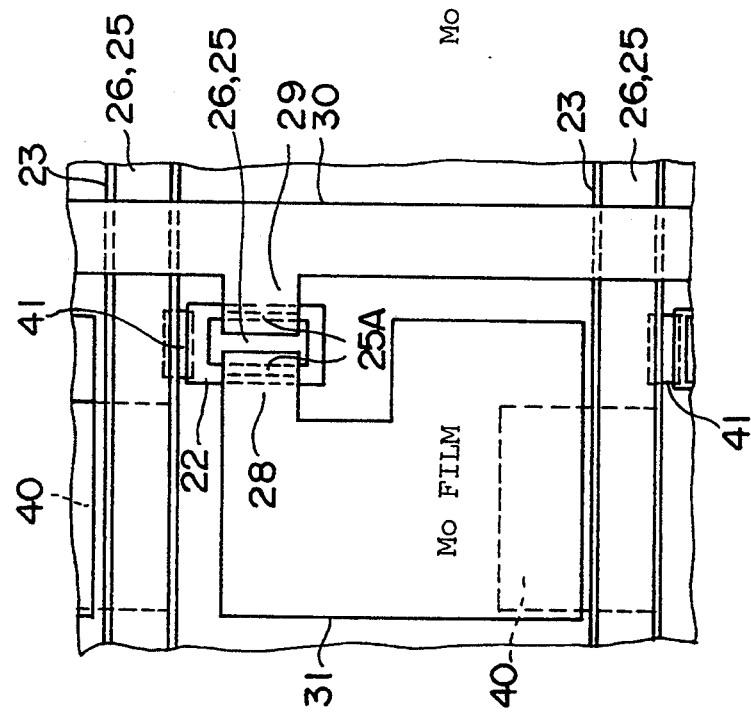

Next, phosphorus ions are implanted into the peripheral portion of the active layer 25 exposed from the channel protective film 26 by a method of doping impurities shown in the first embodiment, thereby to form an n+ contact region 25A such as shown in FIG. 34E and FIG. 35F at that portion. The details thereof are omitted here since description has been made in the first embodiment and the second embodiment. Besides, in the case of introduction of impurities by an ion shower, an oxide film produced on the surface of the contact region 25A may be removed by slight etching with a thin hydrofluoric acid etching liquid or by hydrogen plasma processing.

Also, in the case of the present embodiment, since the light going round portion originated in back exposure is 0.5 μm to 1.0 μm, which is smaller than ~3 μm when mask alignment is made as in the first embodiment, it is possible to design a gate electrode which is miniaturized by that portion, thus reducing problems in point of design or in point of display originated in the gate capacity.

By applying a sputtering method thereafter, an ITO film having a thickness of 80 nm for instance and a Mo film having a thickness of 200 nm are formed one after another. Besides, other metal films such as a Cr film may be used in place of the Mo film.

Moreover, from the process of forming the contact region 25A to the process of forming the Mo film may be performed successively without breaking the vacuum state as in the third embodiment.

Figure 34F:
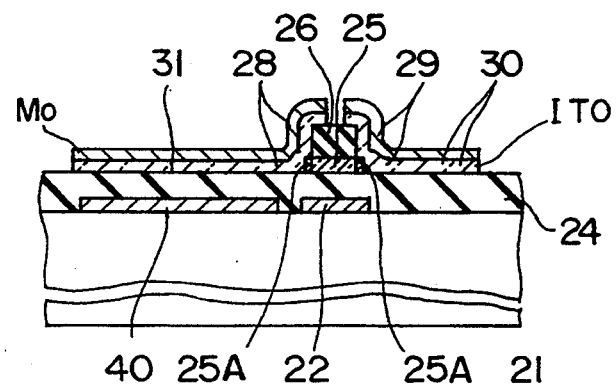

Thereafter, patterning is applied to the Mo film and the ITO film by lithography technique in a similar manner to the first embodiment so as to form a source electrode 28, a drain electrode 29 and a drain bus line 30 with the two-layer film and also to form a pixel electrode 31 with the ITO film as shown in FIG. 34F and FIG. 35E.

The source electrode 28 and the drain electrode 29 are separated on the channel protective film 26 above the gate electrode 22, and the drain bus line 30 is arranged in a direction meeting at right angles with the gate bus line 23.

Thereafter, by applying an RIE using mixed gas of $BCl_3$ and $Cl_2$ without peeling off the photoresist used when patterning is applied to the Mo film and the ITO film, the portions exposed from the source electrode 28, the drain electrode 29 or the like in the active layer 25 into which phosphorus ions have been introduced are removed completely. Thus, short-circuit between the source electrode 28 and the drain electrode 29 is prevented, and the drain bus line 30 are neither short-circuited. Thereafter, the photoresist used in lithography technique is removed.

Next, a final protective film 32 composed of SiN having a thickness of 300 nm for instance is formed on the whole surface by applying a P-CVD method.

Thereafter, a photoresist process is applied, and patterning is applied to the final protective film 32 through a wet etching using hydrofluoric acid etching liquid as the etchant. With this, the Mo film is exposed on the pixel electrode 31.

In the wake of the above, patterning is applied to the Mo film as it is without removing the photoresist film so as to expose the ITO film constituting the pixel electrode 31. Patterning is applied to the Mo film by a wet etching method by an aqueous solution containing phosphoric acid as a principal ingredient. The photoresist film is removed thereafter using a solvent.

Figure 34G:
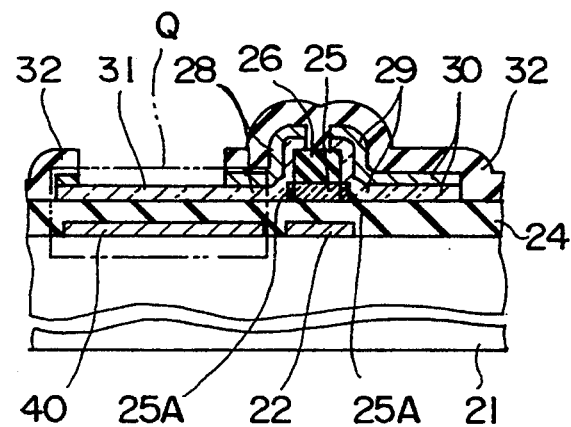

With this, a TFT matrix having such a construction as shown in FIG. 34G and FIG. 35F is completed. According to this construction, the pixel electrode 31 opposing to a lower electrode 40 of a capacitor Q functions also as an upper electrode of the capacitor Q and the gate insulator film 24 put therebetween becomes the dielectric film of the capacitor Q as shown in FIG. 34G. With this, the pixel electrode 31 and the gate bus line 23 are connected to each other through the capacitor Q.

Next, a process of forming terminal portions of the gate bus line and a drain bus line will be described with reference to FIG. 36A, FIG. 36B and FIG. 37A, FIG. 37B.

The terminal portion of the gate bus line 23 is formed in advance in the periphery of the glass substrate 21 with an ITO film as a gate bus terminal portion 42 as shown in FIG. 36A simultaneously with formation of the lower electrode 40 of a capacitor shown in FIG. 35A by the ITO film. Furthermore, when the gate bus line 23 is formed, the gate bus line 23 is extended to a position where it comes into contact with a part of the gate bus terminal portion 42 and is overlapped thereon.

Then, only the gate insulator film 24 and the final protective film 32 formed thereafter are left on the gate bus terminal portion 42, and other films than the above are removed by etching when patterning is applied.

Furthermore, the method of exposing the gate bus terminal portion 42 is such that, when the final protective film 32 on the pixel electrode 31 is removed by etching, the final protective film 32 and the gate insulator film 24 located on the gate bus terminal portion 42 are removed selectively using a mask composed of the same photoresist, thereby to form an opening portion 44 shown in FIG. 36B.

Besides, the final protective film 32 is removed by wet etching using a hydrofluoric acid etching liquid, but it has been mentioned already that the gate insulator film 24 is not etched with this. If the gate insulator film 24 on the gate bus terminal portion 42 is removed simultaneously with the removal of the Mo film on the pixel electrode 31, it is not required to add a special patterning process.

On the other hand, a drain bus terminal portion 45 is fabricated in simultaneously with formation of the pixel electrode 31 using an ITO film formed on the gate insulator film 24 when the pixel electrode 31 is formed as shown in FIG. 37A. Then, when the Mo film and the final protective film 32 on the pixel electrode 31 are removed, the Mo film and the final protective film 32 on the drain bus terminal portion 45 are removed selectively at the same time, thus forming an opening portion 46 such as shown in FIG. 37B.

Therefore, according to the present embodiment, special processes for forming the gate bus terminal portion 42 and the drain bus terminal portion 45 become unnecessary, thus curtailing the process by a large margin.

Eighth Embodiment

FIG. 38A to FIG. 38G are sectional views of a principal part of a TFT matrix in a process for explaining an eighth embodiment of the present invention, and FIG. 39A to FIG. 39D are plan views thereof.

The same reference numerals as those used in the above-mentioned drawings are to show the same parts or to have the same meaning.

The present embodiment differs greatly from the first embodiment in that a film having a two-layer construction of ITO and metal is used as a structural material of the gate electrode and the gate bus line shown in the first embodiment and the gate bus terminal portion is formed in a body with the gate bus line.

Figure 38A:
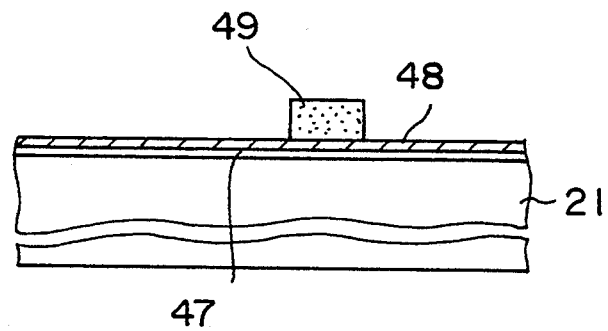
FIG. 38A to FIG. 38G are sectional views showing a process of forming a principal part of a TFT matrix in an eighth embodiment of the present invention.

First, as shown in FIG. 38A, an ITO film 47 and a Cr film 48 are deposited one after another in a thickness of 80 nm, respectively, on the glass substrate 21 by a sputtering method. Then, a photoresist film 49 is applied thereto and is revealed and developed, thereby to form a pattern covering the gate electrode region, the gate bus line region and the gate bus terminal portion.

Figure 38B:
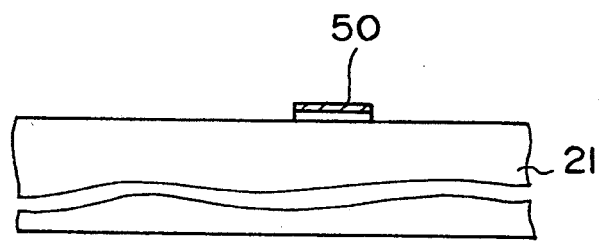
Figure 39A:
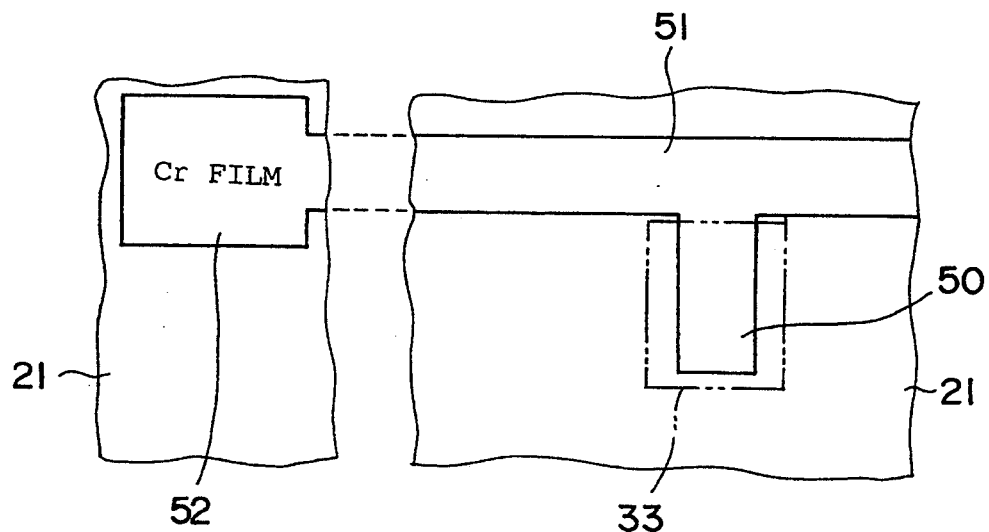
FIG. 39A to FIG. 39D are plan views showing a process of forming a principal part of a TFT matrix in the eighth embodiment of the present invention.

Then, the Cr film 48 which is not covered by the photoresist film 49 is etched with an aqueous solution containing cerium nitrate secondary ammon as a principal ingredient, and the ITO film 47 thereunder is removed by etching with an aqueous solution containing hydrochloric acid and ferric chloride as principal ingredients, thereby to apply patterning. With this, as shown in FIG. 38B and FIG. 39A, a gate electrode 50, a gate bus line 51 connected thereto and a gate bus terminal portion 52 are formed.

Then, after the photoresist film 49 is peeled off, the gate insulator film 24 composed of SiN, the active layer 25 composed of a-Si and the channel protective film 26 composed of SiN are formed one after another.

Besides, the forming conditions and film thickness of these films are omitted since they are illustrated in the first embodiment.

Next, similarly to what has been described in the fourth embodiment, after the positive type photoresist film 27 is applied to the whole surface of the channel protective film 26, ultraviolet rays are radiated from the back of the substrate 21 with the gate electrode 22 and the gate bus line 23 as a mask so as to expose the photoresist film 27.

With such exposure, going round of ultraviolet rays is generated along the contour of the gate electrode 50 and the gate bus line 51, and a pattern of the photoresist film 27 having a contour shifted inwardly by approximately 0.5 μm to 1.0 μm for instance with respect to the above-mentioned contour is obtained.

Then, a photomask 33 such as shown in FIG. 39A is placed above the photoresist film 27, and exposure is made with ultraviolet rays.

The exposure is made for the purpose of forming the photoresist film 27 in an island shape to limit it so as to exist above the gate electrode 50 only. Since the exposure is only to limit the edge of the boundary with the gate bus line 51 in the longitudinal direction (gate width direction) of the gate electrode 50, high precision is not required.

Figure 38C:
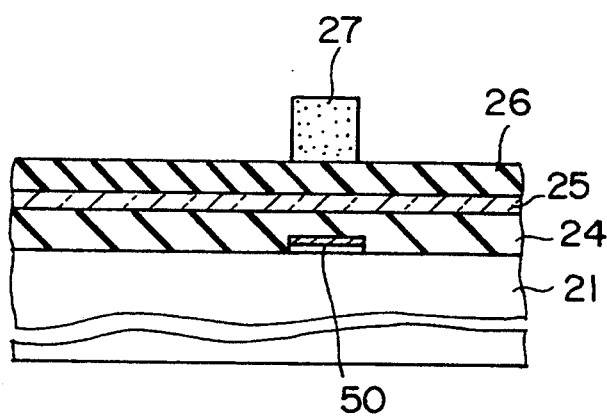

When the photoresist film 27 is developed, the section appears as shown in FIG. 38C, and the space between the edge portion of the gate electrode 50 and the edge portion of the photoresist film 27 becomes smaller as compared with the case of the first embodiment.

Then, by applying an RIE using mixed gas of $BCl_3$ and $Cl_2$ or mixed gas of $CF_4$ and $O_2$ as the etching gas, the channel protective film 26 and the active layer 25 are etched perpendicularly so as to form these films in a pattern of a configuration having a narrower width of the gate electrode 50.

Figure 38D:
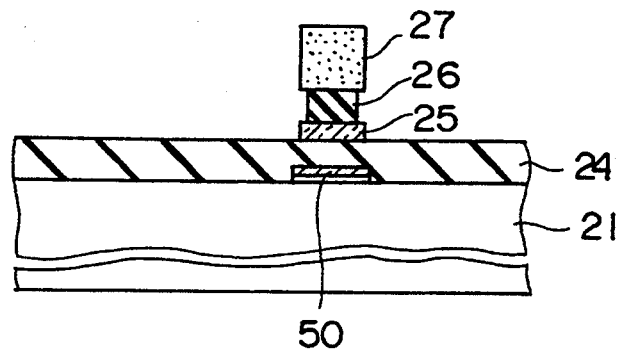

Next, as shown in FIG. 38D, side etching is applied to the channel protective film 26 only in the quantity of 1 μm to 2 μm by a hydrofluoric acid etching liquid in a state that the photoresist film 27 is left behind.

The gate insulator film 24 composed of SiN is revealed at time of this etching, but no problem occurs because it is possible to vary the etching rate largely with respect to the hydrofluoric acid etching liquid by selecting the conditions in forming the gate insulator film 24 appropriately. The exemplification has been already described in the first embodiment.

Figure 39B:
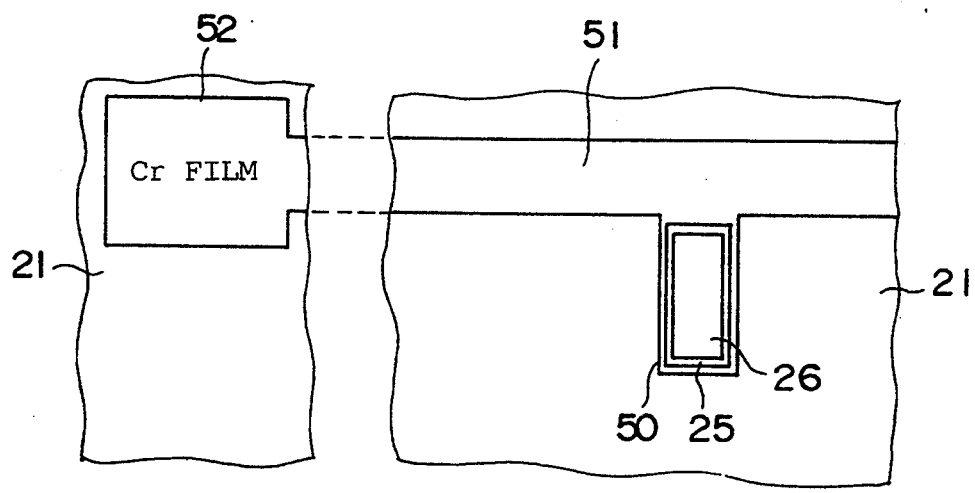
Figure 39C:
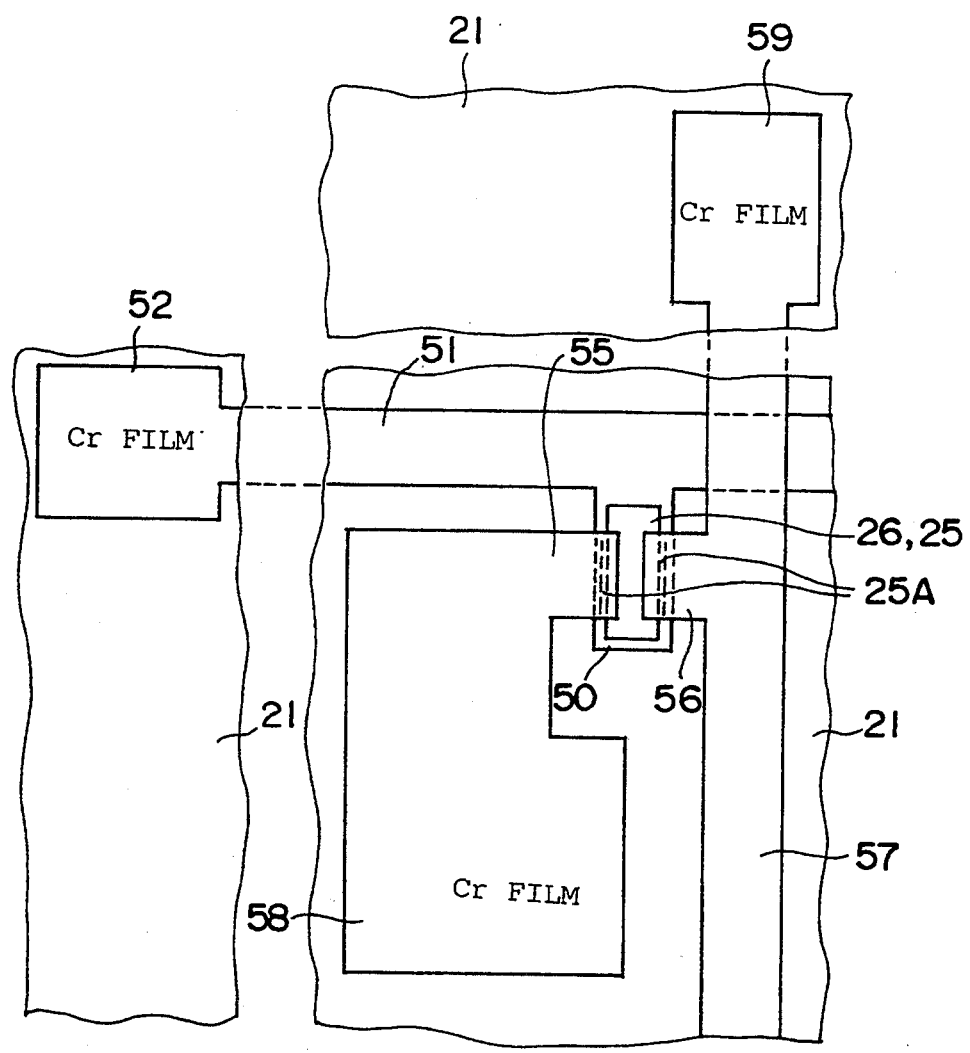

Next, the photoresist film 27 is removed by a solvent, a plane such as shown in FIG. 39B appears, and a state that the marginal portion of the active layer 25 is revealed from the periphery of the channel protective film 26 above the gate electrode 50 is presented.

Figure 38E:
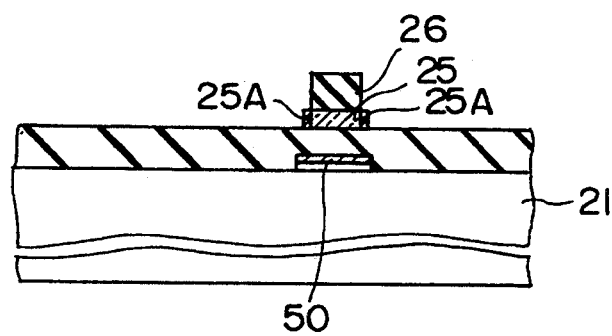

Next, phosphorus is doped in the edge portion of the active layer 25 using the channel protective film 26 as a mask, thereby to form an electrode contact region 25A composed of $n^+$-a-Si such as shown in FIG. 38E. The method of doping impurities is omitted here since it has been described in the first and the second embodiments.

Next, by the method described in the first embodiment, a natural oxide film on the surface of the contact region 25A is removed so that good ohmic contact with the electrode formed thereon may be obtained.

Thereafter, an ITO film having a thickness of 80 nm for instance and a Cr film 54 having a thickness of 200 nm for instance are formed one after another by applying a sputtering method.

Besides, as described in the third embodiment, the process from doping of impurities to formation of the Cr film may be performed successively without breaking the vacuum state.

Figure 38F:
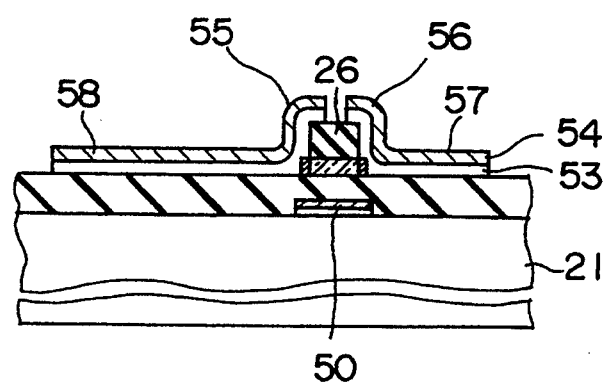

Next, the process until the state shown in FIG. 38F is presented will be described.

Then, by applying a photoresist process, a photoresist film (not shown) of a pattern covering a pixel electrode region, a source electrode forming region, a drain electrode forming region, a drain bus line region and a drain bus terminal region is formed, and applying thereafter a plasma etching method using gas containing $O_2$ and $Cl_2$ for instance as the etching gas, thereby to apply patterning to the Cr film 54.

Besides, in case there is a fear that damage by static electricity is generated, a wet etching method by an aqueous solution containing cerium nitrate secondary ammon as a principal ingredient may be applied.

Next, by applying a wet etching method using a mixed liquid of HCl and $HNO_3$ or a mixed liquid of HCl and $FeCl_2$ as the etchant with the same photoresist film as a mask, patterning is applied to the ITO film 53, and following thereafter, the unused portion of the electrode contact region 25A protruding from the pattern of the photoresist film is removed by etching by an RIE using mixed gas of $BCl_3$ and Cl as etching gas. With this, the short-circuit between the source region and the drain region is prevented.

Through the process described above, as shown in FIG. 39C, a source electrode 55, a drain electrode 56 and a drain bus line 57 structured of a two-layer film composed of the ITO film 53 and the Cr film 54 are formed, and further, a pixel electrode 58 and a drain bus terminal portion 59 composed of an ITO film are formed by removing the Cr film 54. When the bus terminal portion is formed by ITO in such a manner, the problem of imperfect contact due to oxidation disappears. Besides, the source electrode 55 and the drain electrode 56 are separated from each other on the channel protective film 26.

Next, by applying a P-CVD method after the photoresist film is removed, a final protective film 32 composed of SiN having a thickness of 300 nm for instance is formed on the whole surface.

Furthermore, patterning is applied to the final protective film 32 by a hydrofluoric acid etching liquid using a photoresist pattern not shown. With this, the Cr film 54 is revealed on the pixel electrode 58 and the drain bus terminal portion 59, and the gate insulator film 24 is revealed on the gate bus terminal portion 52.

Now, since the gate insulator film 24 on the gate bus terminal portion 52 is formed so that the etching rate is low for a hydrofluoric acid etching liquid, the gate insulator film 24 is not etched simultaneously with the final protective film 32.

Figure 38G:
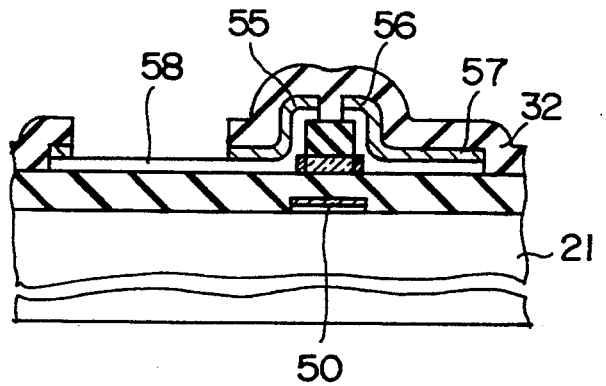
Figure 39D:
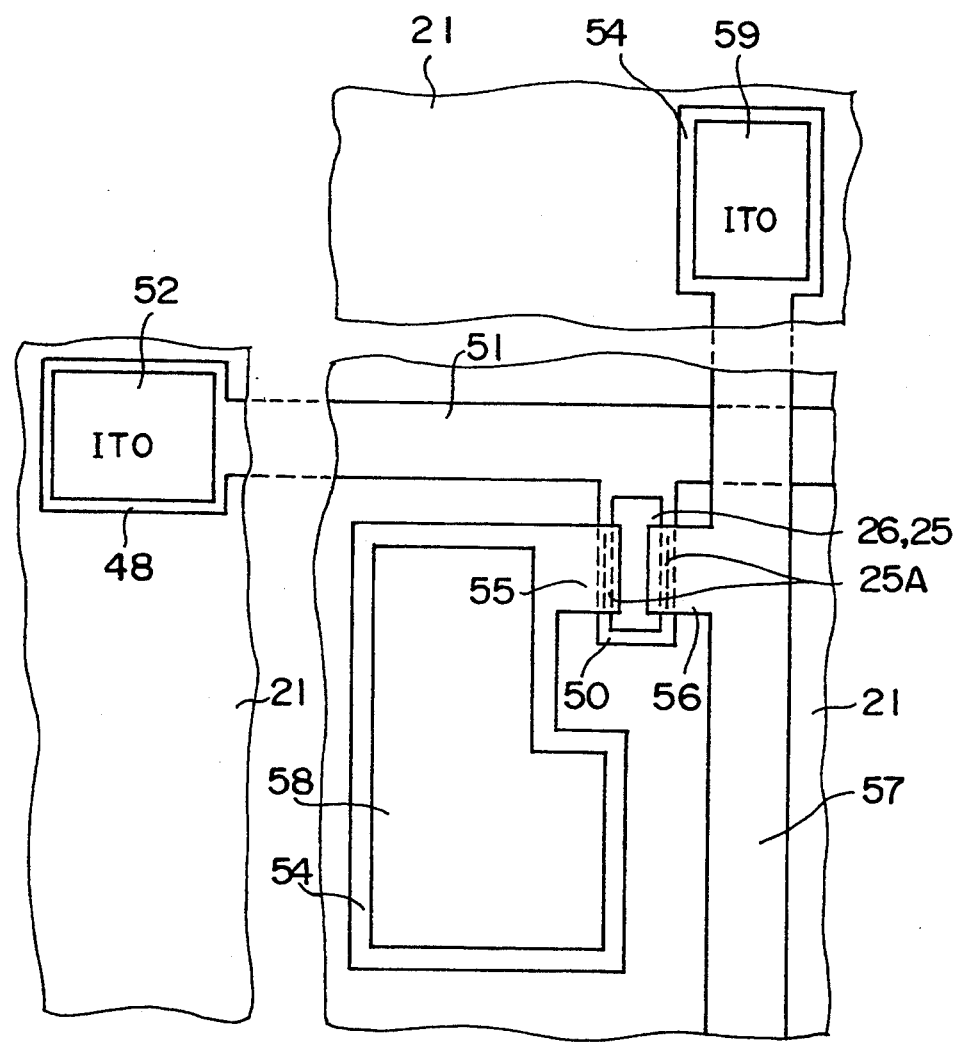

Therefore, the gate insulator film 24 composed of SiN on the gate bus terminal portion 52 is removed by a plasma etching method using mixed gas containing $CF_4$ and $O_2$. Furthermore, the reaction gas is changed to $CF_2$ and $O_2$ and the Cr films 48 and 54 on the pixel electrode 58, the gate bus terminal portion 52 and the drain bus terminal portion 59 are moved as shown in FIG. 38G and FIG. 39D.

As a result, the gate bus terminal portion 52, the pixel electrode 58 and the drain bus terminal portion 59 composed of a transparent ITO film are revealed.

Besides, it is apparent from the description of the process, but it will be understood that the process from the patterning of the final protective film 32 to the completion has been executed using the photoresist film formed in the photoresist process in the above-mentioned process as the mask.

With the above, 3 or 4 sheets of the photoresist masks for forming a TFT matrix are sufficient similarly to the first embodiment. Moreover, since the gate bus terminal portion 52 is also able to be formed of ITO, imperfect connection of terminals due to metallic oxide is eliminated. Further, since the gate bus line 51 is also formed of ITO/Cr, the possibility of producing hillocks or whiskers is precluded completely.

Besides, although a storage capacity is not added in the present embodiment, when the lower electrode of the capacitor is formed simultaneously with formation of the gate electrode as in the seventh embodiment, a TFT matrix added with a storage capacity is formed without increasing the process.

Ninth Embodiment

In the above-mentioned embodiment, the both sides of the active layer 25 are revealed by applying side etching to the channel protective film 26 on the active layer 25, and impurities are introduced into that region so as to form the electrode contact region 25A.

When the area of the electrode contact area is insufficient, the channel protective film and the electrode contact region may be formed in the following process.

FIG. 40A to FIG. 40H are sectional views showing a principal part of a TFT matrix showing a ninth embodiment of the present invention, and FIG. 41A to FIG. 41D are plan views showing a principal part of a TFT matrix showing the ninth embodiment of the present invention. In these figures, the reference numerals same as those in the first embodiment show the same elements, and the gate insulator film and the final protective film are omitted in the plan views.

Figure 40A:
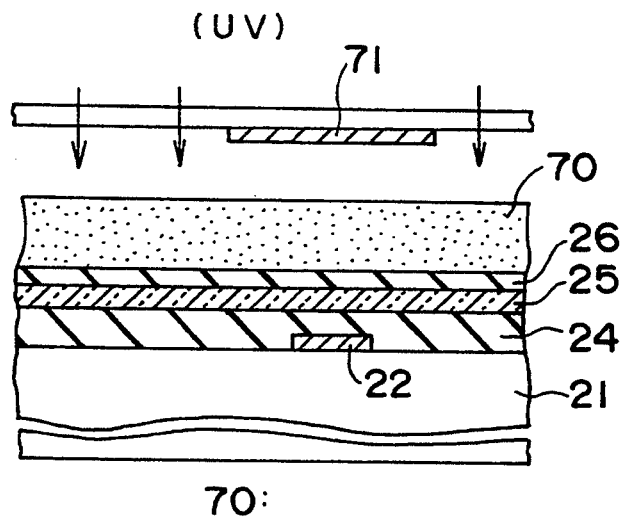
FIG. 40A to FIG. 40H are sectional views showing a process of forming a principal part of a TFT matrix in a ninth embodiment of the present invention.
Figure 40B:
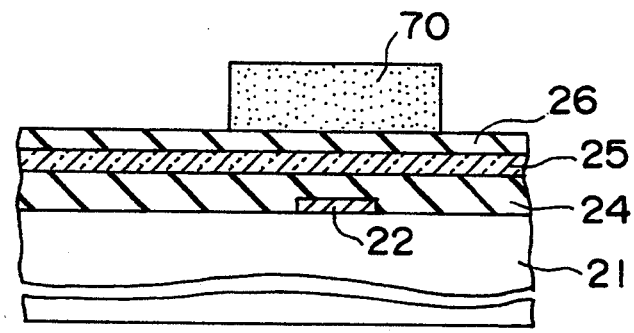
Figure 41B:
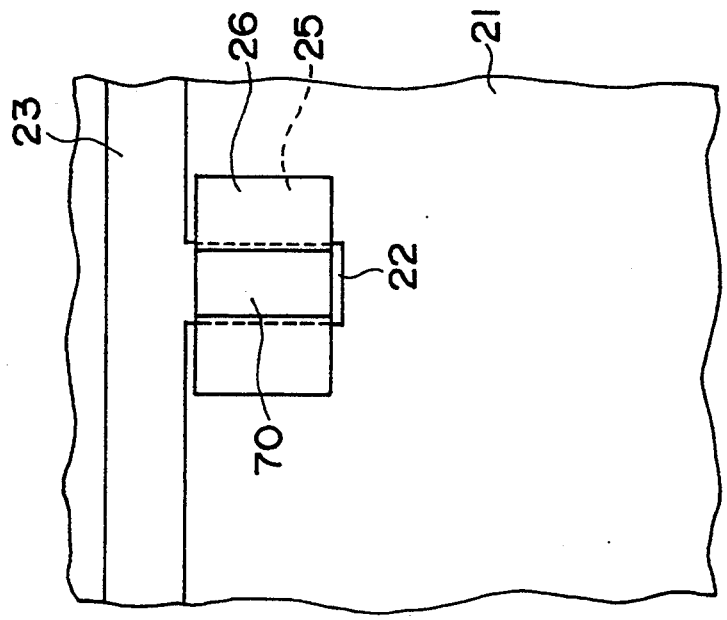
FIG. 41A to FIG. 41D are plan views showing a process of forming a principal part of a TFT matrix in the ninth embodiment of the present invention.
Figure 41A:
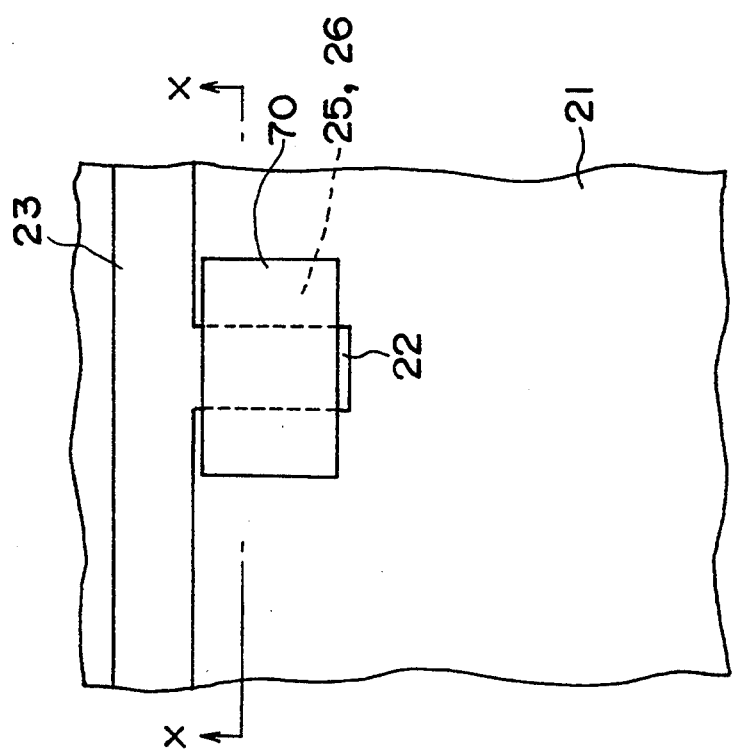
Figure 41C:
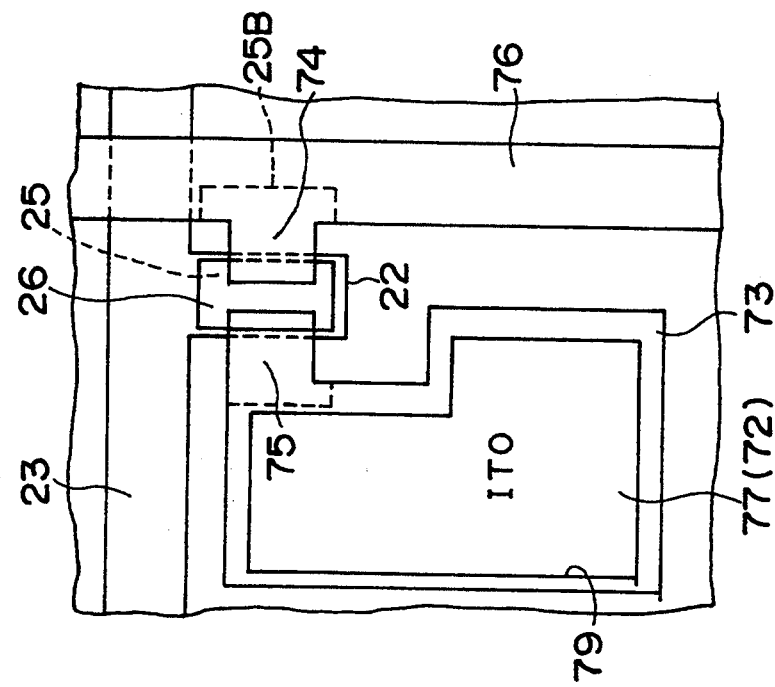

First, as shown in FIG. 40A, after the gate electrode 22 is formed on the substrate 21 composed of a transparent insulating material, the gate insulator film 24 composed of SiN having a film thickness of 400 nm, the active layer 25 composed of a-Si having a film thickness of 50 nm and the channel protective film 26 composed of SiN having a film thickness of 120 nm are formed one after another on the whole surface. The method of forming a film is the same as that in the first embodiment. After forming these films, positive type image reversal photoresist 70 is applied, and then the image reversal photoresist 70 is revealed using a photomask 71 and is developed, thereby to form a pattern having a configuration covering the gate electrode 22 and peripheral regions on both sides thereof. This pattern is formed in a scope including at least the gate electrode 22, the source region and the drain region as shown in FIG. 40B and FIG. 41A.

Figure 40C:
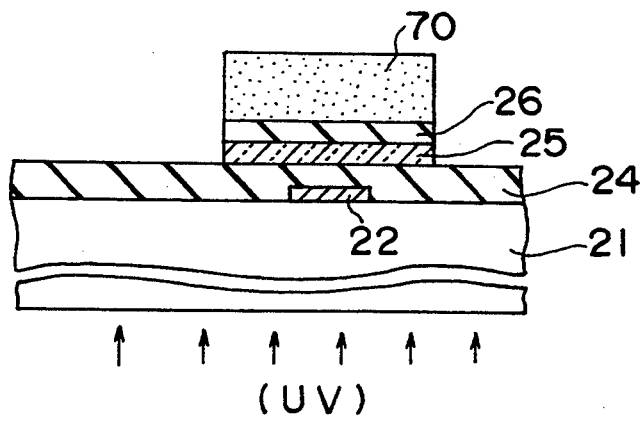
Figure 40D:
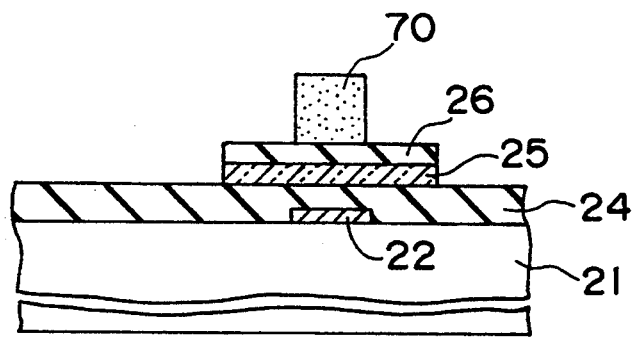

Then, the channel protective film 26 is etched with buffer hydrofluoric acid with the image reversal photoresist 70 as a mask, and then the active layer 25 is etched with mixed gas of CF$_4$ and O$_2$ using a CDE apparatus. With this, as shown in FIG. 40C, the patterns of the channel protective film 26 and the active layer 25 become the same as the image reversal photoresist 70.

Besides, the etching of the channel protective film 26 and the active layer 25 may be made successively by means of the CDE apparatus. If an RIE using plasma is adopted, however, the photoresist is exposed to light. Therefore, the RIE is inappropriate to the etching of the active layer 25.

Thereafter, ultraviolet rays are radiated from the underside of the substrate 21 so as to expose the image reversal photoresist 70 again. In this case, the gate electrode 22 serves as a mask in exposure, and the image reversal photoresist 70 shows a pattern having almost the same width as that of the gate electrode 22 after the image reversal photoresist 70 is developed.

Figure 40E:
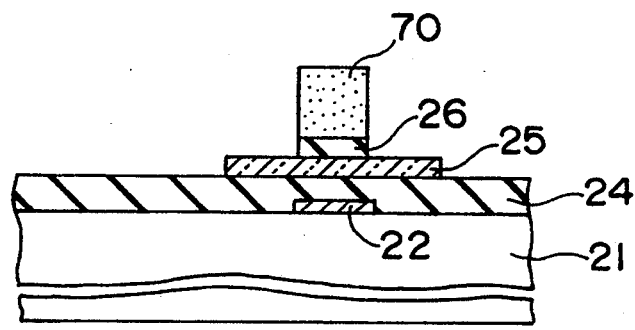

Then, as shown in FIG. 40E, the channel protective film 26 revealed from the image reversal photoresist 70 is etched with buffer hydrofluoric acid so as to expose the active layer 25 on both sides of the gate electrode 22.

In this case, since the material of the gate insulator film 24 is SiN, there is the possibility of being etched by buffer hydrofluoric acid. However, it becomes possible to make it difficult to etch the gate insulator film 24 depending on film forming conditions. The details thereof are omitted since they have been described in the first embodiment.

Next, after the image reversal photoresist 70 is removed, the substrate 21 is charged in the reaction chamber C3 of a parallel plate type P-CVD apparatus such as shown in FIG. 21, and is set at a substrate temperature of 300° C. or below, preferably 200 to 250° C. Then, phosphine at 5% or below is introduced into the reaction chamber C3 with inert gas such as argon, neon and helium as the base, and furthermore, the gas pressure is set at an optimum value between 0.1 and 2 Torr and the supply power of the high frequency power supply Rf is set to 1 KW or lower.

Figure 40F:
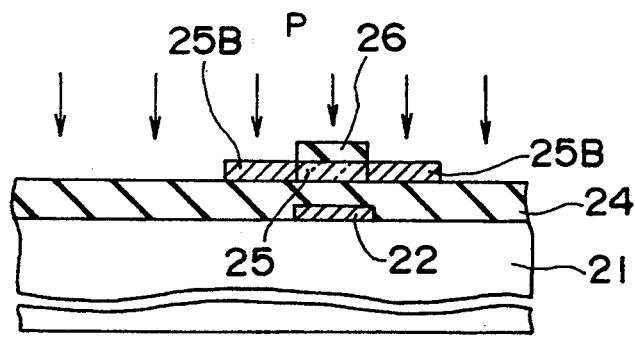

When plasma is generated under these conditions, phosphorus is plasma-doped on the both side portions of the active layer 25 revealed from the channel protective film 26 and an n$^+$type electrode contact region 25B are formed with the above on both side portions of the active layer 25 as shown in FIG. 40F. Introduction of impurities into the electrode contact region 25B is not limited to plasma doping, but may be by any of three methods shown in the first embodiment. Plasma doping has been described in detail in the second embodiment.

Next, the substrate 21 is moved into the reaction chamber C4 of the sputtering apparatus shown in FIG. 21, and an ITO film 72 and a Cr film 73 are formed in the thickness of 80 nm and 200 nm, respectively, by sputtering.

Figure 40G:
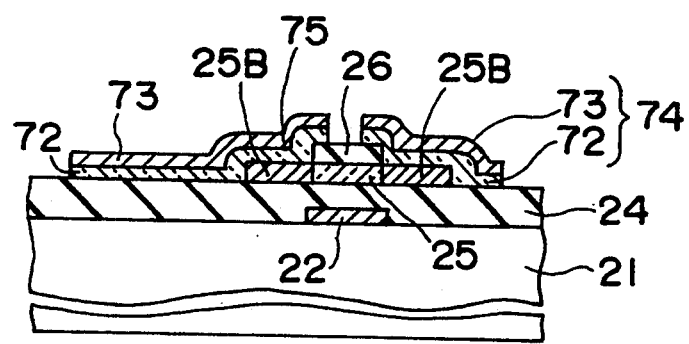

Then, as shown in FIG. 40G, patterning is applied to the ITO film 72 and the Cr film 73 by lithography technique as shown in FIG. 40G, and these films are made to remain in the gate electrode 22 to pixel region, the source region, the drain region and the drain bus line forming region. At the same time, the electrode contact region 25B protruding from the pattern of the ITO film 72 and the Cr film 73 is removed if any.

Among these ITO film 72 and Cr film 73, that which remains in the drain region becomes a drain electrode 74, that which remains in the source region becomes a source electrode 75, that which remains in the drain bus line region becomes a drain bus line 76, and the ITO film 72 in the pixel region becomes a pixel electrode 77.

Figure 40H:
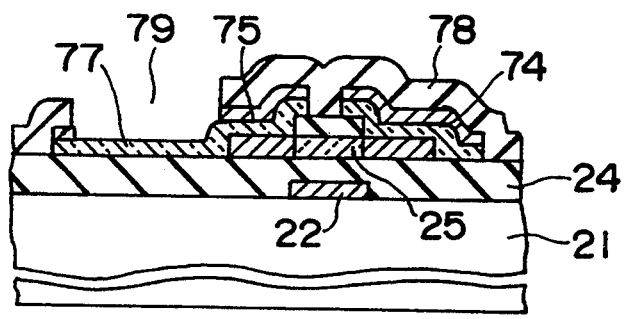
Figure 41D:
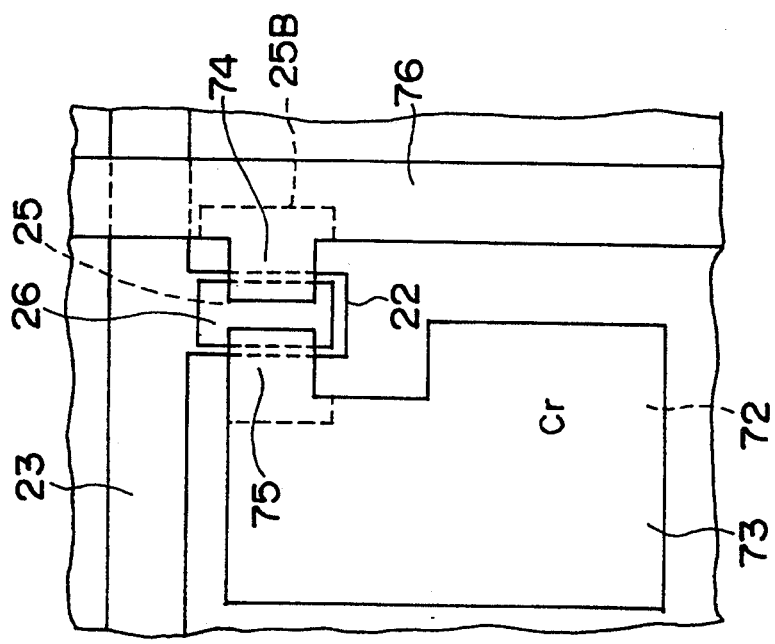

Then, a final protective film 78 composed of SiN 300 nm thick for instance is formed on the whole surface by a P-CVD method, and furthermore, patterning is applied to the final protective film 78 so as to form an opening portion 79 in the pixel region, and the Cr film 73 revealed from the opening portion 79 is removed thereafter, thereby to expose the pixel electrode 77 composed of ITO as shown in FIG. 40H and FIG. 41D.

Besides, a hydrofluoric acid etching liquid is used when the opening portion 79 is formed in the final protective film 78. Also, the Cr film is removed by a plasma etching method using Cl$_2$ and O$_2$.

Description has been made above attaching importance to the manufacturing process of a TFT, but the gate bus line terminal and the drain bus line terminal are formed following to the embodiments described previously.

According to such a process, patterning is applied to the active layer 25 by having it protrude largely to the both sides of the gate electrode 22 with the matter of the image reversal photoresist 70 as a mask, and further, the image reversal photoresist 70 is revealed and developed with the gate electrode as the mask thereafter, and patterning is applied to the channel protective film 26 with the developed image reversal photoresist 70 as the mask.

With this, such a state that the channel protective film 26 shows a pattern having almost the same width as the gate electrode 22, and the active layer 25 is protruded largely on the both sides thereof is presented.

Thus, since the positional alignment of the photomask can be made in one time when patterning is applied to the active layer 25 and the channel protective film 26, four sheets of photomasks are used similarly to the first embodiment.

Moreover, it is possible to make the contact resistance of the electrode contact region 25B of the present embodiment formed on both sides of the active layer 25 smaller than that of the electrode contact region 25A obtained by side etching of the channel protective film 26 as in the above-mentioned embodiment.

Besides, although the image reversal photoresist is used in the present embodiment for forming the channel protective film 26 into an island shape and patterning of the active layer 25, other positive type photoresist may also be used. Being excellent in acid resistance, the image reversal photoresist is optimum for patterning in several times.

Further, any of the embodiments described previously may be followed with respect to the manufacturing process except forming of the channel protective film 26 into an island shape and patterning of the active layer 25.

Tenth Embodiment

Although an etching stopper type using a channel protective film has been described in the above-mentioned embodiments, it is possible to reduce the number of masks even when a channel etching type TFT using no channel protective film is adopted, which therefore will be described as a tenth embodiment.

Figure 44:
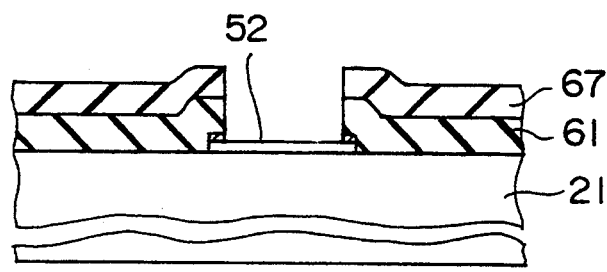
FIG. 44 is a sectional view showing a gate bus terminal portion of a TFT matrix showing the tenth embodiment of the present invention.
Figure 45:
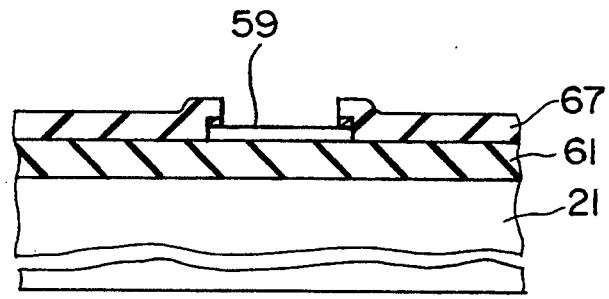
FIG. 45 is a sectional view showing a drain bus terminal portion thereof.

FIG. 42A to FIG. 42G are sectional views of a principal part of a TFT matrix in a process for explaining a tenth embodiment of the present invention, and FIG. 43A to FIG. 43D are plan views thereof. FIG. 44 and FIG. 45 are sectional views showing a gate bus terminal portion and a drain bus terminal portion.

Besides, in the present embodiment, reference numerals same as those shown already represent the same elements.

Figure 42A:
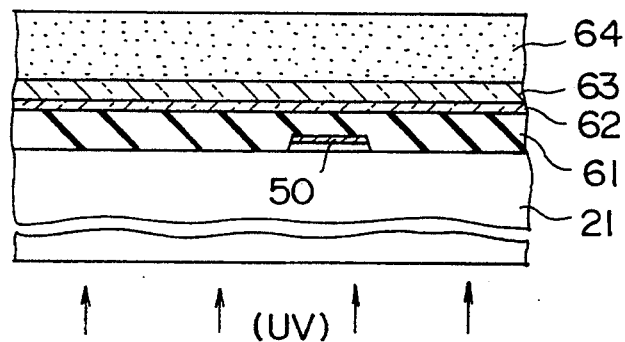
FIG. 42A to FIG. 42G are sectional views showing a process of forming a principal part of a TFT matrix in a tenth embodiment of the present invention.

First, an ITO film having a film thickness of 80 nm and a Cr film having a film thickness of 150 nm are deposited one after another on the glass substrate 21 by a sputtering method. Then, by applying patterning to these films by lithography technique, the gate electrode 50 and the gate bus line 51 composed of ITO/Cr as shown in FIG. 42A and the gate bus terminal portion 52 composed of an ITO film covered by a Cr film are formed. The details of the patterning method are omitted since they have been described already in the process of forming the gate electrode in the eighth embodiment.

After a photoresist film used in the lithography technique is peeled off, a first SiN film 61, a-Si film 62 and a-SiC film 63 are formed in thickness of 400 nm, 10 nm and 100 nm, respectively, one after another successively by a P-CVD method as shown in FIG. 42A. Explaining the types of the reaction gas used in the plasma CVD method, mixed gas of $SiH_4$, $NH_3$, $N_2$ and $H_2$ is used for growing the SiN film 61, mixed gas of $SiH_4$ and $H_2$ is used for growing the a-Si film 62 and mixed gas of $SiH_4$, $CH_4$ and $H_2$ is used for depositing the a-SiC film 63. When a parallel plate electrode type is used as a plasma CVD apparatus, a high frequency power supply of 13.56 MHz is connected to the electrode.

Besides, in order to make the electron mobility of the a-Si film 62 which becomes the active layer of the TFT high as before, at least 10 nm is required.

Thereafter, ultraviolet rays are radiated from the underside of the glass substrate 21 after applying positive type photoresist 64 onto the a-SiC film 63, and the photoresist 64 is exposed with the gate electrode 50, the gate bus line 51 or the like as a mask.

Figure 43A:
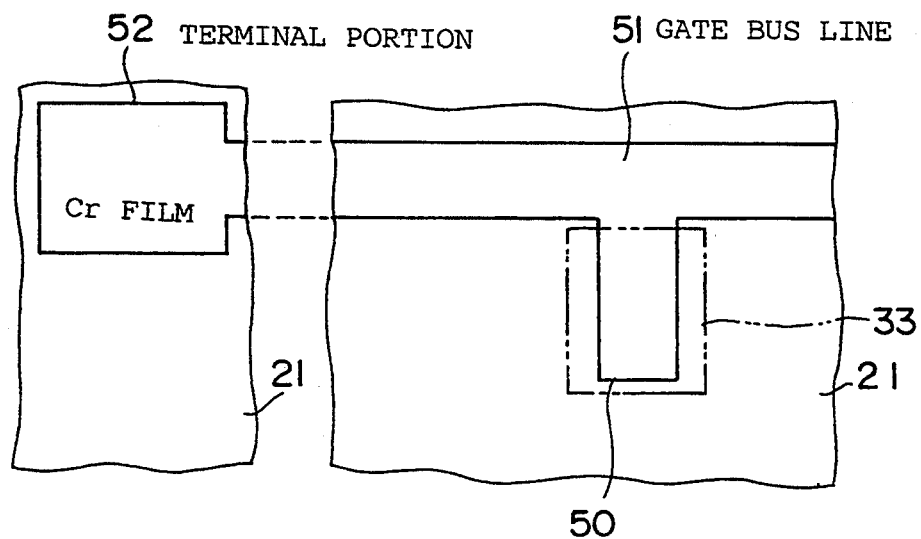
FIG. 43A to FIG. 43D are plan views showing a process of forming a principal part of a TFT matrix in the tenth embodiment of the present invention.

Thereafter, as shown in FIG. 43A, exposure is made by ultraviolet rays from the above of the glass substrate 21 using a mask covering the photoresist 64 on the gate electrode 50.

Figure 42B:
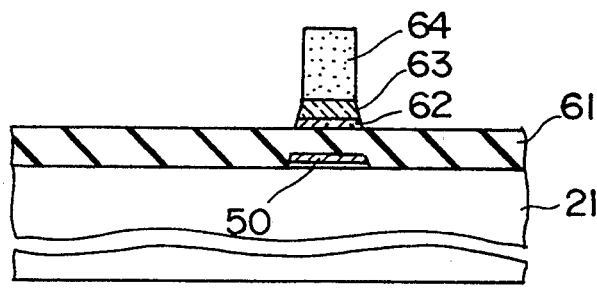
Figure 43B:
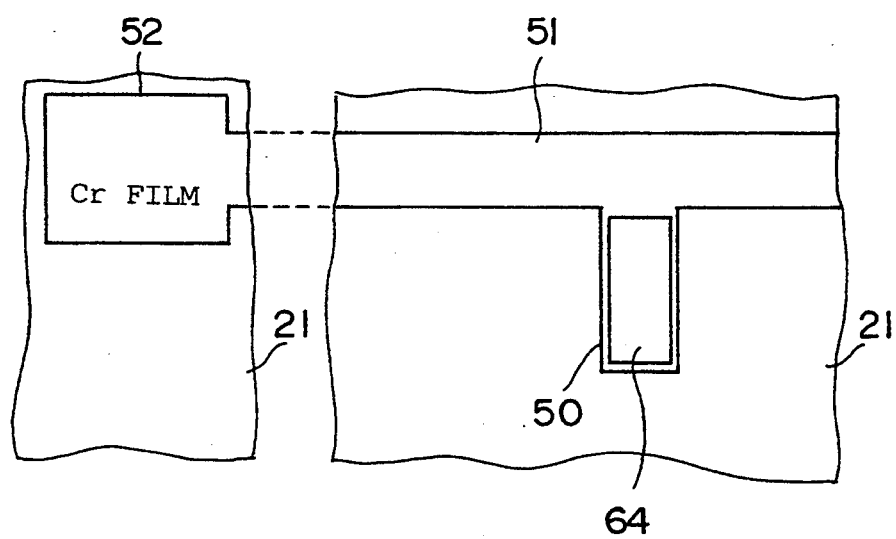

Then, when the photoresist 64 is developed, the photoresist pattern in an island shape is left behind only on the gate electrode 50 as shown in FIG. 42B and FIG. 43B. The edge of the photoresist pattern is located inside the edge of the gate electrode 50.

Thereafter, patterning is applied to the a-SiC film 63 and the a-Si film 62 by an RIE with the photoresist 64 as the mask. Mixed gas of $CF_4$ and $O_2$ is used as the etching gas, but chlorine etching gas may be used when the carbon content of the a-SiC film 63 is small. With this, the a-Si film 62 becomes the active layer of the TFT.

The photoresist mask 64 is removed after such patterning.

Figure 42C:
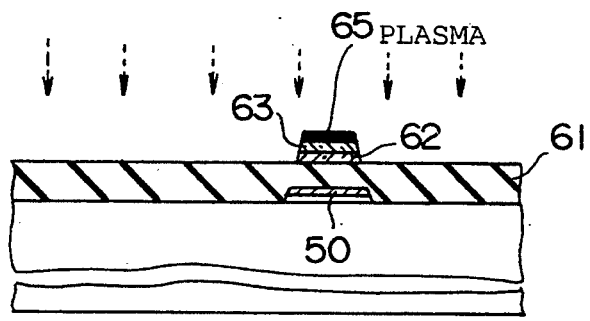

Next, the a-SiC film 63 is exposed in $PH_3$ gas plasma discharge and phosphorus is doped to a depth of approximately 30 nm from the surface of the a-SiC film 63, thereby to form a contact layer 65 composed of $n^+$-a-SiC used as shown in FIG. 42C.

The method of doping phosphorus is performed in such a manner that a parallel plate type plasma CVD apparatus as shown in FIG. 16 is used, $PH_3$ gas and Ar gas are introduced into the reaction chamber C thereof, the glass substrate 21 is placed on the ground electrode side, the gas pressure is set to 100 Pa, and discharge electric power of 500 W is applied to the electrodes P1 and P2 from the high frequency power supply having a frequency of 13.56 MHz so as to maintain discharge for 10 to 60 minutes. Besides, it is possible to control the phosphorus doping quantity and the depth of doping by varying the discharge conditions such as the gas pressure, the power supply and the period of time.

With this, the contact layer 65 is formed on the top surface of the a-SiC film 63.

Figure 42D:
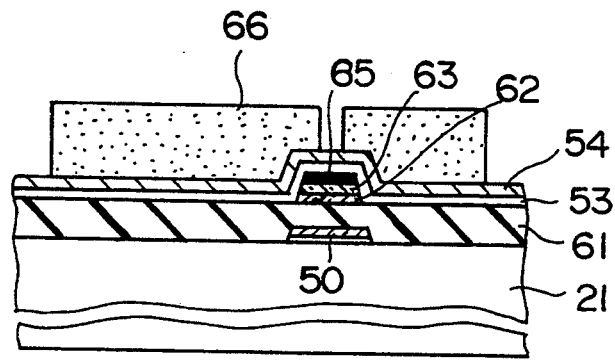

Thereafter, an ITO film 53 and a Cr film 54 are formed in thickness of 80 nm and 150 nm, respectively, by a sputtering method as shown in FIG. 42D.

Besides, as described in the third embodiment, the process from the doping of phosphorus to the formation of the Cr film may be executed successively without breaking the vacuum state.

Next, by applying photoresist 66 onto the Cr film 54 and exposing and developing it, a pattern covering a pixel electrode area, a source electrode forming region, a drain electrode forming region, a drain bus line region and a drain bus line terminal region is formed. Then, patterning is applied to the Cr film 54 and the ITO film 53 one after another with the photoresist 66 as a mask. Besides, the same material used in the patterning process of the gate electrode is used as the etching liquid of the Cr film 54 and the ITO film 53.

Thereafter, the phosphorus doped contact layer 65 in the a-SiC film 63 is removed by etching using the same photoresist film. With this, conduction between the source electrode 55 and the drain electrode 56 in the channel region is prevented. There are an RIE using mixed gas of $CF_4$ and $O_2$, an argon ion limiting method and so on as the etching method.

A first SiN film 61 is also etched in that etching. However, since the etching depth of the a-SiC film 63 is approximately 50 nm, the selection ratio with the SiN film 61 is approximately 1, which causes no trouble. The thickness of the SiN film 61 after etched becomes 350 nm.

Figure 42E:
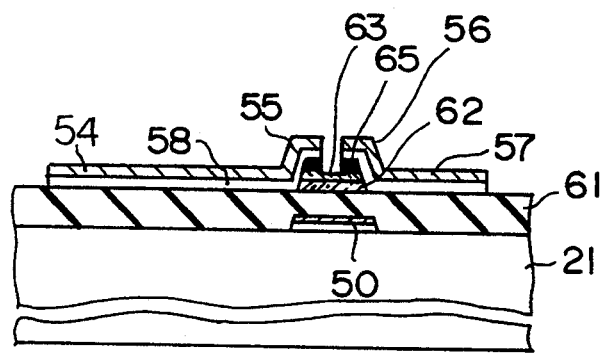
Figure 43C:
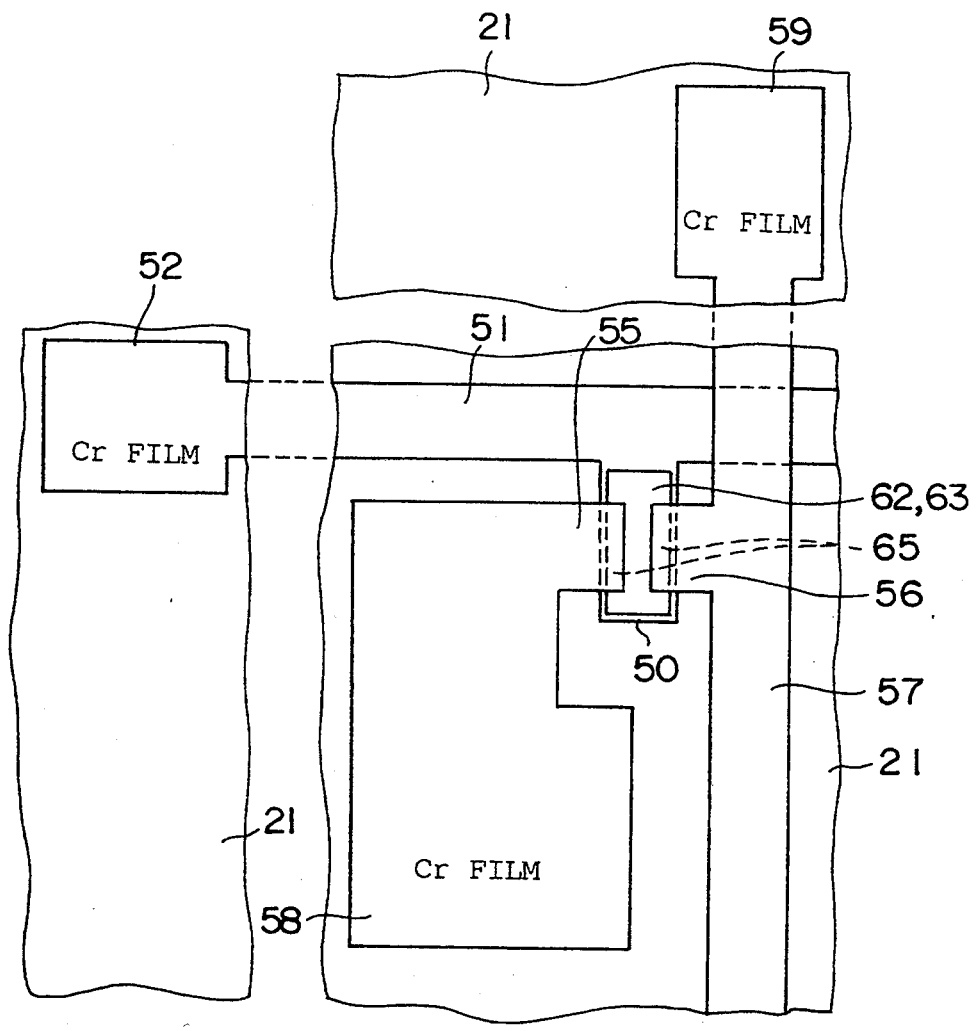
Figure 43D:
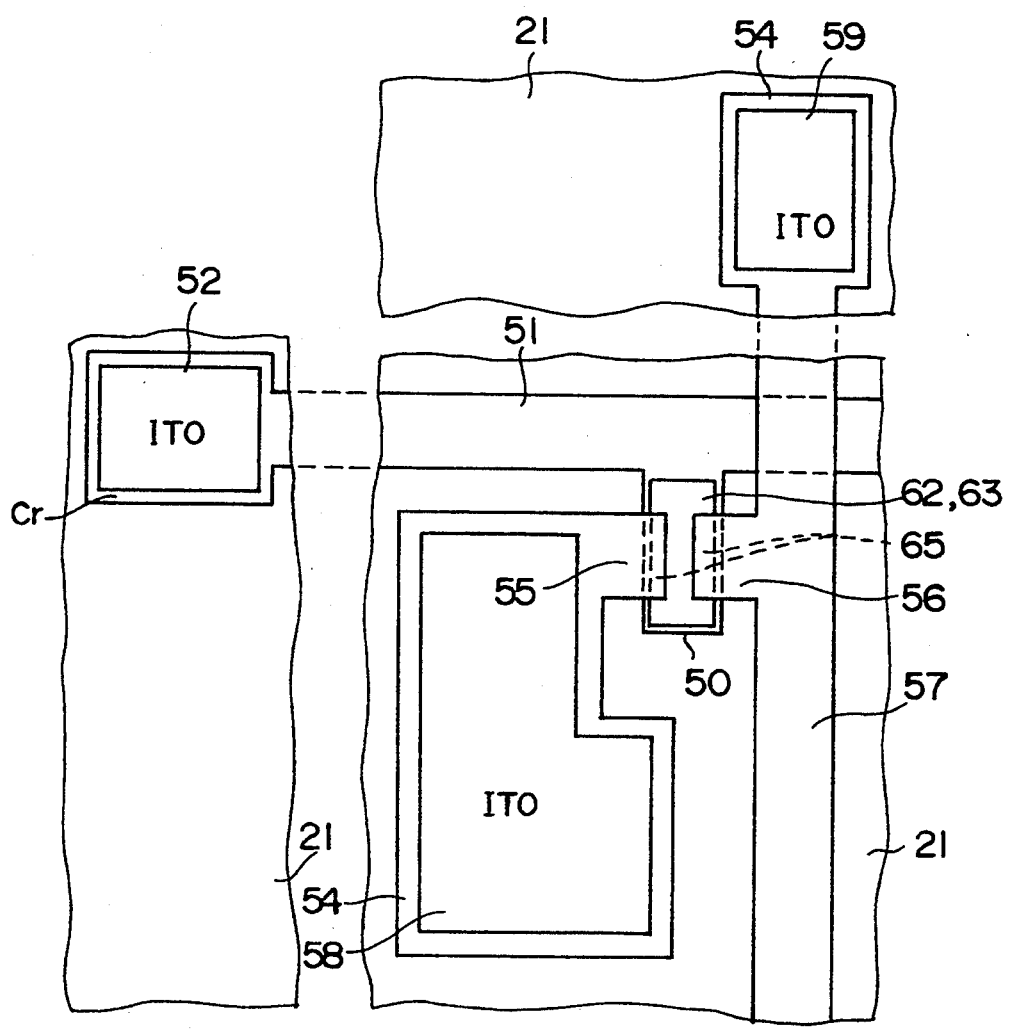

When the photoresist 66 is removed thereafter, a state shown in FIG. 42E and FIG. 43C is presented, and a source electrode 55, a drain electrode 56 and a drain bus line composed of ITO/Cr are formed, and further, a pixel electrode 58 and a drain bus terminal portion 59 composed of the ITO film 53 covered by the Cr film 54 are formed.

Figure 42F:
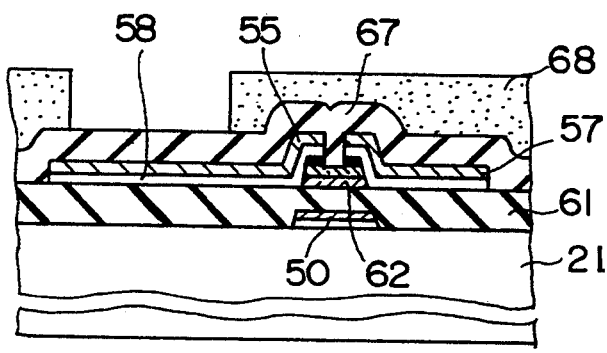
Figure 42G:
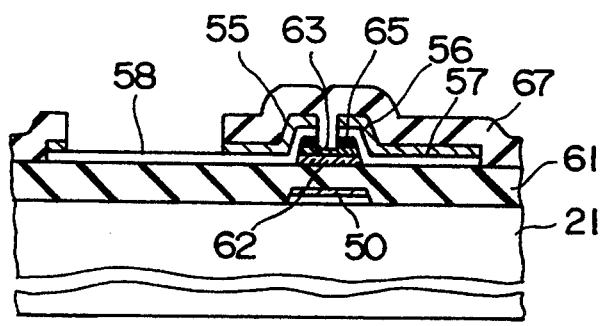

Next, by applying a P-CVD method, the final protective film 32 composed of SiN having a thickness of 300 nm for instance is formed on the whole surface as shown in FIG. 42F.

Furthermore, photoresist 68 is applied, exposed and developed, thereby to form windows on the pixel electrode 58, the drain bus terminal portion 59 and the gate bus terminal portion 52. With this, the exposed final protective film 67 and the first SiN film 61 are removed by a hydrofluoric acid etching liquid. Thus, the Cr film on the pixel electrode 54, the drain bus terminal portion 57 and the gate bus terminal portion 52 is revealed.

Then, when the Cr film revealed by the pattern of the photoresist 68 is removed by a cerium nitrate secondary ammon solution, the pixel electrode 58, the drain bus terminal portion 59 and the gate bus terminal portion 52 composed of transparent ITO are revealed as shown in FIG. 42G, FIG. 43D, FIG. 44 and FIG. 45.

Besides, the a-SiC film is used as the active layer and the contact layer in the above description, but an a-Si film containing nitrogen may also be used.

With the foregoing, three or four sheets of photoresist masks are sufficient for forming a channel etching type TFT matrix similarly to the first embodiment. Moreover, since the gate bus terminal portion 52 can also be formed of ITO, imperfect connection of the terminal due to oxidation is eliminated.

Further, although the channel protective film is not used in the present invention, a-SiC or a-Si containing nitrogen having a large band gap and a small photoelectric effect is used as a material for forming a contact layer for source and drain electrodes and the upper part of the transistor active layer. Therefore, an off-state current will never be increased appreciably even if the light enters into the active layer.

Moreover, a film made of a compound of carbon or nitrogen and silicon has higher transparency than phosphorus silicon and passes ultraviolet rays even when it is deposited as thick as approximately 300 nm. Accordingly, no problem is caused when a method of exposing photoresist by radiating light from the underside of the glass substrate 21, i.e., a self-alignment method of exposure is used.

Besides, no storage capacity is added in the present embodiment, but a TFT matrix added with storage capacity is formed when the lower electrode of the capacitor is formed simultaneously with forming of the gate electrode as in the seventh embodiment.

Further, as a method of forming a photoresist pattern on the gate electrode, the methods such as shown in the fourth embodiment to the sixth embodiment may be adopted.

Other Embodiments

In the above-mentioned embodiment, no alteration is made at all in point of a system in which interconnection for storage capacity is installed on the same plane as the gate bus line in the process of forming the gate electrode and capacity is formed of the wiring, the pixel electrode and the insulating film, but it is sufficient to alter the photomask pattern only. Further, the same is applied to the method in which the gate bus line and the pixel electrode are overlapped each other through the insulating film.

Further, a case of doping phosphorus in the active layer revealed from the channel protective film has been described in the above description, but in process of manufacturing p-channel type TFT arsenic or other n-type impurities may be used or low resistance may be obtained by using p-type impurities such as boron.

Furthermore, an ITO film is used as the pixel electrode in the above-mentioned embodiment, however, is not limited thereto, but indium oxide, zinc oxide, aluminum and other transparent conductive films may also be used.

What is claimed is:

1. A method of manufacturing thin film transistors in a liquid crystal display apparatus, comprising the steps of:
    forming a gate electrode on a transparent insulating substrate;
    growing a gate insulator film, a semiconductor active layer and an insulating channel protective film one after another on a region including said gate electrode and forming a pixel electrode transparent conductive film;
    forming a photoresist pattern on said channel protective film and inside a position corresponding to the contour of said gate electrode;
    patterning said channel protective film and said semiconductor active layer by etching said channel protective film and said semiconductor active layer using said photoresist pattern as a mask;
    forming a pattern in which the contour of said channel protective film is positioned inside of the contour of said semiconductor active layer by applying side etching selectively to said channel protective film located between said photoresist pattern and said semiconductor active layer;
    forming a contact region by introducing impurities into said semiconductor active layer exposed outside from the contour of said channel protective film; and
    forming a source electrode and a drain electrode connected to said contact region and separated thereon.

2. A method of manufacturing thin film transistors in a liquid crystal display apparatus according to claim 1, wherein said semiconductor active layer is a silicon layer, said channel protective film is a silicon nitride film and said pixel electrode transparent conductive film is one of an indium tin oxide film, a tin oxide film an indium oxide film or a zinc oxide film.

3. A method of manufacturing thin film transistors in a liquid crystal display apparatus according to claim 1, wherein the method for forming said contact region by introducing impurities into said semiconductor active layer is a process of introducing gas containing either one of a hydride of a III group element or a V group element or a fluoride of a III group element or a V group element and inactive gas into a reduced pressure atmosphere and exposing said semiconductor active layer in a space of plasma generated in said atmosphere.

4. A method of manufacturing thin film transistors in a liquid crystal display apparatus according to claim 3, wherein said hydride of V group element or said fluoride of V group element is a hydride or a fluoride of phosphorus, and the phosphorus concentration in said contact region is within a range of $1 \times 10^{20}$ to $5 \times 10^{21}/cm^3$.

5. A method of manufacturing thin film transistors in a liquid crystal display apparatus according to claim 3, wherein a source electrode and a drain electrode are formed on said contact region without wetting the surface of said contact region after forming said contact region by exposing said semiconductor active layer to the space of said plasma.

6. A method of manufacturing thin film transistors in a liquid crystal display apparatus according to claim 1, wherein said photoresist pattern is formed inside a position corresponding to the contour of said gate electrode by exposing, after forming unexposed positive type photoresist on said gate electrode and in the peripheral region thereof, said positive type photoresist using said gate electrode as a mask by exposing from the back of said transparent insulating substrate, and by developing said positive type photoresist thereafter.

7. A method of manufacturing thin film transistors in a liquid crystal display apparatus, comprising the steps of:
forming gate electrodes and gate bus lines conducting with said gate electrodes on a transparent insulating substrate
growing a gate insulator film, a semiconductor active layer and an insulating channel protective film one after another on a region including said gate electrodes and said gate bus lines;
forming a photoresist pattern on said channel protective film and inside a position corresponding to the contour of said gate electrode;
patterning said channel protective film and said semiconductor active layer remain on said gate electrodes by etching said channel protective film and said semiconductor active layer using said photoresist pattern as a mask;
forming a pattern in which the contour of said channel protective film is positioned inside of the contour of said semiconductor active layer by applying side etching selectively to said channel protective film located between said photoresist pattern and said semiconductor active layer;
forming a contact region by introducing impurities into said semiconductor active layer exposed outside from the contour of said channel protective film after said photoresist pattern is removed;
forming a multilayer structure film composed of a pixel electrode transparent conductive film and a metal film on a region including said channel protective film, said contact region, a drain bus region and a pixel region;
forming a source electrode and a drain electrode connected to said contact region and separated thereon and a drain bus line connected to said drain electrode by applying patterning to said multilayer structure film, and also remaining said multilayer structure film extending from said source electrode over to said pixel region;
removing a part of said contact region by means of etching using said source electrode, said drain electrode and said channel protective film as a mask; and
removing said metal film existing in said pixel region, thereby to use said exposed pixel electrode transparent conductive film as a pixel electrode.

8. A method of manufacturing thin film transistors in a liquid crystal display apparatus according to claim 7, comprising the steps before exposing said pixel electrode transparent conductive film in said pixel region of:
growing an insulating final protective film covering said metal film, said drain electrode, said drain bus line and said channel protective film;
forming an opening portion on said pixel forming region, drain bus terminal portion and gate bus terminal portion, respectively, by applying patterning to said final protective film;
removing said gate insulator film at a portion where said gate insulator film is revealed in said opening portion; and
removing said metal film at a portion where said metal film is revealed.

9. A method of manufacturing thin film transistors in a liquid crystal display apparatus according to claim 8, wherein:
said drain electrode and said drain bus line on said transparent insulating substrate are formed by applying patterning to a second multilayer structure film composed of a second pixel electrode transparent conductive film and a second metal film;
said drain bus terminal portion formed at the end portion of said drain bus line is formed of said second pixel electrode transparent conductive film; and
said second metal on said drain bus terminal portion is removed when said metal film in said pixel forming region is removed.

10. A method of manufacturing thin film transistors in a liquid crystal display apparatus according to claim 7, wherein the process after forming said contact region until depositing said multilayer structure film is performed consecutively in a reduced pressure atmosphere.

11. A method of manufacturing thin film transistors in a liquid crystal display apparatus according to claim 7, wherein said photoresist pattern is formed inside a position corresponding to the contour of said gate electrode by exposing, after forming unexposed positive type photoresist on said gate electrode and in the peripheral region thereof, said positive type photoresist using said gate electrode as a mask, and by developing said positive type photoresist thereafter by exposing from the back of said transparent insulating substrate.

12. A method of manufacturing thin film transistors in a liquid crystal display apparatus according to claim 11, wherein a fine throttle portion is formed in a longitudinal direction of the gate at the boundary portion between said gate electrode and said gate bus line, and said semiconductor active layer formed on said throttle portion is removed at the same time when said contact region protruding from said source electrode and said drain electrode is removed.

* * * * *